(12) United States Patent
Chen et al.

(10) Patent No.: US 12,185,620 B2
(45) Date of Patent: Dec. 31, 2024

(54) SURFACE TREATMENTS FOR PEROVSKITE FILMS TO IMPROVE EFFICIENCY/STABILITY OF RESULTING SOLAR CELLS

(71) Applicant: The University of North Carolina at Chapel Hill, Chapel Hill, NC (US)

(72) Inventors: Shangshang Chen, Chapel Hill, NC (US); Jinsong Huang, Chapel Hill, NC (US)

(73) Assignee: THE UNIVERSITY OF NORTH CAROLINA AT CHAPEL HILL, Chapel Hill, NC (US)

( * ) Notice: Subject to any disclaimer, the term of this patent is extended or adjusted under 35 U.S.C. 154(b) by 0 days.

(21) Appl. No.: 18/245,387

(22) PCT Filed: Sep. 16, 2021

(86) PCT No.: PCT/US2021/050716
§ 371 (c)(1),
(2) Date: Mar. 15, 2023

(87) PCT Pub. No.: WO2022/061015
PCT Pub. Date: Mar. 24, 2022

(65) Prior Publication Data
US 2024/0196718 A1  Jun. 13, 2024

Related U.S. Application Data

(60) Provisional application No. 63/079,311, filed on Sep. 16, 2020.

(51) Int. Cl.
*H10K 71/20*     (2023.01)
*B08B 7/00*      (2006.01)
(Continued)

(52) U.S. Cl.
CPC ........... *H10K 71/20* (2023.02); *B08B 7/0028* (2013.01); *C07F 7/24* (2013.01); *C07F 19/00* (2013.01);
(Continued)

(58) Field of Classification Search
CPC ........ H10K 71/20; H10K 30/40; H10K 30/50; H10K 85/50; H10K 30/57; B08B 7/0028;
(Continued)

(56) References Cited

U.S. PATENT DOCUMENTS 3,080,263 A * 3/1963 Conrose ................. B65B 69/00
                                                    134/4
5,690,749 A * 11/1997 Lee ....................... B08B 7/0028
                                                    134/42
(Continued)

FOREIGN PATENT DOCUMENTS

KR         10-2178913 B1     11/2020

OTHER PUBLICATIONS

Wang ("Stablizing heterostructions of soft perovskite semiconductors"), Science 365, 687-691 (2019) (Year: 2019).*
(Continued)

*Primary Examiner* — Angelo Trivisonno
(74) *Attorney, Agent, or Firm* — Alston & Bird LLP

(57) ABSTRACT

Described herein are surface treatment methods for removing one or more surface defect layers from polycrystalline films, polycrystalline films that are free of one or more defect surface layers, and use of the films in solar cells. In certain embodiments, the method is conducted by means of an adhesive tape or mechanical polishing. As described herein, solar cells containing the surface treated perovskite films show enhanced efficiency and stability.

3 Claims, 45 Drawing Sheets

(51) Int. Cl.

| | |
|---|---|
| *C07F 7/24* | (2006.01) |
| *C07F 19/00* | (2006.01) |
| *H10K 30/40* | (2023.01) |
| *H10K 30/50* | (2023.01) |
| *H10K 85/50* | (2023.01) |

(52) U.S. Cl.
CPC ............. *H10K 30/40* (2023.02); *H10K 30/50* (2023.02); *H10K 85/50* (2023.02)

(58) Field of Classification Search
CPC .... B08B 1/30; B08B 1/00; B08B 1/10; B08B 7/0014; C07F 7/24; C07F 19/00; Y02E 10/549; G03F 7/70741; G03F 7/70925; H01L 21/67132; H01L 21/304; H01L 21/67028; H01L 21/67011; H01L 21/02057; H01L 21/6836; H01L 21/02043; H01L 2221/68327; H01L 21/67092; H01L 29/66575; Y10T 428/2809; Y10T 428/28; Y10S 428/922; Y10S 438/906
See application file for complete search history.

(56) References Cited

U.S. PATENT DOCUMENTS

| | | | |
|---|---|---|---|
| 2016/0087233 | A1 | 3/2016 | Guha et al. |
| 2016/0254472 | A1 | 9/2016 | Wang et al. |
| 2017/0236651 | A1 | 8/2017 | Bakr et al. |

OTHER PUBLICATIONS

Aristidou et al., "Fast oxygen diffusion and iodide defects mediate oxygen-induced degradation of perovskite solar cells," Nature Communications, 8:15218, (2017).
Arora et al., "Perovskite solar cells with CuSCNhole extraction layers yield stabilizedefficiencies greater than 20%," Science, 358:768-771, (2017).
Bai et al., "Oligomeric Silica-Wrapped Perovskites Enable Synchronous Defect Passivation and Grain Stabilization for Efficient and Stable Perovskite Photovoltaics," ACS Energy Lett., 4:1231-1240, (2019).
Bai et al., "Planar perovskite solar cells with long-term stability using ionic liquid additives," Nature, 571:245-263, (2019).
Bi et al, "Multifunctional molecular modulators for perovskite solar cells with over 20% efficiency and high operational stability," Nat. Commun., 9:4482-4491, (2018).
Boyd et al., "Understanding Degradation Mechanisms and Improving Stability of Perovskite Photovoltaics," Chemical Reviews, 119:3418-3451, (2019).
Chen et al., "Identifying the Soft Nature of Defective Perovskite Surface Layer and Its Removal Using a Facile Mechanical Approach," Joule, 4:1-14, (Dec. 16, 2020).
Chen et al., "Imperfections and their passivation in halide perovskite solar cells," Chemical Society Reviews, 48:3842-3867, (2019).
Chen et al., "Synergistic Effect of Elevated Device Temperature and Excess Charge Carriers on the Rapid Light-Induced Degradation of Perovskite Solar Cells," Adv. Mater., 31:1902413, (2019).
Christians et al., "Tailored Interfaces of Unencapsulated Perovskite Solar Cells for >1000 Hour Operational Stability," Nat. Energy, 3:68-74, (2018).
Ciccioli et al., "Thermodynamics and the Intrinsic Stability of Lead Halide Perovskites $CH_3NH_3PbX_3$," J. Phys. Chem. Lett., 9:3756-3765, (2018).
Correa-Baena et al., "Promises and challenges of perovskite solar cells," Science, 358:739-744, (2017).
Deng et al., "Scalable fabrication of efficient organolead trihalide perovskite solar cells with doctor-bladed active layers," Energy Environ. Sci., 8:1544-1550, (2015).
Deng et al., "Tailoring solvent coordination for high-speed, room-temperature blading of perovskite photovoltaic films," Sci. Adv., 5:eaax7537, (2019).
Dong et al., "Electron-hole diffusion lengths > 175 μm in solution-grown $CH_3NH_3PbI_3$ single crystals," Science, 347:967-970, (2015).
Fan et al., "Layer-by-Layer Degradation of Methylammonium Lead Tri-iodide Perovskite Microplates," Joule, 1:548-562, (2017).
Green et al., "The emergence of perovskite solar cells," Nat Photonics, 8:506-514, (2014).
Huang et al., "Gas-assisted preparation of lead iodide perovskite films consisting of a monolayer of single crystalline grains for high efficiency planar solar cells," Nano Energy, 10:10-18, (2014).
Jeon et al., "Solvent engineering for high-performance inorganic-organic hybrid perovskite solar cells," Nat. Mater., 13:897-903, (2014).
Juarez-Perez et al., "Degradation Mechanism and Relative Stability of Methylammonium Halide Based Perovskites Analyzed on the Basis of Acid-Base Theory," ACS App. Mater. Interfaces, 11:12586-12593, (2019).
Juarez-Perez et al., "Thermal degradation of $CH_3NH_3PbI_3$ perovskite into $NH_3$ and $CH_3I$ gases observed by coupled thermogravimetry-mass spectrometry analysis," Energy Environ. Sci., 9:3406-3410, (2016).
Jung et al., "Efficient, stable and scalable perovskite solar cells using poly(3-hexylthiophene)," Nature, 567:511-515, (2019).
Kapil et al., "Strain Relaxation and Light Management in Tin-Lead Perovskite Solar Cells to Achieve High Efficiencies," ACS Energy Lett., 4:1991-1998, (2019).
Kong et al., "Enhancing Perovskite Solar Cell Performance through Femtosecond Laser Polishing," Solar, 4(2000189):1-7, (May 20, 2020).
Leijtens et al., "Stability of Metal Halide Perovskite Solar Cells," Advanced Energy Materials, 5:1500963, (2015).
Li et al., "A vacuum flash-assisted solution process for high-efficiency large-area perovskite solar cells," Science, 353:58-62, (2016).
Lin et al., "Monolithic all-perovskite tandem solar cells with 24.8% efficiency exploiting comproportionation to suppress Sn(ii) oxidation in precursor ink," Nat. Energy, 4:864-873, (2019).
Lin et al., "Revealing defective nanostructured surfaces and their impact on the intrinsic stability of hybrid perovskites," Energy & Environmental Science, 14:1563-1572, (Jan. 25, 2021).
Liu et al., "Lithium Doping to Enhance Thermoelectric Performance of MgAgSb with Weak Electron-Phonon Coupling," Adv. Energy Mater., 6:1502269, (2016).
Mamun et al., "Influence of air degradation on morphology, crystal size and mechanical hardness of perovskite film," Mater. Lett., 229:167-170, (2018).
Qiu et al., "Progress of Surface Science Studies on $ABX_3$-Based Metal Halide Perovskite Solar Cells," Advanced Energy Materials, 10(1902726): 1-39, (Oct. 17, 2019).
Roose et al., "Critical Assessment of the Use of Excess Lead Iodide in Lead Halide Perovskite Solar Cells," J. Phys. Chem. Lett., 11:6505-6512, (2020).
Rothmann et al., "Structural and Chemical Changes to $CH_3NH_3PbI_3$ Induced by Electron and Gallium Ion Beams," Adv. Mater., 30:1800629, (2018).
Stavrakas et al., "Influence of Grain Size on Phase Transitions in Halide Perovskite Films," Adv. Energy Mater., 9:1901883, (2019).
Tan et al., "Efficient and stable solution-processed planar perovskite solar cells via contact passivation," Science, 355:722-726, (2017).
Turren-Cruz et al., "Methylammonium-free, high-performance, and stable perovskite solar cells on a planar architecture," Science, 362:449-453, (2018).
Wang et al., "Accelerated degradation of methylammonium lead iodide perovskites induced by exposure to iodine vapour," Nat. Energy, 2:16195, (2017).
Wang et al., "A$Eu^{3+}$—$Eu^{2+}$ion redox shuttle impartsoperational durability to Pb-Iperovskite solar cells," Science, 363:265-270, (2019).
Wang et al., "Scaling behavior of moisture-induced grain degradation in polycrystalline hybrid perovskite thin films," Energy & Environmental Science, 10:516-522, (2017).

(56) References Cited

OTHER PUBLICATIONS

Wang et al., "Stabilizing heterostructuresof soft perovskite semiconductors," Science, 365:687-691, (2019).

Wang et al., "Thin Insulating Tunneling Contacts for Efficient and Water-Resistant Perovskite Solar Cells," Adv. Mater., 28:6734-6739, (2016).

Xiao et al., "Efficient, high yield perovskite photovoltaic devices grown by interdiffusion of solution-processed precursor stacking layers," Energy Environ. Sci. 7:2619-2623, (2014).

Xing et al., "Ultrafast ion migration in hybrid perovskite polycrystalline thin films under light and suppression in single crystals," Phys. Chem. Chem. Phys., 18:30484-30490, (2016).

Yakunin et al., "Detection of gamma photons using solution-grown single crystals of hybrid lead halide perovskites," Nat. Photonics, 10:585-589, (2016).

Yang et al., "Enhancing electron diffusion length in narrowbandgap perovskites for efficient monolithic perovskite tandem solar cells," Nat. Commun., 10:4498-4506, (2019).

Yang et al., "Stabilizing halide perovskite surfaces for solar cell operation with wide-bandgap lead oxysalts," Science, 365:473-478, (2019).

Yu et al., "Probing the Soft and Nanoductile Mechanical Nature of Single and Polycrystalline Organic-Inorganic Hybrid Perovskites for Flexible Functional Devices," ACS Nano, 10:11044-11057, (2016).

Yuan et al., "Ion Migration in Organometal Trihalide Perovskite and Its Impact on Photovoltaic Efficiency and Stability," Acc. Chem. Res., 49:286-293, (2016).

Yuan et al., "Photovoltaic Switching Mechanism in Lateral Structure Hybrid Perovskite Solar Cells," Adv. Energy Mater. 5:1500615, (2015).

Zhao et al., "A polymer scaffold for self-healing perovskite solar cells," Nat. Commun., 7:10228-10236, (2016).

WIPO Application No. PCT/US2021/050716, PCT International Search Report and Written Opinion of the International Searching Authority mailed Dec. 31, 2021.

* cited by examiner

Fig. 1A
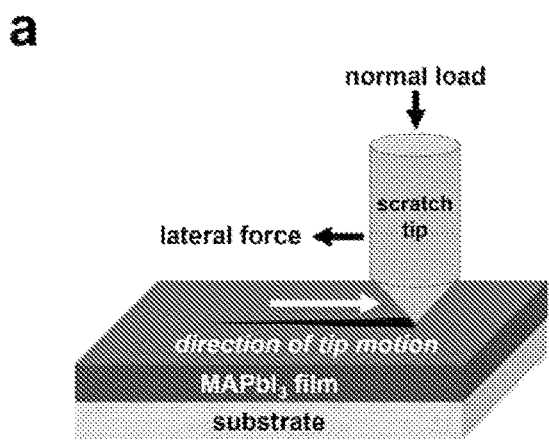
Fig. 1B
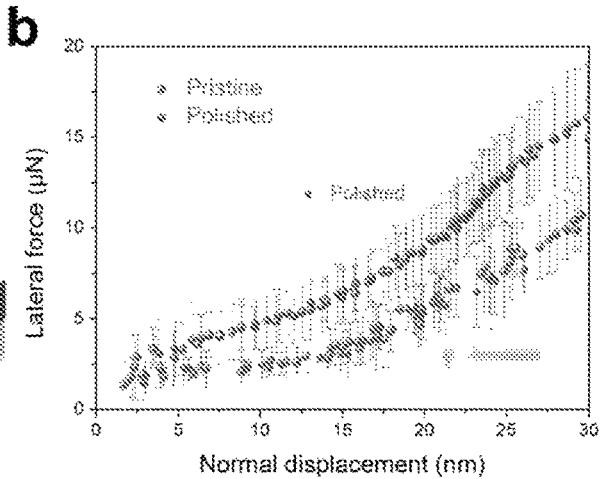
Fig. 1C
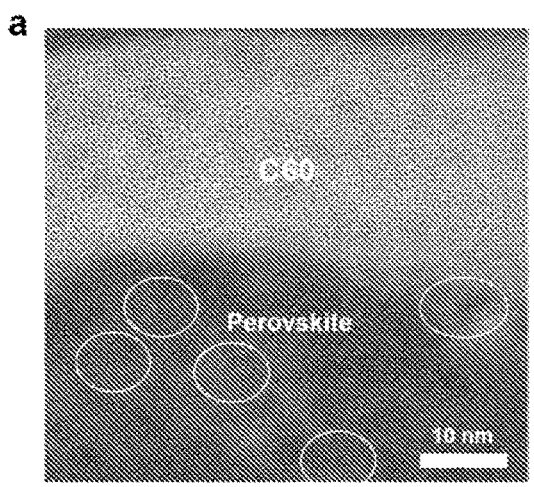
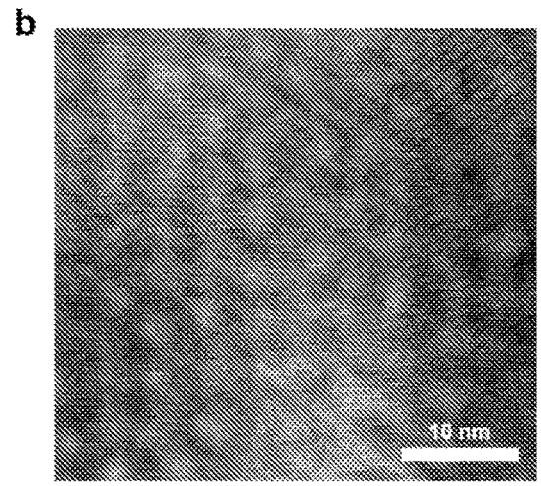
Fig. 1D          Fig. 1E

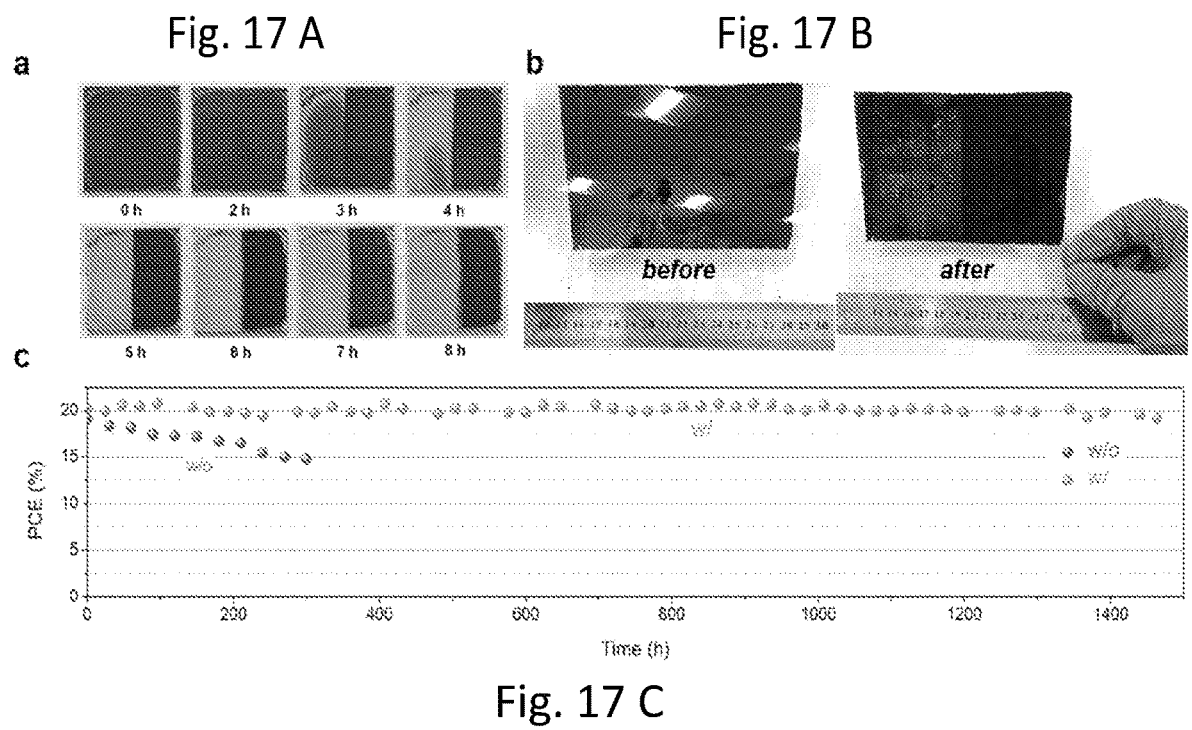
Fig. 17 A
Fig. 17 B
Fig. 17 C
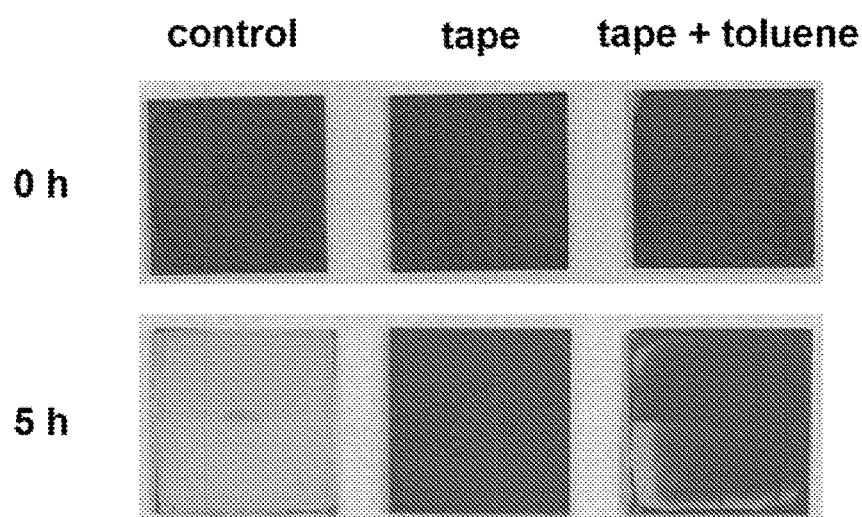
Fig. 18

Fig. 28A
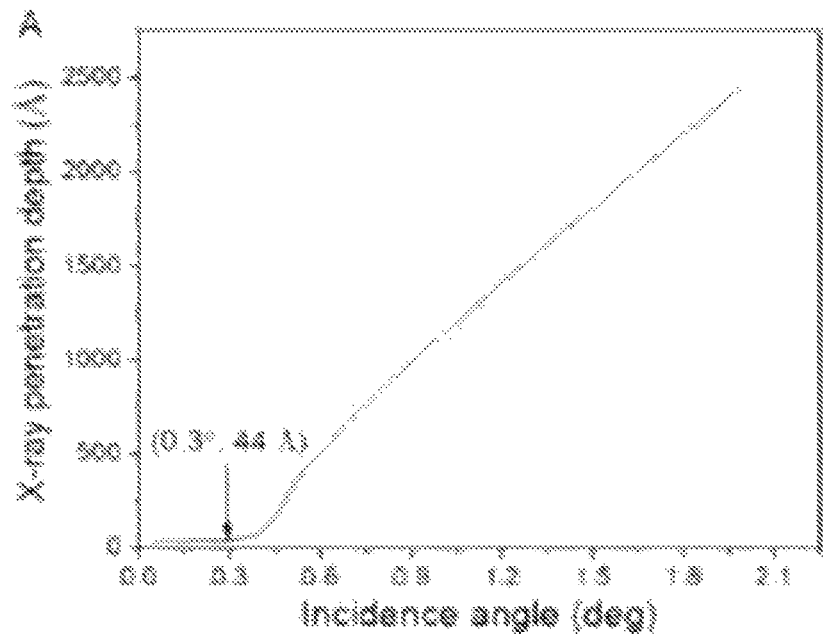
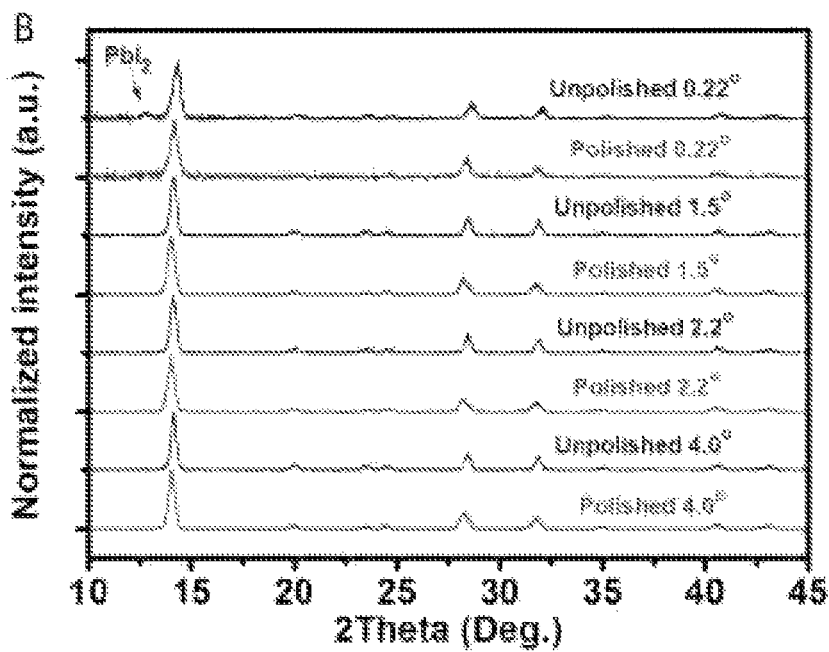
Fig. 28B

SURFACE TREATMENTS FOR PEROVSKITE FILMS TO IMPROVE EFFICIENCY/STABILITY OF RESULTING SOLAR CELLS

CROSS-REFERENCE TO RELATED APPLICATIONS

This application claims the benefit of priority to U.S. Provisional Patent Application No. 63/079,311, filed on Sep. 16, 2020, which is incorporated by reference herein in its entirety for all purposes.

GOVERNMENT SUPPORT

This invention was made with government support under Grant No. N00014-17-1-2727 awarded by Office of Naval Research. The government has certain rights in the invention.

FIELD OF THE INVENTION

The presently disclosed subject matter relates generally to surface treatment methods for polycrystalline perovskite films to enhance the stability and efficiency of solar cells employing the treated films.

BACKGROUND

Perovskite solar cells (PSCs) have attracted attention due to their excellent optical and electronic properties and low production cost (Q. Doug et al. *Science*, 2015, 347, 967-970; H. Tan et al. *Science*, 2017, 355, 722-726; M. A. Green et al. *Nat Photonics*, 2014, 8, 506-514; J.-P. Correa-Baena et al. *Science*, 2017, 358, 739-744). Indeed, the certified power conversion efficiency (PCE) of PSCs (25.2%) has surpassed those of mainstream thin-film photovoltaic technologies (NREL's Best Research-Cell Efficiency Chart, accessed on Sep. 16, 2020). However, the stability of these PSCs is becoming increasingly important for their commercialization. Current efficient PSCs typically suffer from poor long-term operational stability due to the degradation of perovskite materials under stimuli, including moisture, oxygen, heat, and light irradiation (B. Chen et al. *Chemical Society Reviews*, 2019, 48, 3842-3867; C. C. Boyd et al. *Chemical Reviews*, 2019, 119, 3418-3451; T. Leijtens et al. *Advanced Energy Materials*, 2015, 5). The degradation of these perovskite materials generally initializes from defective sites on surfaces or grain boundaries, as they are more reactive and more vulnerable to attack by moisture and oxygen (Q. Wang et al. *Energy & Environmental Science*, 2017, 10, 516-522; N. Aristidou et al. *Nature Communications*, 2017, 8, 15218; Z. Fan et al. Joule, 2017, 1, 548-562). Efforts have been dedicated to reducing these surface defect sites as a way to potentially improve the stability of PSCs; however, such efforts have been met with great difficulty. As such, what is needed in the art are strategies for improving the surfaces of perovskite materials so as to enhance their performance in photovoltaic devices. The subject matter described herein addresses this unmet need.

BRIEF SUMMARY

In one aspect, the presently disclosed subject matter is directed to a polycrystalline perovskite film comprising a perovskite composition of formula ABX; or $A_2BX_4$, wherein, A is selected from the group consisting of methylammonium (MA), tetramethylammonium, formamidinium (FA), cesium, rubidium, potassium, sodium, butylammonium, phenethylammonium, phenylammonium, guanidinium, ammonium, and a combination thereof;

B is a metal cation selected from the group consisting of lead, tin, calcium, cadmium, germanium, zinc, nickel, platinum, palladium, mercury, titanium, silicon, and a combination thereof; and X is selected from the group consisting of $Cl^-$, $Br^-$, $F^-$, $I^-$, $SCN^-$, and a combination thereof;

wherein said polycrystalline perovskite film is free of one or more surface defect layers.

In another aspect, the presently disclosed subject matter is directed to a semiconductor device comprising:
one or more anode layers;
one or more cathode layers; and
one or more active layers, wherein at least one of said one or more active layers comprises a polycrystalline perovskite film that is free of one or more surface defect layers.

In another aspect, the presently disclosed subject matter is directed to a solar cell, comprising:
one or more transparent conductive oxide layers;
one or more conductive electrode layers;
one or more hole transport layers;
one or more electron transport layers; and
one or more active layers, wherein at least one of said one or more active layers comprises a polycrystalline perovskite film that is free of one or more surface defect layers.

In another aspect, the presently disclosed subject matter is directed to a surface treatment method for removing one or more surface defect layers from a polycrystalline perovskite film, comprising:
a) contacting an adhesive with one or more surfaces of a polycrystalline perovskite film; and
b) removing a portion of said adhesive from said polycrystalline perovskite film surfaces,
wherein a and b are carried out one or more times to remove said one or more surface defect layers.

In another aspect, the presently disclosed subject matter is directed to a surface treatment method for removing one or more surface defect layers from a polycrystalline perovskite film, comprising:
a) contacting an abrasive or soft polishing pad with one or more surfaces of a polycrystalline perovskite film; and
b) removing loose material from said one or more polycrystalline perovskite film surfaces;
wherein a and b are carried out one or more times to remove said one or more surface defect layers.

These and other aspects are described herein.

BRIEF DESCRIPTION OF THE DRAWINGS

FIG. 1A shows a schematic of the setup of the nanoscratch test for removing a surface defective layer with adhesive tape.

FIG. 1B shows a plot showing the nanoscratch test results of the pristine and polished $MAPbI_3$ films.

FIG. 1C shows a schematic of peeling an adhesive tape off of a $MAPbI_3$ film.

FIG. 1D shows a HRTEM image of the perovskite/$C_{60}$ interface of an untreated $MAPbI_3$ device. The small grains are circled.

FIG. 1E shows a HRTEM image of a region inside the grains of an untreated $MAPbI_3$ device.

FIG. 17A shows a photograph of a MAPbI$_3$ film, with an area of 15 mm×15 mm prepared by a one-step spin-coating method, after light soaking for different time intervals. The right half of the film was treated with adhesive tape.

FIG. 17B shows photographs of a blade-coated MAPbI$_3$ film with an area of ~100 cm² (surface tape treatment on the right half with a tape-wrapped roller) before and after light-soaking for 3.5 hours.

FIG. 17C shows the operational stability of encapsulated solar cells based on Rb$_{0.05}$Cs$_{0.05}$FA$_{0.85}$MA$_{0.05}$PbI$_{2.85}$Br$_{0.15}$ perovskite active layers without and with tape treatment.

FIG. 18 shows pictures from a five-hour light-soaking test of MAPbI$_3$ films without, with tape treatment, and with tape treatment followed by washing with toluene.

FIG. 28A shows a plot of the calculated X-ray penetration depth in perovskite at different incidence angles.

FIG. 28B shows GIXRD patterns of unpolished and polished MAPbI$_3$ thin films at an angle of incidence of 0.22°, 1.5°, 2.2°, and 4.0°, respectively. With the increase in the X-ray incidence angle from 0.22° to 4.0°, the X-ray penetration depth increased. The bulk of either unpolished or polished perovskite films did not show detectable PbI$_2$ from the XRD patterns, when the X-ray incidence angle was enlarged to 1.5°, 2.2°, and 4°, over the X-ray critical angle, where the surface signal was weak compared to the background noise.

DETAILED DESCRIPTION

Figure 2A:
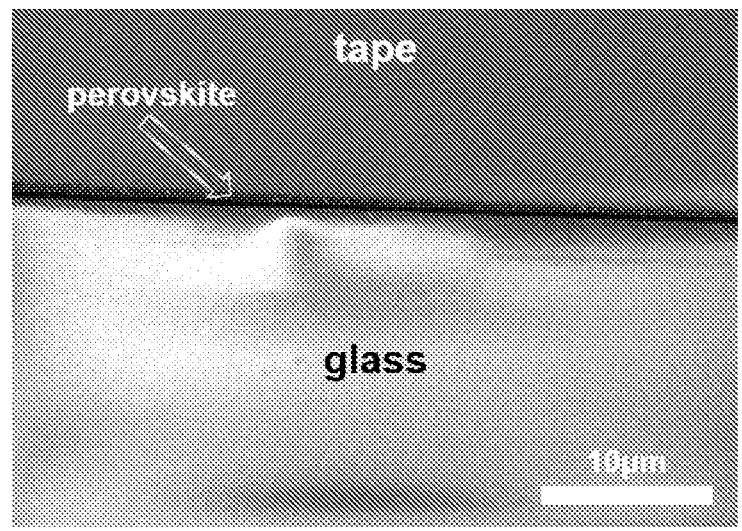
FIG. 2A shows a cross-sectional SEM image of ITO glass substrate/MAPbI$_3$/tape.

The subject matter described herein relates to polycrystalline perovskite films that are free of one or more surface defect layers, surface treatment methods for preparing the polycrystalline films, and use of the films in photovoltaic devices, such as solar cells. It has been discovered that perovskite films often have a defective layer comprising nanocrystals and amorphous regions at surfaces of the films. This layer has been shown to initialize the degradation of perovskites and to cause non-radiative carrier recombination. The surface treatment methods described herein enhance the perovskite films, thereby improving the stability of the films in semiconductor devices. As described herein, the methods can be conducted by means of an adhesive tape or mechanical polishing.

The mechanical polishing methods described herein provide perovskite films with enhanced stability in semiconductor devices. As demonstrated in the examples, polishing-off the defective layers provides the films with a mechanical hardness that is comparable to that of single crystals. These methods help suppress ion migration and permeation of detrimental species into perovskite grains.

Also described herein is a facile and scalable surface treatment that employs an adhesive tape (FIG. 1C) or adhesive-coated roller (FIG. 2B) to effectively remove the defective surface layers and thus stabilize perovskite films. The mechanical strength at the defective surface region is weaker than the inner crystalline region and the relative soft nature of the perovskite allows for the defective layers to be removed by an adhesive. The adhesive has an appropriate bonding force with the perovskite so that the peeling does not damage the crystalline region or embedded interfaces underneath. The very thin adhesive residual layer further enhances the stability of the perovskite and passivates the surface charge traps, boosting the efficiency of p-i-n structure solar cells to 22.0%. As demonstrated herein, the tape-treated devices can retain 97.1% of the initial efficiency after operation at near maximum power point under one sun illumination for 1440 hours at 65° C.

The surface treatment methods described herein improve both PCEs and the stability of PSCs through the elimination of surface defects, without altering the low-cost solution processing nature of the perovskite absorber deposition. While inheriting all the advantages of the solution-based PSC structure, including its fabrication process, simple structure, high PCE, low cost, and easy scale-up, this surface treatment method can also be easily integrated into the manufacturing lines of perovskite solar modules. Indeed, the method can be incorporated into a continuous manufacturing system, such as that shown in FIG. 43. Following deposition of the perovskite photoactive layer, the surface treatment can be performed by pressing an adhesive-coated roller onto one or more perovskite surfaces to remove surface defects and thus stabilize solar modules without significantly increasing production cost.

The presently disclosed subject matter will now be described more fully hereinafter. However, many modifications and other embodiments of the presently disclosed subject matter set forth herein will come to mind to one skilled in the art to which the presently disclosed subject matter pertains having the benefit of the teachings presented in the foregoing descriptions. Therefore, it is to be understood that the presently disclosed subject matter is not to be limited to the specific embodiments disclosed and that modifications and other embodiments are intended to be included within the scope of the appended claims. In other words, the subject matter described herein covers all alternatives, modifications, and equivalents. Unless otherwise defined, all technical and scientific terms used herein have the same meaning as commonly understood by one of ordinary skill in this field. All publications, patent applications, patents, and other references mentioned herein are incorporated by reference in their entirety. In the event that one or more of the incorporated literature, patents, and similar materials differs from or contradicts this application, including but not limited to defined terms, term usage, described techniques, or the like, this application controls.

I. Definitions

As used herein, "and/or" refers to and encompasses any and all possible combinations of one or more of the associated listed items, as well as the lack of combinations when interpreted in the alternative ("or").

As used herein, the term "about," when referring to a measurable value such as an amount of a compound or agent of the current subject matter, dose, time, temperature, and the like, is meant to encompass variations of ±20%, ±10%, ±5%, ±1%, +0.5%, or even ±0.1% of the specified amount.

As used herein, conditional language used herein, such as, among others. "can," "could," "might," "may," "e.g.," and the like, unless specifically stated otherwise or otherwise understood within the context as used, is generally intended to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without author input or prompting, whether these features, elements and/or steps are included or are to be performed in any particular embodiment. The terms "comprising." "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list.

In certain embodiments, "contacting" refers to allowing an adhesive to contact a perovskite film. In certain embodiments, the contacting may or not be facilitated by rolling the adhesive along one or more surfaces of a perovskite film. In certain embodiments, "contacting" refers to allowing an abrasive or soft polishing pad to contact one or more surfaces of a perovskite film. In certain embodiments, the contacting may or may not be facilitated by applying a pressure.

As used herein, "PSC" refers to perovskite solar cell.

As used herein, "PCE" refers to power conversion efficiency. The terms "power conversion efficiency." "PCE," "photovoltaic efficiency", and "solar cell efficiency," may be used interchangeably and refer to the ratio of energy output from the photovoltaic device to the energy input to the photovoltaic device. The energy output is in the form of electrical energy and energy input is in the form of electromagnetic radiation (e.g., sunlight). Unless otherwise indicated, the photovoltaic efficiency refers to terrestrial photovoltaic efficiency, corresponding to AM1.5 conditions, where AM is Air Mass. PCE may be measured by one or more techniques conventionally known to one of ordinary skill in the art.

As used herein. "photoactive device" refers to (i) a device capable of and configured to convert electromagnetic radiation (e.g., X-ray, infrared, ultraviolet, and/or visible light) to electrical energy and/or converting electrical energy to electromagnetic radiation. A photoactive device may be configured to both convert light to electrical energy (e.g., as a solar cell) and convert electrical energy to light (e.g., via electroluminescence), for example depending on the direction of electrical current in the device (e.g., depending on whether electrical power is withdrawn from or supplied to the device). Exemplary photoactive devices include, but are not limited to, a photovoltaic cell (also referred to as a solar cell), a photodiode, and a light emitting diode (LED). In certain embodiments, a photoactive device can also refer to a device configured to change its optical, physical, and/or electrical properties with change in its exposure to electromagnetic radiation and/or a device configured to change its optical properties in response to a change in input of electrical energy. Exemplary photoactive devices can also include, but are not limited to, a photoresistor, phototransistor, photomultiplier, photoelectric cell, and an electrochromic cell.

As used herein, "active layer" refers to a photoactive layer in a device, such as a solar cell, and/or it may include a photoactive material. Furthermore, it should be noted that the use of the term "active layer" is in no way meant to restrict or otherwise define, explicitly or implicitly, the properties of any other layer in the device.

As used herein, when an element such as a layer, a film, a region, or a substrate is referred to as being "on" another element, it can be directly on the other element, or an intervening element may also be present. In contrast, when an element is referred to as being "directly on" another element, there are no intervening elements present.

As used herein, the term "defect" refers to a defective site in a crystal lattice where the local crystal structure does not correspond to the crystal structure of the bulk material. Non-limiting examples of defective sites include point defects, line defects, and planar defects. Point defects include vacancy defects (the absence of an ion), interstitial defects (the interstitial inclusion of an additional ion). Frenkel defects (a closely located pair of defects consisting of an interstitial defect and a vacancy defect) and the presence of an impurity ion. Planar defects include grain boundaries and stacking faults.

II. Polycrystalline Perovskite Films

In one aspect, the subject matter described herein is directed to a polycrystalline perovskite film comprising a perovskite composition of formula $ABX_3$ or $A_2BX_4$, wherein, A is selected from the group consisting of methylammonium (MA), tetramethylammonium, formamidinium (FA), cesium, rubidium, potassium, sodium, butylammonium, phenethylammonium, phenylammonium, guanidinium, ammonium, and a combination thereof;

B is a metal cation selected from the group consisting of lead, tin, calcium, cadmium, germanium, zinc, nickel, platinum, palladium, mercury, titanium, silicon, and a combination thereof; and X is selected from the group consisting of Cl$^-$, Br$^-$, F$^-$, I$^-$, SCN$^-$, and a combination thereof;

wherein said polycrystalline perovskite film is free of one or more surface defect layers.

As used herein, "one or more surface defect layers" refers to one or more surfaces of a polycrystalline perovskite film having a morphology characterized by nanocrystals and/or small grains having various orientations, which is surrounded by an amorphous phase. An area without a clear crystalline structure from FFT imaging is referred as an amorphous phase region. In certain embodiments, the polycrystalline perovskite film is free of one surface defect layer. In certain embodiments, the polycrystalline is free of two surface defect layers. A perovskite film that is free of one surface defect layer is a film in which a region of its surface does not contain a morphology characterized by nanocrystals and/or small grains having various orientations, which is surrounded by an amorphous phase.

In certain embodiments, A may comprise an ammonium, an organic cation of the general formula [NR$_4$]$^+$ where the R groups can be the same or different groups. Suitable R groups include, but are not limited to: methyl, ethyl, propyl, butyl, pentyl group or isomer thereof; any alkane, alkene, or alkyne C$_x$H$_y$, where x=1-20, y=1-42, cyclic, branched or straight-chain; alkyl halides, C$_x$H$_y$X$_z$, x=1-20, y=0-42, z=1-42, X=F, Cl, Br, or I; any aromatic group (e.g., phenyl, alkylphenyl, alkoxyphenyl, pyridine, naphthalene); cyclic complexes where at least one nitrogen is contained within the ring (e.g., pyridine, pyrrole, pyrrolidine, piperidine, tetrahydroquinoline); any sulfur-containing group (e.g., sulfoxide, thiol, alkyl sulfide); any nitrogen-containing group (nitroxide, amine); any phosphorous containing group (phosphate); any boron-containing group (e.g., boronic acid); any organic acid (e.g., acetic acid, propanoic acid); and ester or amide derivatives thereof; any amino acid (e.g., glycine, cysteine, proline, glutamic acid, arginine, serine, histindine, 5-ammoniumvaleric acid) including alpha, beta, gamma, and greater derivatives; any silicon containing group (e.g., siloxane); and any alkoxy or group, —OC$_x$H$_y$, where x=0-20, y=1-42. In certain embodiments. A is methylammonium, (CH$_3$NH$_3^-$). In certain embodiments. A is methylammonium. In certain embodiments. A is tetramethylammonium, ((CH$_3$)$_4$N$^+$). In certain embodiments. A is butylammonium, which may be represented by (CH$_3$(CH$_2$)$_3$NH$_3^-$) for n-butylammonium, by ((CH$_3$)$_3$CNH$_3^+$) for t-butylammonium, or by (CH$_3$)$_2$CHCH$_2$NH$_3^+$) for iso-butylammonium. In certain embodiments, A is phenethylammonium, which may be represented by C$_6$H$_5$(CH$_2$)$_2$NH$_3^+$ or by C$_6$H$_5$CH(CH$_3$)NH$_3^+$. In certain embodiments. A comprises phenylammonium, C$_6$H$_5$NH$_3^+$.

In certain embodiments, A may comprise a formamidinium, an organic cation of the general formula [R$_2$NCHNR$_2$]$^+$ where the R groups can be the same or different groups. Suitable R groups include, but are not limited to: hydrogen, methyl, ethyl, propyl, butyl, pentyl or an isomer thereof; any alkane, alkene, or alkyne C$_x$H$_y$, where x=1-20, y=1-42, cyclic, branched or straight-chain; alkyl halides, C$_x$H$_y$X$_z$, x=1-20, y=0-42, z=1-42, X=F, Cl, Br, or I; any aromatic group (e.g., phenyl, alkylphenyl, alkoxyphenyl, pyridine, naphthalene); cyclic complexes where at least one nitrogen is contained within the ring (e.g., imidazole, benzimidazole, dihydropyrimidine, (azolidinylidenemethyl)pyrrolidine, triazole); any sulfur-containing group (e.g., sulfoxide, thiol, alkyl sulfide); any nitrogen-containing group (nitroxide, amine); any phosphorous containing group (phosphate); any boron-containing group (e.g., boronic acid); any organic acid (acetic acid, propanoic acid) and ester or amide derivatives thereof; any amino acid (e.g., glycine, cysteine, proline, glutamic acid, arginine, serine, histindine, 5-ammoniumvaleric acid) including alpha, beta, gamma, and greater derivatives; any silicon containing group (e.g., siloxane); and any alkoxy or group, —OC$_x$H$_y$, where x=0-20, y=1-42. In certain embodiments A is a formamidinium ion represented by (H$_2$N=CH—NH$_2^+$).

In certain embodiments, A may comprise a guanidinium, an organic cation of the general formula [(R$_2$N)$_2$C=NR$_2$]$^+$ where the R groups can be the same or different groups. Suitable R groups include, but are not limited to: hydrogen, methyl, ethyl, propyl, butyl, pentyl group or isomer thereof; any alkane, alkene, or alkyne C$_x$H$_y$, where x=1-20, y=1-42, cyclic, branched or straight-chain; alkyl halides, C$_x$H$_y$X$_z$, x=1-20, y=0-42, z=1-42, X=F, Cl, Br, or I; any aromatic group (e.g., phenyl, alkylphenyl, alkoxyphenyl, pyridine, naphthalene); cyclic complexes where at least one nitrogen is contained within the ring (e.g., octahydropyrimido[1,2-a]pyrimidine, pyrimido[1,2-a]pyrimidine, hexahydroimidazo[1,2-a]imidazole, hexahydropyrimidin-2-imine); any sulfur-containing group (e.g., sulfoxide, thiol, alkyl sulfide); any nitrogen-containing group (nitroxide, amine); any phosphorous containing group (phosphate); any boron-containing group (e.g., boronic acid); any organic acid (acetic acid, propanoic acid) and ester or amide derivatives thereof; any amino acid (e.g., glycine, cysteine, proline, glutamic acid, arginine, serine, histindine, 5-ammoniumvaleric acid) including alpha, beta, gamma, and greater derivatives; any silicon containing group (e.g., siloxane); and any alkoxy or group. —OC$_x$H$_y$, where x=0-20, y=1-42. In certain embodiments. A is a guanidinium ion of the type (H$_2$N=C—(NH$_2$)$_2^+$).

In certain embodiments, A may comprise an alkali metal cation, such as Li$^+$, Na$^+$, K$^+$, Rb$^+$, or Cs$^+$.

In certain embodiments, B comprises at least one divalent (B$^{+2}$) metal atom. The divalent metal (B) can be, for example, one or more divalent elements from Group 14 of the Periodic Table (e.g., divalent lead, tin, or germanium), one or more divalent transition metal elements from Groups 3-12 of the Periodic Table (e.g., divalent titanium, vanadium, chromium, manganese, iron, cobalt, nickel, copper, zinc, palladium, platinum, and cadmium), and/or one or more divalent alkaline earth elements (e.g., divalent magnesium, calcium, strontium, and barium). In certain embodiments, B is selected from the group consisting of lead, tin, cadmium, germanium, zinc, nickel, platinum, palladium, mercury, titanium, silicon, and a mixture thereof. In a preferred embodiment, B is lead.

In certain embodiments of the polycrystalline film, X is independently selected from one or a combination of halide atoms, wherein the halide atom (X) may be, for example, fluoride (F$^-$), chloride (Cl$^-$), bromide (Br$^-$), and/or iodide (I$^-$).

In certain embodiments, the perovskite composition is of formula ABX$_3$. In certain embodiments, the perovskite composition is selected from the group consisting of FAPbBr$_3$, FAPbI$_3$, FAPbCl$_3$, MAPbBr$_3$, MAPbI$_3$, MAPbCl$_3$, CsPbBr$_3$, CsPbI$_3$, and CsPbCl$_3$. In certain embodiments of the perovskite composition, A is selected from the group consisting of Cs, FA, MA. Rb, and a combination thereof; B is selected from the group consisting of lead, tin, and a combination thereof; and X is selected from the group consisting of $I^-$, $Br^-$, and a combination thereof. In certain embodiments. X is $I^-$. In certain embodiments. X is $Br^-$. In certain embodiments. X is a mixture of $I^-$ and $Br^-$.

In certain embodiments, the perovskite composition of formula $ABX_3$ is selected from the group consisting of $Cs_yFA_{1-x-y}MA_xPbI_{3-z}Br_z$ (y≤x, x+y<1, z≤3), $Rb_xCs_yFA_{1-x-y-f}MA_fPbI_{3-z}Br_z$ (y≤x≤f, x+y+f<1, z≤3), $Cs_xFA_{1-x}Pb_{1-z}Sn_zI_3$ (x<1, z≤1), and $Cs_xFA_{1-x}PbI_{3-z}Br_z$ (z<1, z≤3). In certain embodiments, the perovskite composition of formula $ABX_3$ is $Cs_yFA_{1-x-y}MA_xPbI_{3-z}Br_z$ (y≤x, x+y<1, z≤3), wherein y is 0.01-0.75, x is 0.0-0.25, and z is 0.01 to 2.5. In certain embodiments, the perovskite composition of formula $ABX_3$ is $Rb_xCs_yFA_{1-x-y-f}MA_fPbI_{3-z}Br_z$ (y≤x≤f, x+y+f<1, z≤3), wherein y is 0.01-0.20, x is 0.01-0.20, f is 0.01 to 0.20, and z is 0.01 to 2.5. In certain embodiments, the perovskite composition of formula $ABX_3$ is selected from the group consisting of $Cs_{0.4}FA_{0.6}Pb(I_{0.64}Br_{0.36})_3$, $Cs_{0.05}FA_{0.81}MA_{0.14}PbI_{2.55}Br_{0.45}$, $Rb_{0.05}Cs_{0.05}FA_{0.85}MA_{0.05}PbI_{2.85}Br_{0.15}$, and $Cs_{0.20}FA_{0.80}Pb_{0.50}Sn_{0.50}I_3$.

In certain embodiments, the polycrystalline film has a thickness of about 1 nm to about 10 μm. In certain embodiments, the polycrystalline film has a thickness of about 100 nm to about 2000 nm. In certain embodiments, the polycrystalline film has a thickness in the range of about 80 nm to about 300 nm. In certain embodiments, the polycrystalline film has a thickness in the range of about 0.1 mm to about 50 mm. In certain embodiments, the polycrystalline film has a thickness in the range of about 100 nm to about 1000 nm. In certain embodiments, the polycrystalline film has a thickness of about, at least, above, up to, or less than, for example, 200 nm, 300 nm, 400 nm, 500 nm, 600 nm, 700 nm, 800 nm, 900 nm, 1000 nm (1 μm), 2 μm, 3 μm, 4 μm, 5 μm, 6 μm, 7 μm, 8 μm, 9 μm, or 10 μm.

In certain embodiments, the polycrystalline film is smooth, having a root mean square roughness of about 8 nm to about 10 nm. In certain embodiments, the polycrystalline film has a root mean square roughness of about 8.25, 8.50, 8.75, 9, 9.1, 9.2, 9.3, 9.4, 9.5, 9.6, 9.7, or 9.9.

In certain embodiments, the polycrystalline film further comprises a residue of adhesive on one or more surfaces of said perovskite film. This can occur following contacting and removing of an adhesive on the perovskite film to remove said one or more surface defect layers. The adhesive can leave a residue of adhesive on one or more surfaces of the film. In certain embodiments, the residue of adhesive has a thickness of about 1 nm to about 1000 nm. In certain embodiments, the residue of adhesive has a thickness of about 1 nm to about 100 nm, about 5 nm to about 50 nm, about 25 nm to about 500 nm, about 10 nm to about 300 nm, about 10 nm to about 50 nm, about 75 nm to about 600 nm, about 100 nm to about 1000 nm, about 400 to about 800, about 700 to about 900, about 300 to about 500, about 200 to about 300, about 300 to about 400, or about 100 to about 600.

In certain embodiments, the residue of adhesive is comprises a composition selected from the group consisting of resin, rubber, polyterpene, polyisoprene, polyvinyl alcohol (PVA), polyacrylic acid (PAA), cyanoacrylate, polyethylene (PE), polypropylene (PP), polystyrene (PS), nylon, polyurethane (PU), polycarbonate (PC), polyoxymethylene (POM), and a mixture thereof.

II. Surface Treatment Methods

A. Taping Methods

In certain embodiments, the subject matter disclosed herein is directed to a surface treatment method for removing one or more surface defect layers from a polycrystalline perovskite film, comprising:
a) contacting an adhesive with one or more surfaces of a polycrystalline perovskite film; and
b) removing a portion of said adhesive from said polycrystalline perovskite film surfaces,
wherein a and b are carried out one or more times to remove said one or more surface defect layers.

As used herein, the removal of "one or more surface defect layers" refers to the removal of one or more surfaces of a perovskite film that comprise a region characterized by nanocrystals surrounded by an amorphous phase. For example, the removal of two surface defect layers can comprise the removal of two different surfaces on a perovskite film that have undergone the tape treatment described above.

In certain embodiments, the method can remove about 50% to about 100% of the defect surface area of the polycrystalline perovskite film. In certain embodiments, the method can remove about 50% to about 60, about 60% to about 70%, about 70% to about 80%, about 80% to about 90%, about 90% to 100%, about 50% to about 75%, or about 75% to about 100% of the defect surface area of the polycrystalline perovskite film.

Figure 43:
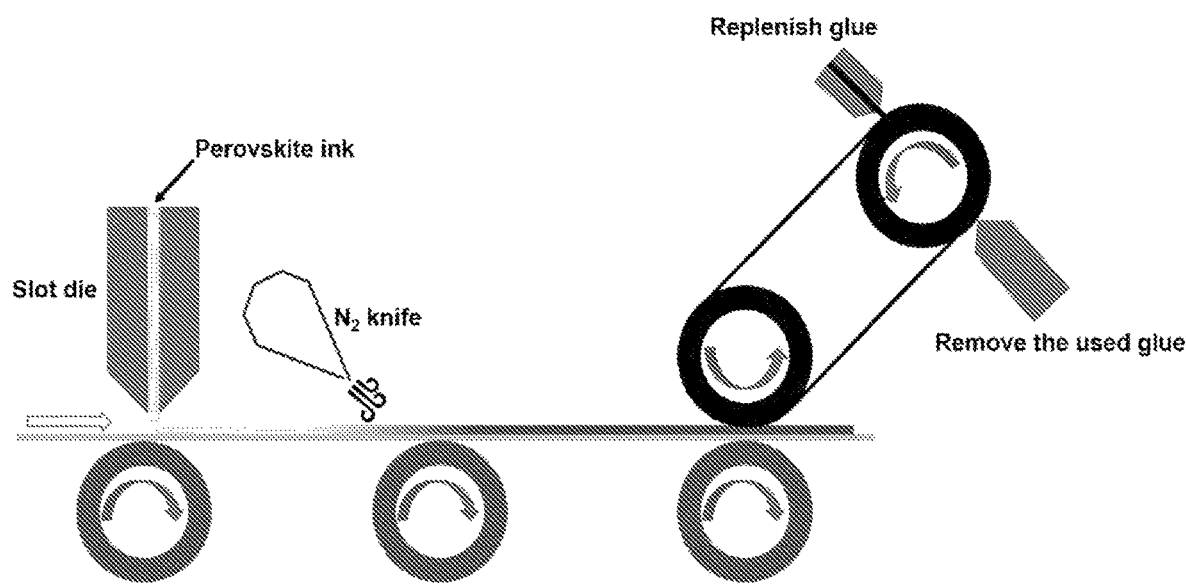
FIG. 43 shows a schematic of a manufacturing line of perovskite solar cells with adhesion-involved surface treatment.

In certain embodiments of the above method, the method is a roll-to-roll process. As used herein. "roll-to-roll process" refers to a process of applying coatings or performing other processes starting with a roll of a flexible material and re-reeling after the process to create an output roll. An example of a roll-to-roll process is depicted in FIG. 43.

In certain embodiments of the above method, the method is scalable. As used herein. "scalable" refers to a method that can easily be scaled up or down. For example, the methods disclosed herein can be implemented in a roll-to-roll process, described above. Additionally, the deposition methods described herein can be conducted via fast-coating processes, such as doctor blading, which provide additional benefits. Such doctor-blade deposition methods can be utilized for large area perovskite cells fabricated with high volume roll-to-roll production.

In certain embodiments of the above method, the perovskite film has a thickness of about 1 nm to about 10 μm. In certain embodiments of the above method, the polycrystalline film has a thickness of about 100 nm to about 2000 nm. In certain embodiments of the above method, the polycrystalline film has a thickness in the range of about 80 nm to about 300 nm. In certain embodiments of the above method, the polycrystalline film has a thickness in the range of about 0.1 mm to about 50 mm. In certain embodiments of the above method, the polycrystalline film has a thickness in the range of about 100 nm to about 1000 nm. In certain embodiments of the above method, the polycrystalline film has a thickness of about, at least, above, up to, or less than, for example, 200 nm, 300 nm, 400 nm, 500 nm, 600 nm, 700 nm, 800 nm, 900 nm, 1000 nm (1 μm), 2 μm, 3 μm, 4 μm, 5 μm, 6 μm, 7 μm, 8 μm, 9 μm, or 10 μm.

In certain embodiments of the above method, the adhesive is in physical communication with a backing material. In certain embodiments, the backing material is selected from the group consisting of tape, roller, mold, and a combination thereof. In certain embodiments, the backing material is roller or tape. In certain embodiments, the backing material is tape.

In certain embodiments of the above method, the method produces a polycrystalline perovskite film having a residue of adhesive on said one or more surfaces of said film. In certain embodiments of the above method, the residue of adhesive has a thickness of about 1 nm to about 1000 nm. In certain embodiments of the above method, the residue of adhesive has a thickness of about 1 nm to about 1000 nm. In certain embodiments of the above method, the residue of adhesive has a thickness of about 1 nm to about 100 nm, about 5 nm to about 50 nm, about 25 nm to about 500 nm, about 10 nm to about 300 nm, about 10 nm to about 50 nm, about 75 nm to about 600 nm, about 100 nm to about 1000 nm, about 400 to about 800, about 700 to about 900, about 300 to about 500, about 200 to about 300, about 300 to about 400, or about 100 to about 600. In certain embodiments of the above method, the residue of adhesive is comprises a composition selected from the group consisting of resin, rubber, polyterpene, polyisoprene, polyvinyl alcohol (PVA), polyacrylic acid (PAA), cyanoacrylate, polyethylene (PE), polypropylene (PP), polystyrene (PS), nylon, polyurethane (PU), polycarbonate (PC), polyoxymethylene (POM), and a mixture thereof.

In certain embodiments of the above method, the adhesive is contacted with surfaces of said polycrystalline perovskite film with an applied pressure of about 1 Pa to about 100 MPa. In certain embodiments of the above method, the adhesive is contacted with surfaces of said polycrystalline perovskite film with an applied pressure of about 1 Pa to about 10 Pa, about 20 Pa to about 50 MPa, about 100 Pa to about 500 Pa, about 25 Pa to about 150 Pa. or about 150 Pa to about 700 Pa. In certain embodiments of the above method, the adhesive is contacted with surfaces of said polycrystalline perovskite film with an applied pressure of about 1 Pa, 1.25 Pa, 1.5 Pa, 1.75 Pa, 2 Pa, 2.5 Pa, 3 Pa, 3.5 Pa, 4 Pa, 4.5 Pa, or 5 Pa.

In certain embodiments of the above method, the polycrystalline perovskite film has a composition of formula $ABX_3$ or $A_2BX_4$,
wherein,
A is selected from the group consisting of methylammonium (MA), tetramethylammonium, formamidinium (FA), cesium, rubidium, potassium, sodium, butylammonium, phenethylammonium, phenylammonium, guanidinium, ammonium, and a combination thereof;
B is a metal cation selected from the group consisting of lead, tin, calcium, cadmium, germanium, zinc, nickel, platinum, palladium, mercury, titanium, silicon, and a combination thereof; and
X is selected from the group consisting of $Cl^-$, $Br^-$, $F^-$, $I^-$, $SCN^-$, and a combination thereof.

In certain embodiments of the above method, the composition is of formula $ABX_3$. In certain embodiments of the above method, the composition is selected from the group consisting of $FAPbBr_3$, $FAPbI_3$, $FAPbCl_3$, $MAPbBr_3$, $MAPbI_3$, $MAPbCl_3$, $CsPbBr_3$, $CsPbI_3$, and $CsPbCl_3$. In certain embodiments of the above method. A is selected from the group consisting of Cs, FA, MA, Rb, and a combination thereof; B is selected from the group consisting of lead, tin, and a combination thereof; and X is selected from the group consisting of $I^-$, $Br^-$, and a combination thereof. In certain embodiments, the perovskite composition of formula $ABX_3$ is selected from the group consisting of $Cs_yFA_{1-x-y}MA_xPbI_{3-z}Br_z$ (y≤x, x+y<1, z≤3), $Rb_xCs_yFA_{1-x-y-f}MA_fPbI_{3-z}Br_z$ (y≤x≤f, x+y+f<1, z≤3), $Cs_xFA_{1-x}Pb_{1-z}Sn_zI_3$ (x<1, z≤1), and $Cs_xFA_{1-x}PbI_{3-z}Br_z$ (z<1, z≤3). In certain embodiments, the perovskite composition of formula $ABX_3$ is $Cs_yFA_{1-x-y}MA_xPbI_{3-z}Br_z$ (y≤x, x+y<1, z≤3), wherein y is 0.01-0.75, x is 0.0-0.25, and z is 0.01 to 2.5. In certain embodiments, the perovskite composition of formula $ABX_3$ is $Rb_xCs_yFA_{1-x-y-f}MA_fPbI_{3-z}Br_z$ (y≤x≤f, x+y+f<1, z≤3), wherein y is 0.01-0.20, x is 0.01-0.20, f is 0.01 to 0.20, and z is 0.01 to 2.5. In certain embodiments, the perovskite composition of formula $ABX_3$ is selected from the group consisting of $Cs_{0.4}FA_{0.6}Pb(I_{0.64}Br_{0.36})_3$, $Cs_{0.05}FA_{0.81}MA_{0.14}PbI_{2.55}Br_{0.45}$, $Rb_{0.05}Cs_{0.05}FA_{0.85}MA_{0.05}PbI_{2.85}Br_{0.15}$, and $Cs_{0.20}FA_{0.80}Pb_{0.50}Sn_{0.50}I_3$.

In certain embodiments of the above method, the method improves the stability of the perovskite film. In certain embodiments of the above method, the method produces a polycrystalline perovskite film with improved stability for use as an active material in a semiconductor device. As used herein, "improved stability" of the perovskite film refers to the film's stability under light-soaking conditions with simulated AM 1.5G irradiation, as described in the Examples. In certain embodiments of the above method, the semiconductor device is selected from the group consisting of solar cell, light emitting diode, photodiode, photoelectrochemical cell, photoresistor, phototransistor, photomultiplier, photoelectric cell, electrochromic cell, and radiation detector. In certain embodiments of the above method, the solar cell is a single junction solar cell. In certain embodiments of the above method, the solar cell is a tandem solar cell. In certain embodiments of the above method, the device is a solar cell, and the method improves the power conversion efficiency of said solar cell. In certain embodiments of the above method, the method improves the power conversion efficiency of said solar cell by about 1%, 2%, 3%, 4%, 5%, 6%, 7%, 8%, 9%, 10%, 11%, 12%, 13%, 14%, 15%, 16%, 17%, 18%, 19%, 20%, 21%, 22%, 23%, 24%, 25%, 26%, 27%, 28%, 29%, 30%, 31%, 32%, 33%, 34%, 35%, 36%, 37%, 38%, 39%, 40%, 41%, 42%, 43%, 44%, 45%, 46%, 47%, 48%, 49%, or 50%. In certain embodiments of the above method, the solar cell has a Power Conversion Efficiency of at least 22%. In certain embodiments of the above method, the solar cell has a Power Conversion Efficiency of at least 20%, 21%, 21.5%, 22%, 22.5%, or 23%. In certain embodiments of the above method, the solar cell retains about 98.5% of said Power Conversion Efficiency after continuous illumination for 1000 hours. In certain embodiments of the above method, the solar cell retains about 95%, 96%, 97%, 98.1%, 98.2%, 98.3%, 98.4%, 98.5%, 98.6%, 98.7%, 98.9%, or 99% of said Power Conversion Efficiency after continuous illumination for 1000 hours. In certain embodiments of the above method, the solar cell retains about 97.1% of said Power Conversion Efficiency after continuous illumination for 1440 hours. In certain embodiments of the solar cell described herein, the solar cell can retain about 90%, 95%, 96%, 97%, 97.1%, 97.2%, 97.3%, 97.4%, 97.5%, 97.6%, 97.8%, 97.9%, 98%, 98.1%, 98.2%, 98.3%, 98.4%, or 98.5% of its Power Conversion Efficiency after continuous illumination for 1440 hours.

In certain embodiments, the subject matter described herein is directed to a method for preparing a solar cell, comprising:
disposing an active layer comprising a polycrystalline perovskite film on a transparent conductive oxide layer; and
disposing a conductive electrode layer on said active layer; wherein said method further comprises the surface treatment method of the above embodiments.

In certain embodiments of the above embodiments for preparing a solar cell, the method further comprises disposing a first transport layer and a second transport layer in said solar cell, wherein:
- said first transport layer is disposed directly on said transparent conductive oxide layer;
- said active layer is disposed directly on said first transport layer;
- said second transport layer is disposed directly on said active layer; and
- said conductive electrode layer is disposed directly on said second transport layer.

B. Mechanical Polishing Methods

In certain embodiments, the subject matter described herein is directed to a surface treatment method for removing one or more surface defect layers from a polycrystalline perovskite film, comprising:
- a) contacting an abrasive or soft polishing pad with one or more surfaces of a polycrystalline perovskite film; and
- b) removing loose material from said polycrystalline perovskite film surfaces;
- wherein a and b are carried out one or more times to remove said one or more surface defect layers.

As used herein, the removal of "one or more surface defect layers" refers to the removal of one or more surfaces of a perovskite film that comprise a region characterized by nanocrystals surrounded by an amorphous phase. For example, the removal of two surface defect layers can comprise the removal of two different surfaces on a perovskite film that have undergone the mechanical polishing method described above.

In certain embodiments, the method can remove about 50% to about 100% of the defect surface area of the polycrystalline perovskite film. In certain embodiments, the method can remove about 50% to about 60%, about 60% to about 70%, about 70% to about 80%, about 80% to about 90%, about 90% to 100%, about 50% to about 75%, or about 75% to about 100% of the defect surface area of the polycrystalline perovskite film.

As used herein. "loose material" refers to particles that are not attached to the polycrystalline perovskite film.

In certain embodiments of the above method, the abrasive comprises particles of $SiO_2$ or $Al_2O_3$. In certain embodiments of the above method, the abrasive is 3M sandpaper. In certain embodiments of the above method, the particles are from about 1 μm to about 30 μm in diameter. In certain embodiments, the particles are about 2 μm, 5 μm, 7 μm, 10 μm, 15 μm, 25 μm, or 27 μm in diameter.

In certain embodiments of the above methods, the method comprises:
- first contacting said abrasive with one or more surfaces of said polycrystalline perovskite film, and then contacting said soft polishing pad with said one or more surfaces of said polycrystalline perovskite film.

In certain embodiments of the above methods, the soft polishing pad has a thickness of about 100 μm to about 5 mm. In certain embodiments of the above methods, the soft polishing pad has a thickness of about 800 μm to about 1 mm, about 500 μm to about 2 mm about 1 mm to about 5 mm, about 100 μm to about 300 μm, or about 500 μm to about 800 μm. In certain embodiments of the above method, the soft polishing pad is a CHEMOMET polishing pad.

In certain embodiments of the above methods, the soft polishing pad has a porous surface. In certain embodiments of the above method, the porous surface comprises a material selected from the group consisting of polyurethane (PU), polycarbonate (PC), polyester, cotton, silk, rubber, cellulose, nylon, and a mixture thereof. In certain embodiments of the above method, the porous surface has a Shore O type hardness of about 30 to about 80. In certain embodiments of the above method, the porous surface has a Shore O type hardness of about 30 to about 50, about 40 to about 70, about 35 to about 45, or about 40 to about 65.

In certain embodiments of the above method, the soft polishing pad is flexible.

In certain embodiments of the above method, removing loose material from said polycrystalline perovskite surfaces comprises applying a solvent to surfaces of said polycrystalline perovskite film. In certain embodiments of the above method, the solvent is selected from the group consisting of toluene (TL), ethyl acetate (EA), diethyl ether (DE), dichloromethane (DCM), hexane, and a mixture thereof.

In certain embodiments of said method, the perovskite film is rotating relative to said abrasive or soft polishing pad.

In certain embodiments of the above methods, the contacting comprises contacting said abrasive or soft polishing pad with surfaces of said perovskite film with a pressure about 1 Pa to about 100 MPa. In certain embodiments of the above method, the contacting comprises contacting said abrasive or soft polishing pad with surfaces of said perovskite film with a pressure of about 0.5 MPa to about 2 MPa. In certain embodiments of the above method, the contacting comprises contacting said abrasive or soft polishing pad with surfaces of said perovskite film with a pressure of about 1 Pa to about 10 Pa, about 20 Pa to about 50 MPa, about 100 Pa to about 500 Pa, about 25 Pa to about 150 Pa, or about 150 Pa to about 700 Pa. In certain embodiments of the above method, the contacting comprises contacting said abrasive or soft polishing pad with surfaces of said perovskite film with a pressure of about 1 Pa, 1.25 Pa, 1.5 Pa, 1.75 Pa, 2 Pa, 2.5 Pa, 3 Pa, 3.5 Pa, 4 Pa, 4.5 Pa, or 5 Pa.

In certain embodiments of the above method, the one or more surface layers comprise a depth of about 10 nm to about 1000 μm. In certain embodiments of the above method, the one or more surface layers comprise a depth of about 50 nm to about 500 nm, about 100 nm to about 100 μm, about 10 nm to about 1 μm, about 50 nm to about 100 nm, about 200 μm to about 400 μm, about 300 μm to about 800 μm, about 450 nm to about 800 μm, or about 400 μm to about 1000 μm.

In certain embodiments of the above method, the method is scalable.

In certain embodiments of the above method, the method increases the hardness of the perovskite film.

In certain embodiments of the above method, the polycrystalline perovskite film has a composition of formula $ABX_3$ or $A_2BX_4$,
wherein,
- A is selected from the group consisting of methylammonium (MA), tetramethylammonium, formamidinium (FA), cesium, rubidium, potassium, sodium, butylammonium, phenethylammonium, phenylammonium, guanidinium, ammonium, and a combination thereof;
- B is a metal cation selected from the group consisting of lead, tin, calcium, cadmium, germanium, zinc, nickel, platinum, palladium, mercury, titanium, silicon, and a combination thereof; and
- X is selected from the group consisting of $Cl^-$, $Br^-$, $F^-$, $I^-$, $SCN^-$, and a combination thereof.

In certain embodiments of the above method, the composition is of formula $ABX_3$. In certain embodiments of the above method, the composition is selected from the group consisting of $FAPbBr_3$, $FAPbI3$, $FAPbCl_3$, $MAPbBr_3$, $MAPbI_3$, $MAPbCl_3$, $CsPbBr_3$. $CsPbI_3$, and $CsPbCl_3$. In certain embodiments of the above method, A is selected from the group consisting of Cs, FA, MA, Rb, and a combination thereof; B is selected from the group consisting of lead, tin, and a combination thereof; and X is selected from the group consisting of I⁻, Br⁻, and a combination thereof. In certain embodiments, the perovskite composition of formula $ABX_3$ is selected from the group consisting of $Cs_yFA_{1-x-y}MA_xPbI_{3-z}Br_z$ (y≤x, x+y<1, z≤3), $Rb_xCs_yFA_{1-x-y-f}MA_fPbI_{3-z}Br_z$ (y≤x≤f, x+y+f<1, z≤3), $Cs_xFA_{1-x}Pb_{1-z}Sn_zI_3$ (x<1, z≤1), and $Cs_xFA_{1-x}PbI_{3-z}Br_z$ (z<1, z≤3). In certain embodiments, the perovskite composition of formula $ABX_3$ is $Cs_yFA_{1-x-y}MA_xPbI_{3-z}Br_z$ (y≤x, x+y<1, z≤3), wherein y is 0.01-0.75, x is 0.0-0.25, and z is 0.01 to 2.5. In certain embodiments, the perovskite composition of formula $ABX_3$ is $Rb_xCs_yFA_{1-x-y-f}MA_fPbI_{3-z}Br_z$ (y≤x≤f, x+y+f<1, z≤3), wherein y is 0.01-0.20, x is 0.01-0.20, f is 0.01 to 0.20, and z is 0.01 to 2.5. In certain embodiments, the perovskite composition of formula $ABX_3$ is selected from the group consisting of $Cs_{0.4}FA_{0.6}Pb(I_{0.64}Br_{0.36})_3$, $Cs_{0.05}FA_{0.81}MA_{0.14}PbI_{2.55}Br_{0.45}$, $Rb_{0.05}Cs_{0.05}FA_{0.85}MA_{0.05}PbI_{2.85}Br_{0.15}$, and $Cs_{0.20}FA_{0.80}Pb_{0.50}Sn_{0.50}I_3$.

In certain embodiments of the above method, the method improves the stability of the perovskite film. In certain embodiments of the above method, the method produces a polycrystalline perovskite film with improved stability for use as an active material in a semiconductor device. As used herein, "improved stability" of the perovskite film refers to the film's stability under light-soaking conditions with simulated AM 1.5G irradiation, as described in the Examples. In certain embodiments of the above method, the semiconductor device is selected from the group consisting of solar cell, light emitting diode, photodiode, photoelectrochemical cell, photoresistor, phototransistor, photomultiplier, photoelectric cell, electrochromic cell, and radiation detector. In certain embodiments of the above method, the solar cell is a single junction solar cell. In certain embodiments of the above method, the solar cell is a tandem solar cell. In certain embodiments of the above method, the device is a solar cell, and the method improves the power conversion efficiency of said solar cell. In certain embodiments of the above method, the method improves the power conversion efficiency of said solar cell by about 1%, 2%, 3%, 4%, 5%, 6%, 7%, 8%, 9%, 10%, 11%, 12%, 13%, 14%, 15%, 16%, 17%, 18%, 19%, 20%, 21%, 22%, 23%, 24%, 25%, 26%, 27%, 28%, 29%, 30%, 31%, 32%, 33%, 34%, 35%, 36%, 37%, 38%, 39%, 40%, 41%, 42%, 43%, 44%, 45%, 46%, 47%, 48%, 49%, or 50%. In certain embodiments of the above method, the solar cell has a Power Conversion Efficiency of at least 20%. In certain embodiments of the above method, the solar cell has a Power Conversion Efficiency of at least 20%, 21%, 21.5%, 22%, 22.5%, or 23%. In certain embodiments of the above method, the solar cell retains about 98.5% of said Power Conversion Efficiency after continuous illumination for 1000 hours. In certain embodiments of the above method, the solar cell retains about 95%, 96%, 97%, 98.1%, 98.2%, 98.3%, 98.4%, 98.5%, 98.6%, 98.7%, 98.9%, or 99% of said Power Conversion Efficiency after continuous illumination for 1000 hours. In certain embodiments of the above method, the solar cell retains about 93% of said Power Conversion Efficiency after continuous illumination for 2190 hours. In certain embodiments of the solar cell described herein, the solar cell can retain about 85%, 86%, 87%, 88%, 89%, 90%, 91%, 92%, 92.1%, 92.2%, 92.3%, 92.4%, 92.5%, 92.6%, 92.7%, 92.8%, 92.9%, 93%, 93.1%, 93.2%, 93.3%, 93.4%, 93.5%, 93.6%, 93.7%, 93.8%, 93.9%, 94%, 95%, 96%, 97%, 97.1%, 97.2%, 97.3%, 97.4%, 97.5%, 97.6%, 97.8%, 97.9%, 98%, 98.1%, 98.2%, 98.3%, 98.4%, or 98.5% of its Power Conversion Efficiency after continuous illumination for 2180 hours.

III. Devices

The perovskite films described herein are useful in a variety of photoactive and photovoltaic applications. The perovskite films can be integrated into, for example, photoluminescent devices, photoelectrochemical devices, thermoelectric devices, and photocatalytic devices. Some non-limiting examples in which the polycrystalline perovskite films can be applied include solar cells, solar panels, solar modules, light-emitting diodes, lasers, photodetectors, x-ray detectors, batteries, hybrid PV batteries, field effect transistors, memristors, or synapses.

In certain embodiments, the subject matter described herein is directed to a semiconductor device comprising:
  one or more anode layers;
  one or more cathode layers; and
  one or more active layers, wherein at least one of said one or more active layers comprises a polycrystalline perovskite film that is free of one or more surface defect layers.

In certain embodiments of the semiconductor device, the device is selected from the group consisting of solar cell, light emitting diode, photodiode, photoelectrochemical cell, photoresistor, phototransistor, photomultiplier, photoelectric cell, electrochromic cell, and radiation detector.

In certain embodiments, the semiconductor device is a light emitting diode. In certain embodiments of the light emitting diode, the polycrystalline perovskite film that is free of one or more surface defect layers has the composition $CsPbBr_3$.

In certain embodiments, the solar cell is a single junction solar cell. In certain embodiments the solar cell is a tandem solar cell, such as a perovskite-perovskite or perovskite-silicon tandem solar cell.

In certain embodiments, the subject matter described herein is directed to a solar cell, comprising:
  two or more transparent conductive oxide layers;
  one or more hole transport layers;
  one or more electron transport layers; and
  one or more active layers, wherein at least one of said one or more active layers comprises a polycrystalline perovskite film that is free of one or more surface defect layers.

In certain embodiments, the subject matter described herein is directed to a solar cell, comprising:
  one or more transparent conductive oxide layers;
  one or more conductive electrode layers;
  one or more hole transport layers;
  one or more electron transport layers; and
  one or more active layers, wherein at least one of said one or more active layers comprises a polycrystalline perovskite film that is free of one or more surface defect layers.

In certain embodiments of the above solar cell, the solar cell comprises:
  one transparent conductive oxide layer;
  one conductive electrode layer;
  one hole transport layer;
  one electron transport layer; and
  one active layer, wherein said active layer comprises a polycrystalline perovskite film that is free of one or more surface defect layers.

In certain embodiments of the above solar cell, said hole transport layer is disposed directly on said transparent conductive oxide layer;

said active layer comprising said polycrystalline perovskite film is disposed directly on said hole transport layer;

said electron transport layer is disposed directly on said active layer; and said conductive electrode layer is disposed on said electron transport layer.

In certain embodiments of the above solar cell, said electron transport layer is disposed directly on said transparent conductive oxide layer;

said active layer comprising said polycrystalline perovskite film is disposed directly on said electron transport layer;

said hole transport layer is disposed directly on said active layer; and said conductive electrode layer is disposed directly on said hole transport layer.

An element can include more than one sublayer, for example, the electron transport layer (ETL) or hole transport layer (HTL) can include sublayers known in the art and containing different materials, such as a buffer sublayer or coating sublayer, that are described herein as part of the same element. Each element, however, is a distinct section having a discrete function from other elements in the perovskite solar cell or solar module. For example, in certain embodiments, the ETL can comprise PCBM/BCP, PCBM/TiO$_2$, PCBM/LiF, C60/BCP, PCBM/PFN, or PCBM/ZnO. In certain other embodiments, the ETL can comprise a material selected from the group consisting of C60, BCP, TiO$_2$, SnO$_2$, PCBM, ICBA, ICMA, ZnO, ZrAcac, LiF, TPBI, PFN; and, a buffer sublayer disposed on the ETL material selected from the group consisting of PDI, PDINO, PFN. PFN-Br, SnO$_2$, ZnO, ZrAcac, TiO$_2$, BCP, LiF, PPDIN$_6$, and TPBi. In certain embodiments, the HTL can comprise one or more materials selected from the group consisting of PTAA, Poly-TPD, Spiro-OMeTAD, PEDOT:PSS, NiO, MoO3, V2O5, and EH44. In certain other embodiments, the perovskite solar cells or perovskite tandem cells may comprise a coating sublayer, such as an antireflective coating material. Nonlimiting examples of antireflective coating materials include MgF$_2$and LiF.

The transparent conductive oxide layer and the conductive electrode layer comprise the anode and cathode (or vice versa) in the solar cell. In certain embodiments, the cathode and anode each comprise at least one of lithium, sodium, potassium, rubidium, cesium, francium, beryllium, magnesium, calcium, strontium, barium, radium, boron, aluminum, gallium, indium, thallium, tin, lead, flerovium, bismuth, antimony, tellurium, polonium, scandium, titanium, vanadium, chromium, manganese, iron, cobalt, nickel, copper, zinc, yttrium, zirconium, niobium, molybdenum, technetium, ruthenium, rhodium, palladium, silver, cadmium, hafnium, tantalum, tungsten, rhenium, osmium, iridium, platinum, gold, mercury, rutherfordium, dubnium, seaborgium, bohrium, hassium, copernicium, samarium, neodymium, ytterbium, an alkali metal fluoride, an alkaline-earth metal fluoride, an alkali metal chloride, an alkaline-earth metal chloride, an alkali metal oxide, an alkaline-earth metal oxide, a metal carbonate, a metal acetate, carbon nanowire, carbon nanosheet, carbon nanorod, carbon nanotube, graphite, indium tin oxide (ITO), fluorine-doped tin oxide (FTO), aluminum doped zinc oxide (AZO), antimony-tin mixed oxide (ATO), network of metal/alloy nanowire, or a combination of two or more of the above materials. In an embodiment, the positive electrode is a cathode. In an embodiment, the negative electrode is an anode. In an embodiment, the negative electrode is a terminal for connection to an external circuit. In an embodiment, the positive electrode is a terminal for connection to an external circuit.

In certain embodiments, the transparent conductive oxide layer is selected from the group consisting of ITO, FTO, ZITO, and AZO. In certain embodiments, the metal electrode is selected from the group consisting of Al, Au, Cu, Cr, Ca, Mg, Bi, Ag, and Ti.

In certain embodiments, the solar cell or module described herein contains two transparent conductive oxide layers, each independently selected from the group consisting of ITO, FTO, ZITO, and AZO.

The transport layers in the solar cell are each a hole transport layer or an electron transport layer. In certain embodiments, the transport layers are referred to herein as a first or second transport layer.

In certain embodiments, the hole transport layer comprises at least one of poly(3,4-ethylene dioxithiophene) (PEDOT) doped with poly(styrene sulfon icacid) (PSS), Spiro-OMeTAD, pm-spiro-OMeTAD, po-spiro-OMeTAD, dopants in spiro-OMeTAD, 4,4'-biskptrichlorosilylpropylphenyl)phenylaminoThiphenyl (TPD-Si2), poly(3-hexyl-2,5-thienylene vinylene) (P3HTV), C60, carbon, carbon nanotube, graphene quantum dot, graphene oxide, copper phthalocyanine (CuPc), Polythiophene, poly(3,4-(1hydroxymethyl)ethylenedioxythiophene (PHMEDOT), n-dodecylbenzenesulfonic acid/hydrochloric acid doped poly(aniline) nanotubes (a-PANIN)s, poly(styrene sulfonic acid)-graft-poly(aniline) (PSSA-g-PANI), poly(9,9-dioctylfluorene)-co-N-(4-(1-methylpropyl)phenyl) diphenylamine (PFT), 4,4'-bis(p-trichlorosilylpropylphenyl) phenylaminobiphenyl (TSPP), 5,5'-bis(p-trichlorosilylpropylphenyl) phenylamino-2,20 bithiophene (TSPT), N-propyltriethoxysilane, 3,3,3-trifluoropropyltrichlorosilane or 3-aminopropyltriethoxysilane, Poly(bis(4-phenyl)(2,4,6-trimethylphenyl)amine) (PTAA), (Poly[[(2,4-dimethylphenyl)imino]-1,4-phenylene(9,9-dioctyl-9H-fluorene-2,7-diyl)-1,4phenylene], (PF8-TAA)). (Poly [[(2,4-dimethylphenyl)imino]-1,4-phenylene (6,12-dihydro-6,6,12,12tetraoctylindeno[1,2-b]fluorene-2,8-diyl)-1,4-phenylene]) (PIF8-TAA), poly[[4,8-bis[(2-ethylhexyl)oxy]benzo[1,2-b:4,5-b]dithiophene-2,6-diyl][3-fluoro-2-[(2-ethylhexyl)carbonyl]thieno[3,4-b]thiophenediyl]] (PTB7), poly[N-90-heptadecanyl-2,7-carbazole-alt-5,5-(40,70-di-2-thienyl-20,10,30-benzothiadiazole)] (PCDTBT). Poly[2,5-bis(2-decyldodecyl)pyrrolo[3,4-c]pyrrole-1,4(2H,5H)-dione-(E)-1,2-di(2,20-bithiophen-5-yl) ethene] (PDPPDBTE), 4,8-dithien-2-yl-benzo[1,2-d; 4,5-d']bistriazole-alt-benzo[1,2-b:4,5b']dithiophenes (pBBTa-BDTs), pBBTa-BDT1, pBBTa-BDT2 polymers, poly(3-hexylthiophene) (P3HT), poly(4,4'-bis(N-carbazolyl)-1,1'-biphenyl) (PPN), triarylamine (TAA) and/or thiophene moieties. Paracyclophane. Triptycene, and Bimesitylene. Thiophene and Furan-based hole transport materials, Dendrimer-like and star-type hole transport materials, VO, VOX, MoC, WO, ReO, NiOx, AgOx, CuO, Cu2O, V2O5, CuI, CuS, CuInS2, colloidal quantum dots, lead sulphide (PbS), CuSCN, Cu2ZnSnS4. Au nanoparticles and their derivatives. Thiophene derivatives, Triptycene derivatives, Triazine derivatives, Porphyrin derivatives, Triphenylamine derivatives, Tetrathiafilvalene derivatives, Carbazole derivatives and Phthalocyanine derivatives. As used herein, when a material is referred to a "derivate" or as "derivatives," such as Triphenylamine derivatives, the material contains Triphenylamine in its backbone structure. In certain embodiments, the hole transport layer is selected from the group consisting of PTAA, Spiro-OMeTAD, PEDOT:PSS, NiO, MoO$_3$, V$_2$O$_5$, Poly-TPD, EH44, P3HT, and a combination thereof.

In certain embodiments, the electron transport layer comprises at least one of LiF, CsP, LiCoO, CsCO, TiO$_x$, TiO, nanorods (NRs), ZnO, ZnO nanorods (NRs), ZnO nanoparticles (NPs), ZnO, A-O, CaO, bathocuproine (BCP), copper phthalocyanine (CuPc), pentacene, pyronin B, pentadecafluorooctyl phenyl-C60-butyrate (F-PCBM), C60, C60/LiF, ZnO NRS/PCBM, ZnO/cross-linked fullerene derivative (C-PCBSD), single walled carbon nanotubes (SWCNT), poly(ethylene glycol) (PEG), poly(dimethylsiloxane-block-methyl methacrylate) (PDMS-b-PMMA), polar polyfluorene (PF-EP), polyfluorene bearing lateral amino groups (PFN), polyfluorene bearing quatenary ammonium groups in the side chains (WPF-oxy-F), polyfluorene bearing quaternary ammonium groups in the side chains (WPF-6-oxy-F), fluorene alternating and random copolymer bearing cationic groups in the alkyl side chains (PFNBr DBT15), fluorene alternating and random copolymer bearing cationic groups in the alkyl side chains (PFPNBr), poly(ethylene oxide) (PEO), and fullerene derivatives. In certain embodiments, the electron transport layer is selected from the group consisting of C60, BCP, TiO$_2$, SnO$_2$, PCBM, ICBA, ZnO, ZrAcac, LiF, TPBI, PFN, Nb$_2$O$_5$, and a combination thereof.

In certain embodiments of the above solar cells,
said transparent conductive oxide layer is ITO;
said hole transport layer is PTAA;
said electron transport layer is C$_{60}$ or PCBM; and
said conductive electrode layer is Cu.

In any of the embodiments above, the solar cell can further comprise a buffer layer. In certain embodiments, the buffer layer is disposed between the electron transport layer and said conductive electrode layer In certain embodiments, the buffer layer is selected from the group consisting of PDI, PDINO, PFN, PFN-Br, SnO$_2$, ZnO, ZrAcac, TiO$_2$, BCP, LiF, PPDIN6, and TPBi. In certain embodiments, the buffer layer is BCP.

In certain embodiments of the above solar cells, the solar cell further comprises a glass layer, wherein the transparent conductive oxide layer is disposed directly on the glass layer. In certain embodiments, the glass is used to encapsulate the solar cell. The glass layer comprises silica (SiO$_2$). In certain aspects, the solar cells comprise a first glass layer and a second glass layer, wherein the transparent conductive oxide layer is disposed on said first glass layer and said second glass layer is disposed on said conductive electrode. In certain embodiments, the glass layer has a thickness of about 1.1 mm. In certain embodiment, the glass layer has a thickness of about 0.5, 0.6, 0.7, 0.8, 0.9, 1.0, 1.1, 1.2, 1.3, 1.4, or 1.5 mm. In certain embodiments, the glass encapsulates the solar cell or solar module by coating the edges of the glass with epoxy and contacting them with the cell or module.

In certain embodiments, the subject matter described herein is directed to a solar module, comprising a plurality of any one of the solar cells described above.

In certain embodiments, the back of the solar cell or solar module is encapsulated with a polymer. The polymer can be any polymer sheet sealed by encapsulant, or ethylene-vinyl acetate copolymer (EVA), polypropylene, polyolefin (POE), ethylene-propylene-diene monomer (EPDM), or cross-linkable encapsulants that can be laminated to the back of solar the cell or solar module. In certain embodiments, the polymer that encapsulates the back of the solar cell or the solar module is a polymer sheet or board. In one embodiment, the polymer is polypropylene. In certain embodiments, the back of the solar cell or solar module is encapsulated with a polypropylene board. In certain embodiment, the polypropylene board has a thickness of about 0.5, 0.6, 0.7, 0.8, 0.9, 1.0, 1.1, 1.2, 1.3, 1.4, or 1.5 mm. In certain embodiments, the polypropylene board encapsulates the solar cell or solar module by coating the edges of the board with epoxy and contacting them with the cell or module.

In certain embodiments the conductive electrode layer has a thickness of about 1 nm to about 1000 µm, about 100 nm to about 500 nm, about 1 µm to about 500 µm, about 250 µm to about 1000 µm, or about 250 nm to about 250 µm. In certain embodiments, the conductive electrode has a thickness of about 10 nm, 50 nm, 100 nm, 150 nm, 200 nm, 300 nm, 400 nm, 500 nm, 550 nm, 1 µm, 10 µm, 20 µm, 30 µm, 40 µm, 50 µm, 60 µm, 70 µm, 80 µm, 100 µm, 150 µm, 200 µm, 250 µm, 300 µm, 350 µm, 400 µm, 450 µm, 500 µm, 550 µm, 600 µm, 700 µm, 800 µm, 900 µm, or 100 µm.

In certain embodiments, the transparent conductive oxide layer has a thickness of about 1 nm to about 1000 µm, about 100 nm to about 500 nm, about 1 µm to about 500 µm, about 250 µm to about 1000 µm, or about 250 nm to about 250 µm. In certain embodiments, the transparent conductive layer has a thickness of about 10 nm, 50 nm, 100 nm, 150 nm, 200 nm, 300 nm, 400 nm, 500 nm, 550 nm, 1 µm, 10 µm, 20 µm, 30 µm, 40 µm, 50 µm, 60 µm, 70 µm, 80 µm, 100 µm, 150 µm, 200 µm, 250 µm, 300 µm, 350 µm, 400 µm, 450 µm, 500 µm, 550 µm, 600 µm, 700 µm, 800 µm, 900 µm, or 100 µm.

In certain embodiments, the hole transport layer and electron transport layer each individually has a thickness of about 0.1 nm to about 10 µm, about 0.5 nm to about 100 nm, about 10 nm to about 500 nm, about 300 nm to about 700 nm, about 100 nm to about 1 µm, about 1 µm to about 10 µm, or about 800 nm to about 5 µm. In certain embodiments, the hole transport layer and electron transport layer each individually has a thickness of about 0.1 nm, 0.5 nm, 1.0 nm, 2.0 nm, 5.0 nm, 10 nm, 20 nm, 30 nm, 40 nm, 50 nm, 60 nm, 70 nm, 80 m, 90 un, 100 nm, 150 nm, 200 um, 250 nm, 300 nm, 350 nm, 400 nm, 450 nm, 500 nm, 550 nm, 600 nm, 650 nm, 700 nm, 750 am, 800 un, 850 nm, 900 nm, 950 am, 1000 nm, 1 µm, 2 µm, 3 µm, 4 µm, 5 µm, 6 µm, 7 µm, 8 µm, 9 µm, or 10 µm.

The Power Conversion Efficiency (PCE) of the solar cells as described herein ranges from about 15% to about 25%. In certain embodiments, the PCE is at least 17% 18%, 19%, 20%, 21%, 22%, 23%, or 24%.

In certain embodiments of the solar cell described herein, the solar cell can retain about 97.1% of its Power Conversion Efficiency after continuous illumination for 1440 hours. In certain embodiments of the solar cell described herein, the solar cell can retain about 90%, 95%, 96%, 97%, 97.1%, 97.2%, 97.3%, 97.4%, 97.5%, 97.6%, 97.8%, 97.9%, 98%, 98.1%, 98.2%, 98.3%, 98.4%, or 98.5% of its Power Conversion Efficiency after continuous illumination for 1440 hours.

The subject matter described herein is directed to the following embodiments:

1. A polycrystalline perovskite film comprising a perovskite composition of formula ABX$_3$ or A$_2$BX$_4$,
wherein,
A is selected from the group consisting of methylammonium (MA), tetramethylammonium, formamidinium (FA), cesium, rubidium, potassium, sodium, butylammonium, phenethylammonium, phenylammonium, guanidinium, ammonium, and a combination thereof;
B is a metal cation selected from the group consisting of lead, tin, calcium, cadmium, germanium, zinc, nickel, platinum, palladium, mercury, titanium, silicon, and a combination thereof; and X is selected from the group consisting of Cl$^-$, Br$^-$, F$^-$, I$^-$, SCN$^-$, and a combination thereof:
   wherein said polycrystalline perovskite film is free of one or more surface defect layers.

1a. A polycrystalline perovskite film comprising a perovskite composition of formula ABX$_3$ or A$_2$BX$_4$,
   wherein,
   A is selected from the group consisting of methylammonium (MA), tetramethylammonium, formamidinium (FA), cesium, rubidium, potassium, sodium, butylammonium, phenethylammonium, phenylammonium, guanidinium, ammonium, and a combination thereof;
   B is a metal cation selected from the group consisting of lead, tin, calcium, cadmium, germanium, zinc, nickel, platinum, palladium, mercury, titanium, silicon, and a combination thereof; and
   X is selected from the group consisting of Cl—, Br—, F—, I—, SCN—, and a combination thereof;
   wherein said polycrystalline perovskite film is free of one or more surface defect layers, and wherein said film is smooth, having a root mean square roughness of about 8 nm to about 10 nm.

2. A polycrystalline perovskite film comprising a perovskite composition of formula ABX$_3$ or A$_2$BX$_4$,
   wherein,
   A is selected from the group consisting of methylammonium (MA), tetramethylammonium, formamidinium (FA), cesium, rubidium, potassium, sodium, butylammonium, phenethylammonium, phenylammonium, guanidinium, ammonium, and a combination thereof;
   B is a metal cation selected from the group consisting of lead, tin, calcium, cadmium, germanium, zinc, nickel, platinum, palladium, mercury, titanium, silicon, and a combination thereof; and
   X is selected from the group consisting of Cl$^-$, Br$^-$, F$^-$, I$^-$, SCN$^-$, and a combination thereof;
   wherein said polycrystalline perovskite film is free of one or more surface defect layers, and wherein said film further comprises a residue of adhesive on one or more surfaces of said film.

3. The polycrystalline perovskite film of embodiment 1 or 2, wherein said perovskite composition is of formula ABX$_3$.

4. The polycrystalline perovskite film of any one of embodiments 1-3, wherein said perovskite composition is selected from the group consisting of FAPbBr$_3$, FAPbI$_3$, FAPbCl$_3$, MAPbBr$_3$, MAPbI$_3$, MAPbCl$_3$, CsPbBr$_3$, CsPbI$_3$m and CsPbCl$_3$.

5. The polycrystalline perovskite film of any one of embodiments 1, 2, or 3, wherein A is selected from the group consisting of Cs, FA, MA, Rb, and a combination thereof; B is selected from the group consisting of lead, tin, and a combination thereof; and X is selected from the group consisting of I$^-$, Br$^-$, and a combination thereof.

6. The polycrystalline perovskite film of embodiment 5, wherein said perovskite composition of formula ABX$_3$ is selected from the group consisting of Cs$_y$FA$_{1-x-y}$MA$_x$PbI$_{3-z}$Br$_z$ (y≤x, x+y<1, z≤3), Rb$_x$Cs$_y$FA$_{1-x-y-f}$MA$_f$PbI$_{3-z}$Br$_z$ (y≤x≤f, x+y+f<1, z≤3), Cs$_x$FA$_{1-x}$Pb$_{1-z}$Sn$_z$I$_3$ (x<1, z≤1), and Cs$_x$FA$_{1-x}$PbI$_{3-z}$Br$_z$ (z<1, z≤3).

7. The polycrystalline perovskite film of embodiment 6, wherein said perovskite composition of formula ABX$_3$ is selected from the group consisting of Cs$_{0.4}$FA$_{0.6}$Pb(I$_{0.64}$Br$_{0.36}$)$_3$, Cs$_{0.05}$FA$_{0.81}$MA$_{0.14}$PbI$_{2.55}$Br$_{0.45}$, Rb$_{0.05}$Cs$_{0.05}$FA$_{0.85}$MA$_{0.05}$PbI$_{2.85}$Br$_{0.15}$, and Cs$_{0.20}$FA$_{0.80}$Pb$_{0.50}$Sn$_{0.50}$I$_3$.

8. The polycrystalline perovskite film of any one of embodiments 1-7, wherein said film has a thickness of about 1 nm to about 10 μm.

9. The polycrystalline perovskite film of any one of embodiments 1-8, wherein said film has a thickness of about 100 nm to 2000 nm.

10. The polycrystalline perovskite film of any one of embodiments 1 or 2-7, wherein said film is smooth, having a root mean square roughness of about 8 nm to about 10 nm.

11. The polycrystalline perovskite film of any one of embodiments 2-7, further comprising a residue of adhesive on one or more surfaces of said film.

12. The polycrystalline perovskite film of embodiment 1 or 11, wherein said residue has a thickness of about 1 nm to about 1000 nm.

13. A semiconductor device comprising:
   one or more anode layers;
   one or more cathode layers; and
   one or more active layers, wherein at least one of said one or more active layers comprises the polycrystalline perovskite film of embodiment 1 or 2.

14. The semiconductor device of embodiment 13, wherein said device is selected from the group consisting of solar cell, light emitting diode, photodiode, photoelectrochemical cell, photoresistor, phototransistor, photomultiplier, photoelectric cell, electrochromic cell, and radiation detector.

15. The semiconductor device of embodiment 14, wherein said solar cell is a single junction solar cell.

16. The semiconductor device of embodiment 14, wherein said solar cell is a tandem solar cell.

17. A solar cell, comprising:
   one or more transparent conductive oxide layers;
   one or more conductive electrode layers;
   one or more hole transport layers;
   one or more electron transport layers; and
   one or more active layers, wherein at least one of said one or more active layers comprises the polycrystalline perovskite film of embodiment 1 or 2.

17a. A solar cell, comprising:
   two or more transparent conductive oxide layers;
   one or more hole transport layers;
   one or more electron transport layers; and
   one or more active layers, wherein at least one of said one or more active layers comprises the polycrystalline perovskite film of claim 1 or 2.

18. The solar cell of embodiment 17, wherein said solar cell comprises:
   one transparent conductive oxide layer;
   one conductive electrode layer;
   one hole transport layer;
   one electron transport layer; and
   one active layer, wherein said active layer comprises the polycrystalline perovskite film of embodiment 1 or 2.

19. The solar cell of c embodiment 18, wherein:
   said hole transport layer is disposed directly on said transparent conductive oxide layer;
   said active layer comprising said polycrystalline perovskite film is disposed directly on said hole transport layer;
   said electron transport layer is disposed directly on said active layer; and
   said conductive electrode layer is disposed on said electron transport layer.

20. The solar cell of embodiment 18, wherein:
   said electron transport layer is disposed directly on said transparent conductive oxide layer;

said active layer comprising said polycrystalline perovskite film is disposed directly on said electron transport layer;

said hole transport layer is disposed directly on said active layer; and said conductive electrode layer is disposed directly on said hole transport layer.

21. The solar cell of any one of embodiments 17-20, wherein said one or more hole transport layers are selected from the group consisting of PTAA, Spiro-OMeTAD, PEDOT:PSS, NiO, MoO$_3$, V$_2$O$_5$, Poly-TPD, EH44, P3HT, and a combination thereof.

22. The solar cell of any one of embodiments 17-20, wherein said one or more electron transport layers are selected from the group consisting of C60, BCP, TiO$_2$, SnO$_2$, PCBM, ICBA, ZnO, ZrAcac. LiF, TPBI, PFN, Nb$_2$O$_5$, and a combination thereof.

23. The solar cell of any one of embodiments 17-20, wherein said one or more transparent conductive oxide layers are selected from the group consisting of ITO, FTO, ZITO, and AZO.

24. The solar cell of any one of embodiments 17-20, wherein said one or more conductive electrode layers are selected from the group consisting of Al, Au, Cu, Cr, Ca, Mg, Ag, and Ti.

25. The solar cell of embodiment 18, wherein:
said transparent conductive oxide layer is ITO;
said hole transport layer is PTAA;
said electron transport layer is C$_{60}$ or PCBM; and
said conductive electrode layer is Cu.

26. The solar cell of embodiment 25, further comprising a buffer layer of BCP disposed between said electron transport layer and said conductive electrode layer.

27. The solar cell of any one of embodiments 17-26, having a Power Conversion Efficiency of about 22%.

27a. The solar cell of any one of embodiments 17-26, having a Power Conversion Efficiency of at least 22%.

28. The solar cell of any one of embodiments 17-27, wherein said solar cell retains about 97.1% of said Power Conversion Efficiency after continuous illumination for 1440 hours.

29. A surface treatment method for removing one or more surface defect layers from a polycrystalline perovskite film, comprising:
a) contacting an adhesive with one or more surfaces of a polycrystalline perovskite film; and
b) removing a portion of said adhesive from said polycrystalline perovskite film surfaces,
wherein a and b are carried out one or more times to remove said one or more surface defect layers.

30. The surface treatment method of embodiment 29, wherein said method is a roll-to-roll process.

31. The surface treatment method of embodiment 29, wherein said method is scalable.

32. The surface treatment method of embodiment 29, wherein said perovskite film has a thickness of about 1 nm to about 10 μm.

33. The surface treatment method of embodiment 29, wherein said adhesive is in physical communication with a backing material.

34. The surface treatment method of embodiment 29, wherein said method produces a polycrystalline perovskite film having a residue of adhesive on said one or more surfaces of said film.

35. The surface treatment method of embodiment 34, wherein said residue of adhesive has a thickness of about 1 nm to about 1000 nm.

36. The surface treatment method of embodiment 29 or 35, wherein said adhesive is selected from the group consisting of resin, rubber, polyterpene, polyisoprene, polyvinyl alcohol (PVA), polyacrylic acid (PAA), cyanoacrylate, polyethylene (PE), polypropylene (PP), polystyrene (PS), nylon, polyurethane (PU), polycarbonate (PC), polyoxymethylene (POM), and a mixture thereof.

37. The surface treatment method of embodiment 33, wherein said backing material is selected from the group consisting of tape, roller, mold, and a combination thereof.

38. The surface treatment method of embodiment 29, wherein said adhesive is contacted with surfaces of said polycrystalline perovskite film with an applied pressure of about 1 Pa to about 100 MPa.

39. The surface treatment method of any one of embodiments 29-38, wherein said polycrystalline perovskite film has a composition of formula ABX$_3$ or A$_2$BX$_4$,
wherein.
A is selected from the group consisting of methylammonium (MA), tetramethylammonium, formamidinium (FA), cesium, rubidium, potassium, sodium, butylammonium, phenethylammonium, phenylammonium, guanidinium, ammonium, and a combination thereof;
B is a metal cation selected from the group consisting of lead, tin, calcium, cadmium, germanium, zinc, nickel, platinum, palladium, mercury, titanium, silicon, and a combination thereof; and
X is selected from the group consisting of Cl$^-$, Br$^-$, F$^-$, I$^-$, SCN$^-$, and a combination thereof.

40. The surface treatment method of embodiment 39, wherein said composition is of formula ABX$_3$.

41. The surface treatment method of embodiment 40, wherein said composition is selected from the group consisting of FAPbBr$_3$, FAPbI3, FAPbCl$_3$, MAPbBr3, MAPbI$_3$, MAPbCl$_3$, CsPbBr$_3$, CsPbI$_3$, and CsPbCI$_3$.

42. The surface treatment method of embodiment 40, wherein A is selected from the group consisting of Cs, FA, MA, Rb, and a combination thereof; B is selected from the group consisting of lead, tin, and a combination thereof; and X is selected from the group consisting of I$^-$, Br$^-$, and a combination thereof.

43. The surface treatment method of embodiment 42, wherein said composition of formula ABX$_3$ is selected from the group consisting of Cs$_y$FA$_{1-x-y}$MA$_x$PbI$_{3-z}$Br$_z$ (y≤x, x+y<1, z≤3), Rb$_x$Cs$_y$FA$_{1-x-y-f}$MA$_f$PbI$_{3-z}$Br$_z$ (y≤x≤f, x+y+f<1, z≤3), Cs$_x$FA$_{1-x}$Pb$_{1-z}$Sn$_z$I$_3$ (x<1, z≤1), and Cs$_x$FA$_{1-x}$PbI$_{3-z}$Br$_z$ (z<1, z≤3).

44. The surface treatment method of embodiment 43, wherein said composition of formula ABX$_3$ is selected from the group consisting of Cs$_{0.4}$FA$_{0.6}$Pb(I$_{0.64}$Br$_{0.36}$)$_3$, Cs$_{0.05}$FA$_{0.81}$MA$_{0.14}$PbI$_{2.55}$Br$_{0.45}$, Rb$_{0.05}$Cs$_{0.05}$FA$_{0.85}$MA$_{0.05}$PbI$_{2.85}$Br$_{0.15}$, and Cs$_{0.20}$FA$_{0.80}$Pb$_{0.50}$Sn$_{0.50}$I$_3$.

45. The surface treatment method of any one of embodiments 29-44, wherein said method improves the stability of said perovskite film.

46. The surface treatment method of any one of embodiments 2944, wherein said method produces a polycrystalline perovskite film with improved stability for use as an active material in a semiconductor device.

47. The surface treatment method of embodiment 46, wherein said semiconductor device is selected from the group consisting of solar cell, light emitting diode, photodiode, photoelectrochemical cell, photoresistor, phototransistor, photomultiplier, photoelectric cell, electrochromic cell, and radiation detector.

48. The surface treatment method of embodiment 47, wherein said solar cell is a single junction solar cell.

49. The surface treatment method of embodiment 47, wherein said solar cell is a tandem solar cell.

50. The surface treatment method of embodiment 47, wherein said device is a solar cell, and said method improves the power conversion efficiency of said solar cell.

51. The surface treatment method of embodiment 50, wherein said solar cell has a Power Conversion Efficiency of at least 22%.

52. The surface treatment method of embodiment 50 or 51, wherein said solar cell retains about 98.5% of said Power Conversion Efficiency after continuous illumination for 1000 hours.

53. The surface treatment method of any one of embodiments 50-52, wherein said solar cell retains about 97.1% of said Power Conversion Efficiency after continuous illumination for 1440 hours.

54. A method of preparing a solar cell, comprising:
disposing an active layer comprising a polycrystalline perovskite film on a transparent conductive oxide layer; and
disposing a conductive electrode layer on said active layer; wherein said method further comprises the surface treatment method of any one of embodiments 29-44.

55. The method of embodiment 54, further comprising disposing a first transport layer and a second transport layer in said solar cell, wherein:
said first transport layer is disposed directly on said transparent conductive oxide layer;
said active layer is disposed directly on said first transport layer;
said second transport layer is disposed directly on said active layer; and
said conductive electrode layer is disposed directly on said second transport layer.

56. A surface treatment method for removing one or more surface defect layers from a polycrystalline perovskite film, comprising:
a) contacting an abrasive or soft polishing pad with one or more surfaces of a polycrystalline perovskite film; and
b) removing loose material from said polycrystalline perovskite film surfaces;
wherein a and b are carried out one or more times to remove said one or more surface defect layers.

57. The surface treatment method of embodiment 56, wherein said abrasive comprises particles of $SiO_2$ or $Al_2O_3$.

58. The surface treatment method of embodiment 57, wherein said particles are from about 1 μm to about 30 μm in diameter.

59. The surface treatment method of any one of embodiments 56-58, wherein said method comprises:
first contacting said abrasive with one or more surfaces of said polycrystalline perovskite film, and then contacting said soft polishing pad with said one or more surfaces of said polycrystalline perovskite film.

60. The surface treatment method of any one of embodiments 56-59, wherein said soft polishing pad has a thickness of about 100 μm to about 5 mm.

61. The surface treatment method of any one of embodiments 56-60, wherein said soft polishing pad has a porous surface.

62. The surface treatment method of any one of embodiments 56-61, wherein said porous surface comprises a material selected from the group consisting of polyurethane (PU), polycarbonate (PC), polyester, cotton, silk, rubber, cellulose, nylon, and a mixture thereof.

63. The surface treatment method of embodiment 61, wherein said porous surface has a Shore O type hardness of about 30 to about 80.

64. The surface treatment method of any one of embodiments 56-63, wherein said soft polishing pad is flexible.

65. The surface treatment method of embodiment 56, wherein said removing loose material from said polycrystalline perovskite surfaces comprises applying a solvent to surfaces of said polycrystalline perovskite film.

66. The surface treatment method of embodiment 65, wherein said solvent is selected from the group consisting of toluene (TL), ethyl acetate (EA), diethyl ether (DE), dichloromethane (DCM), hexane, and a mixture thereof.

67. The surface treatment method of any one of embodiments 56-66, wherein said perovskite film is rotating relative to said abrasive or soft polishing pad.

68. The surface treatment method of any one of embodiments 56-67, wherein said contacting comprises contacting said abrasive or soft polishing pad with surfaces of said perovskite film with a pressure about 1 Pa to about 100 MPa.

69. The surface treatment method of any one of embodiments 56-68, wherein said contacting comprises contacting said abrasive or soft polishing pad with surfaces of said perovskite film with a pressure of about 0.5 MPa to about 2 MPa.

70. The surface treatment method of any one of embodiments 56-69, wherein said one or more surface layers comprise a depth of about 10 nm to about 1000 μm.

71. The surface treatment method of any one of embodiments 56-70, wherein said method is scalable.

72. The surface treatment method of embodiment 56, wherein said polycrystalline perovskite film has a composition of formula $ABX_3$ or $A_2BX_4$,
wherein,
A is selected from the group consisting of methylammonium (MA), tetramethylammonium, formamidinium (FA), cesium, rubidium, potassium, sodium, butylammonium, phenethylammonium, phenylammonium, guanidinium, ammonium, and a combination thereof;
B is a metal cation selected from the group consisting of lead, tin, calcium, cadmium, germanium, zinc, nickel, platinum, palladium, mercury, titanium, silicon, and a combination thereof; and
X is selected from the group consisting of $Cl^-$, $Br^-$, $F^-$, $I^-$, $SCN^-$, and a combination thereof.

73. The surface treatment method of embodiment 72, wherein said composition is of formula $ABX_3$.

74. The surface treatment method of embodiment 72 or 73, wherein said composition is selected from the group consisting of $FAPbBr_3$, $FAPbI_3$, $FAPbCl_3$, $MAPbBr_3$, $MAPbI_3$, $MAPbCl_3$, $CsPbBr_3$, $CsPbI_3$, and $CsPbCl_3$.

75. The surface treatment method of any one of embodiments 72-74, wherein A is selected from the group consisting of Cs, FA, MA, Rb, and a combination thereof; B is selected from the group consisting of lead, tin, and a combination thereof; and X is selected from the group consisting of $I^-$, $Br^-$, and a combination thereof.

76. The surface treatment method of embodiment 75, wherein said composition of formula $ABX_3$ is selected from the group consisting of $Cs_yFA_{1-x-y}MA_xPbI_{3-z}Br_z$ (y≤x, x+y<1, z≤3), $Rb_xCs_yFA_{1-x-y-f}MA_fPbI_{3-z}Br_z$ (y≤x≤f, x+y+f<1, z≤3), $Cs_xFA_{1-x}Pb_{1-z}Sn_zI_3$ (x<1, z≤1), and $Cs_xFA_{1-x}PbI_{3-z}Br_z$ (z<1, z≤3).

77. The surface treatment method of embodiment 76, wherein said composition of formula $ABX_3$ is selected from the group consisting of $Cs_{0.4}FA_{0.6}Pb(I_{0.64}Br_{0.36})_3$, $Cs_{0.05}FA_{0.81}MA_{0.14}PbI_{2.55}Br_{0.45}$, $Rb_{0.05}Cs_{0.05}FA_{0.85}MA_{0.05}PbI_{2.85}Br_{0.15}$, and $Cs_{0.20}FA_{0.80}Pb_{0.50}Sn_{0.50}I_3$.

78. The surface treatment method of embodiment 56, wherein said method improves the stability of said perovskite film.

79. The surface treatment method of embodiment 56, wherein said method produces a polycrystalline perovskite film with improved stability for use as an active material in a semiconductor device.

80. The surface treatment method of embodiment 79, wherein said device is selected from the group consisting of solar cell, light emitting diode, photodiode, photoelectrochemical cell, photoresistor, phototransistor, photomultiplier, photoelectric cell, electrochromic cell, and radiation detector.

81. The surface treatment method of embodiment 80, wherein said solar cell is a single junction solar cell.

82. The surface treatment method of embodiment 80, wherein said solar cell is a tandem solar cell.

83. The surface treatment method of embodiment 80, wherein said device is a solar cell, and said method improves the power conversion efficiency of said solar cell.

84. The surface treatment method of embodiment 83, wherein said solar cell has a Power Conversion Efficiency of at least 20%.

85. The surface treatment method of embodiment 83 or 84, wherein said solar cell retains about 98.5% of said Power Conversion Efficiency after continuous illumination for 1000 hours.

86. The surface treatment method of any one of embodiments 83-85, wherein said solar cell retains about 93% of said Power Conversion Efficiency after continuous illumination for 2180 hours.

The following examples are offered by way of illustration and not by way of limitation.

EXAMPLES

Methods and Materials—Taping Methods
Materials

Poly(bis(4-phenyl)(2,4,6-trimethylphenyl)amine) (PTAA, average GPC $M_n$ 7,000-10,000). Bathocuproine (BCP), lead iodide ($PbI_2$, 99.999% trace metals), lead bromide ($PbBr_2$, 99.999% trace metals basis), Cesium iodide (CsI), rubidium iodide (RbI), N,N-Dimethylformamide (DMF), 2-Methoxyethanol (2-ME), Dimethyl Sulfoxide (DMSO), L-α-Phosphatidylcholine (LP), 3-(Decyldimethylammonio)-propane-sulfonate inner salt (DPSI), isopropanol (IPA), toluene, and chlorobenzene were purchased from Sigma-Aldrich and used without further purification. Methylammonium iodide (MAI), methylammonium bromide (MABr) and formamidinium iodide (FAI) were purchased from GreatCell Solar. Methylammonium chloride (MACl) was purchased from Xi'an Polymer Light Technology Corp.

Device Fabrication

Patterned ITO glass substrates (1.5 cm×1.5 cm) were first cleaned by ultrasonication with soap, deionized water, and IPA. The hole transport layer PTAA with a concentration of 2 mg mL$^{-1}$ dissolved in toluene was spin-coated onto ITO glass substrates at the speed of 5,000 rpm for 30 s and then annealed at 100° C. for 10 min. The perovskite precursor solutions with different compositions were prepared and then deposited onto the PTAA-covered substrates according to the processing conditions detailed in Table 1A. While the bladed films were prepared in ambient condition (298 K and RH ~60%), the other films were spin-coated in a $N_2$-filled glovebox. The surface treatment with adhesive tape was performed by pressing the tape (3M temflex 1700 tape) onto the surface of perovskite films under a pressure of ~1 MPa. and then slowly separating the tape from the surface. This step can be repeated two or three times to further improve the uniformity of the tape treatment. In other embodiments, surface treatment is carried out by using a roller coated with rubber-resin adhesive. The devices were completed by thermally evaporating $C_{60}$ (30 nm, 0.2 Å s$^{-1}$). BCP (6 nm, 0.1 Å s$^{-1}$) and copper (90 nm, 1 Å s$^{-1}$) in a sequential order. The device active area is 8 mm$^2$.

TABLE 1A

Processing conditions of the perovskite solar cells.

| Composition | Precursor solution | Deposition details |
| --- | --- | --- |
| $MAPbI_3$ (one step) | 1.35M $PbI_2$ and 1.35M MAI in DMF:DMSO = 4:1. | Spin cost at 2,000 rpm for 5 s and 4,000 rpm for 20 s, 130 μL toluene drips at 7$^{th}$ second. Thermal annealing at 65° C. for 10 min and then 100° C. for 10 min. |
| $MAPbI_3$ (two step) | 630 mg mL$^{-1}$ $PbI_2$ in DMF and 63 mg mL$^{-1}$ MAI in IPA. | Hot $PbI_2$ solution was spin-coated at 6,000 rpm followed by thermal annealing at 90° C. The MAI was spin-coated onto $PbI_2$ at 2,000 rpm then thermally annealed at 100° C. for 15 min. |
| $MAPbI_3$ (blade-coated) | 1.5M MAI and 1.5M $PbI_2$ in 2-ME. 0.3 mg mL$^{-1}$ LP, 1.5 mg mL$^{-1}$ MACl, 0.20% v/v DMSO and 0.15% v/v $MAH_2PO_2$ as additives. | The precursor solution was swiped linearly to the gap (250 μm) between blade-coated and substrate, and blade-coated at a rate of 20 mm s$^{-1}$ and quenched by a $N_2$ knife. Thermal annealing at 100° C. for 10 min. |
| $Rb_{0.05}Cs_{0.05}FA_{0.85}MA_{0.05}PbI_{2.85}Br_{0.15}$ (one step) | 1.5M in DMF:DMSO = 4:1, 1 mg mL$^{-1}$ DPSI as additive. | Spin coat at 2,000 rpm for 2 s and 4,000 rpm for 20 s, 130 μL chlorobenzene drips at 17$^{th}$ second. Thermal annealing at 115° C. for 10 min. |

TABLE 1A-continued

Processing conditions of the perovskite solar cells.

| Composition | Precursor solution | Deposition details |
| --- | --- | --- |
| $Cs_{0.05}FA_{0.81}MA_{0.14}PbI_{2.55}Br_{0.45}$ (one step) | 1.4M in DMF:DMSO = 4:1, 0.5 mg mL$^{-1}$ DPSI as additive. | Spin coat at 2,000 rpm for 2 s and 4,000 rpm for 20 s, 130 μL chlorobenzene dripping at 17$^{th}$ second. Thermal annealing at 65° C. for 10 min and then 100° C. for 10 min. |
| $Cs_{0.40}FA_{0.60}PbI_{1.94}Br_{1.06}$ (one step) | 1.35M in DMF:DMSO = 4:1, 4 wt % MAPbCl$_3$ as additive. | Spin coat at 6,000 rpm for 40 s, N$_2$ gas blowing at 20$^{th}$ second. Thermal annealing at 100° C. for 1 hour. |
| $Cs_{0.20}FA_{0.80}Pb_{0.50}Sn_{0.50}I_3$ (one step) | 2.0M in DMF:DMSO = 82:18, 2.5 mg mL$^{-1}$ PEACl as additive. | Spin coat at 4,000 rpm for 40 s, 300 μl toluene drips at 20$^{th}$ second. Thermal annealing at 100° C. for 7 min. |

Device Characterization

The J-V characteristics of solar cells were performed using a Xenon-lamp-based solar simulator (Oriel Sol3A, Class AAA Solar Simulator) and the power of the simulated light was calibrated to 100 mW cm$^{-2}$ by a silicon (Si) diode (Hamamatsu S1133) equipped with a Schott visible-color glass filter (KGS color-filter). All cells were measured using a Keithley 2400 source meter with a scan rate of 0.1 V s$^{-1}$. The steady-state PCE was measured by monitoring current with the largest power output bias voltage and recording the value of the photocurrent. The tDOS of solar cells were derived from the frequency-dependent capacitance (C-f) and voltage-dependent capacitance (C-V), which were obtained from the thermal admittance spectroscopy (TAS) measurement performed by an LCR meter (Agilent E4980A). The transient photovoltage was measured under 1 sun illumination. An attenuated UV laser pulse (SRS NL 100 Nitrogen Laser) was used as a small perturbation to the background illumination on the device. The laser-pulse-induced photovoltage variation on $V_{oc}$ is recorded by an Agilent Digital Storage Oscilloscope 3104A. The wavelength of the N$_2$ laser was 337 nm with a repeating frequency of about 10 Hz, and the pulse width was less than 4 ns.

Device Encapsulation

A thin layer of CYTOP was firstly blade-coated onto the back surface of the device, followed by thermal annealing at 70° C. for 20 min on a hot plate. Then, a cover glass was attached onto the back surface for further protection by epoxy resin.

Device Operational Stability Test

Long-term stability measurements of encapsulated perovskite devices were operated under a plasma lamp with light intensity equivalent to AM 1.5G, without any ultraviolet filter in air (relative humidity ~60±10%). The temperature of the devices under illumination was measured to be ~65° C. All devices were loaded with a resistor so that they worked at maximum power point (MPP) at the beginning of the test. The J-V curves were recorded with a reverse scan rate of 0.1 V s$^{-1}$.

Structure Characterization

Grazing XRD measurements were carried out with a Rigaku SmartLab diffractometer using Cu Kα radiation (a wavelength of 1.5418 Å), and the height of films was calibrated before each measurement. Cross-section FIB device lamellae were prepared on a FEI Quanta 3D FEG DualBeam instrument, and a layer of Pt was sputtered on the device surface for the purpose of protection. The sample was cut from the bulk material with a 30 kV Ion beam with the last step being with a 3 nA current. During final thinning the voltage was set to 16 kV and the currents used were 0.5 and 0.15 nA. Then, a final polish was done at 5 kV and 48 pA. The FIB lamellae were targeted with a final thickness of about 100 nm but this may vary locally. Transmission electron microscopy (TEM) was performed on a FEI Talos F200X analytical scanning transmission electron microscope operating at 200 kV, and a low electron dose was applied to minimize the electron beam damage. Scanning electron micrographs (SEM) images were taken on FEI Helios 600 Nanolab Dual Beam System operating at 5 or 20 kV, and EDS spectra were obtained with an EDS Oxford instrument (INCA PentaFET-x3). The atomic force microscope (AFM) images were scanned from an Asylum Research MFP3D Atomic Force Microscope under a tapping mode. The X-ray photoelectron spectroscopy (XPS) was performed on Kratos Axis Ultra DLD X-ray Photoelectron Spectrometer by using a monochromatized Al Kα source (hv=1486.6 eV).

Mechanical Characterization

Bruker Hysitron TI980 Triboindenter was utilized to perform both nanoscratch and nanoindentation on one-step spin-coated MAPbI$_3$ films using a three-sided diamond Berkovich tip. The Berkovich indenter tip was calibrated on quartz standards using a preliminary calibration procedure.

Ion Migration Studies

Activation energy for ion migration was measured using a lateral device structure of glass/PTAA/perovskite/Au by a Keithley 2601 source meter at different temperatures. The electric field of the lateral device was 0.4 V μm$^{-1}$. The device was set in a Lakeshore Probe Station to obtain desired temperature.

PL Mapping

The PL mapping was conducted on a PicoQuant MT100 FLIM System at room temperature. A 485 nm laser (PicoQuant LDH-P-C-405B) pulsed at 1.5 MHz with an intensity of 0.89 sun per pulse was coupled into the confocal microscope and focused onto the sample. The PL mapping was conducted over a 10×10 μm region, and the PL intensity was recorded by a hybrid PMT detector.

Example 1: Methods for the Removal of Defect Surface Layers Using an Adhesive

It has been observed that MHP (metal halide perovskite) polycrystalline films with various compositions show an interruption of lattice continuity on film surfaces. The top surfaces have a typical morphology of many nanocrystals surrounded by an amorphous phase. Such defective surfaces are expected to exhibit higher density dangling chemical bonds and vacancies than in crystalline regions in the grain interior, resulting in weak bonding between the surface nanocrystals/amorphous phase within underlying crystalline grains (Yuan, Y. & Huang. J. Acc. Chen. Res. 49, 286-293, (2016); Aristidou, N. et al. *Nat. Commun.* 8, 15218-15227, (2017)). To characterize the adhesion strength of such a defective surface layer on the top of the grains, a nano-scratch test was performed on both pristine and polished $MAPbI_3$ films (Tomastik. J. & Ctvrtlik. R. *EPJ Web of Conferences* 48, 00027, (2013). The $MAPbI_3$ films with thicknesses of ~600 nm were fabricated by spin-coating, and were verified to yield a device efficiency over 19.0% using a p-i-n device structure before the nanoscratch test (Bai. Y. et al. *ACS Energy Lett* 4, 1231-1240, (2019)). In the nano-scratch test, a tip scratched the perovskite films from the top surface to the film interior with a penetration depth of 30 nm while being moved laterally for ~500 nm, as illustrated by FIG. 1A. The lateral force of the tip was recorded, which reflected the bonding strength at different probing depths. The measurement was conducted on four groups of pristine and surface-polished films, and the results were statistically analyzed. As shown in FIG. 1B, the lateral force measured in pristine $MAPbI_3$ film increased almost linearly with the scratching depth, which was controlled by gradually increasing the normal load. After the nanocrystals/amorphous phase top layer was polished off, the lateral force was larger than in the pristine film at all scratch depths, indicating that the surface defective layers adhere less to the region underneath than the crystalline grain interiors. The averaged lateral force on four different polished films was ~50% larger than that on the pristine films. This result verifies the weaker adhesion of the defective surface layers with the underlining crystalline regions than inside the crystalline region.

High resolution transmission electron microscopy (HR-TEM) on a focused ion beamed (FIB) prepared cross-sectional device lamella was used to study the structural features of the defects on the top surface of the perovskite films. The PSC device was fabricated with an inverted architecture of ITO/poly(bis(4-phenyl)(2,4,6-trimethylphenyl)amine)(PTAA)/perovskites/C60/Bathocuproine (BCP)/Cu. As shown in FIG. 1D, at the interface between the perovskite and C60, small grains of different orientations can be observed with a depth of about 20 to about 50 nm. Conversely, the region inside the grains maintains a long-range regular arrangement and shows single-crystal-like packing (FIG. 1E). These results reveal that the perovskite surface defects are mainly a result of small grains and amorphous phase that not only act as charge recombination centers, but can also trigger the degradation of perovskites.

Figure 2B:
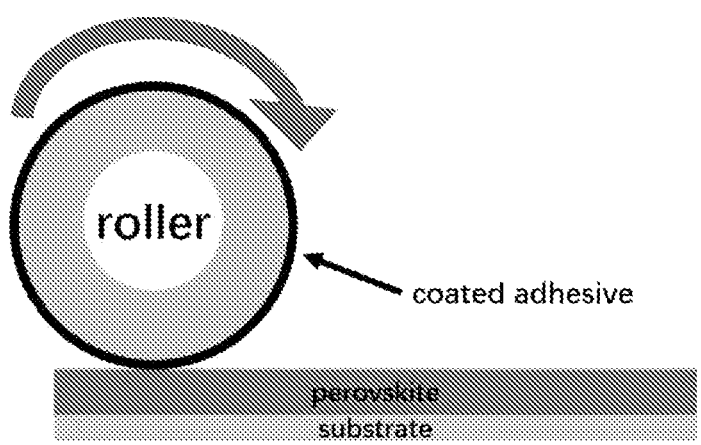
FIG. 2B shows a schematic of an adhesive-coated roller to treat the surface of perovskites.

Based on the above observation above, a method was designed to remove the defective layer with adhesive tape. The method leaves the underlying crystalline region unaffected by utilizing the weaker adhesion of the defective region to the crystalline region and the relatively soft nature of the MHPs due to the weak ionic bonding between the large size metal cations and halide anions (Yu, J. et al. *ACS Nano* 10, 11044-11057, (2016); Stavrakas. C. et al. *Adv. Energy Mater.* 9, 1901883, (2019); Wang, Y. et al. Science 365, 687-691, (2019)). As illustrated in FIG. 1C, an adhesive tape made of soft adhesive on a flexible polymer substrate is pressed into the rough and porous defective perovskite surfaces to form an intimate contact with appropriate bonding strength. After peeling off this adhesive material, nanocrystals and amorphous phase still stay on it, and are thus removed from the perovskite films. One prerequisite for the success of this method is that the bonding of the perovskite large grains with the charge transport layer covered indium tin oxide (ITO) substrate should be strong enough so that the large grains are not peeled off. To demonstrate this method, tape treatment was performed by pressing a low-cost 3M temflex 1700 adhesive tape onto pristine $MAPbI_3$ films, and subsequently separating the tape from the $MAPbI_3$ surfaces at an angle of ~180° to the film surface, as schematically illustrated in FIG. 1C. The cross-sectional scanning electron microscopy (SEM) image in FIG. 2A shows that the tape forms gapless intimate contact with perovskite films after pressing the tape at a small pressure of 1 MPa at room temperature. The adhesive strength between the tape and pristine perovskite surfaces was measured using the 180° peel method to be $2.3\pm0.1$ N $cm^{-1}$ (Ebnesajjad, S. & Landrock, A. H. in *Adhesive Technology Handbook (Third Edition)* 339-352 (William Andrew Publishing, 2015). The peeling-off force was increased to $2.6\pm0.1$ N $cm^{-1}$ when the tape was applied a second or third time, indicating the successful peeling of the defective region during the first peeling-off process.

Figures 3A, 3B:
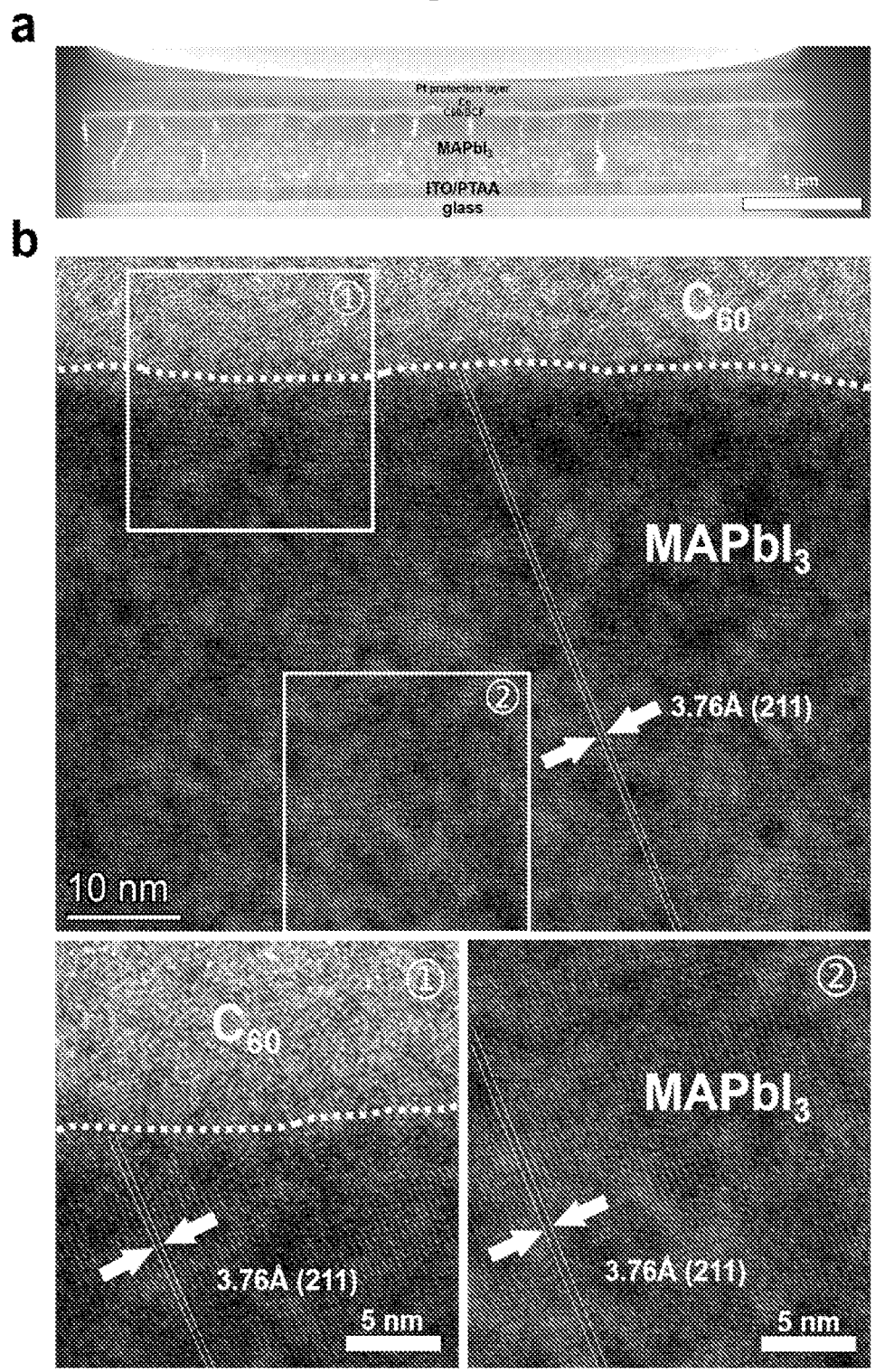
FIG. 3A shows a transmission electron microscopy image of a cross-section FIB lamellae.
FIG. 3B shows cross-section HRTEM images of the perovskite/C$_{60}$ interface of a tape-treated MAPbI$_3$ device. The squares highlight perovskite/C$_{60}$ interface (position 1) and grain interior (position 2) regions.
Figure 4A:
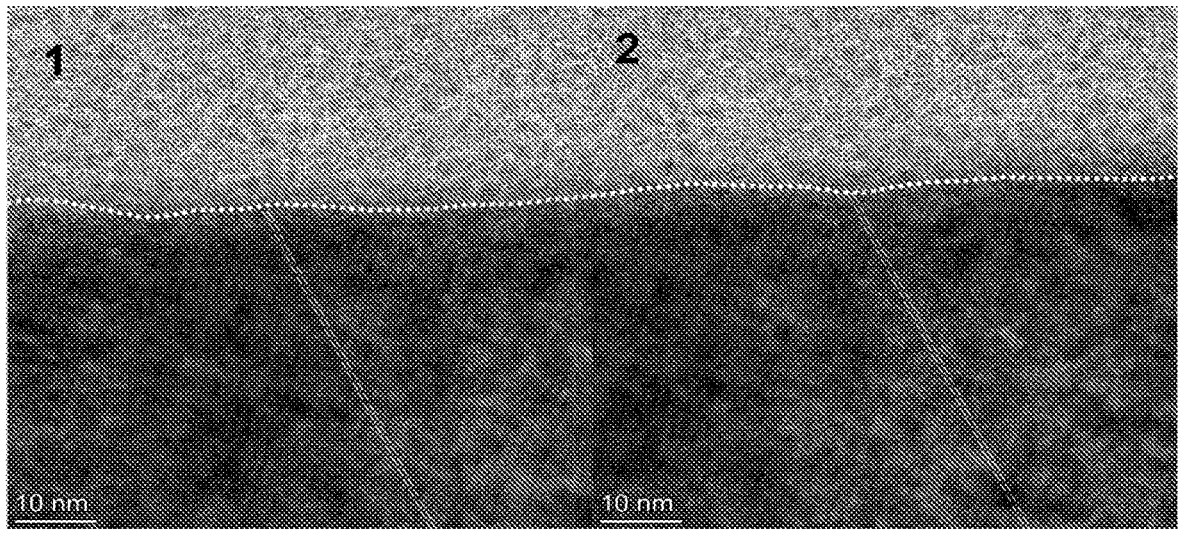
FIG. 4A shows cross-sectional HRTEM images at the perovskite (dark)/C$_{60}$ (bright) interfaces (dash lines) of tape-treated MAPbI$_3$ devices at a randomly captured location. Solid lines show the lattice orientations.
Figure 4B:
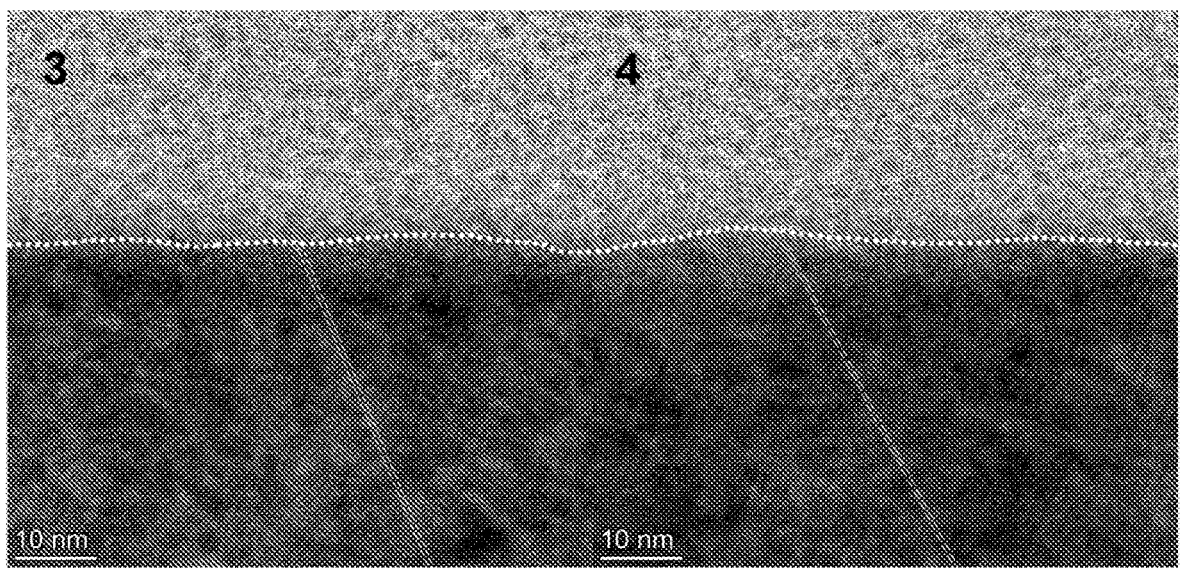
FIG. 4B shows cross-sectional HRTEM images at the perovskite (dark)/C$_{60}$ (bright) interfaces (dash lines) of tape-treated MAPbI$_3$ devices at a randomly captured location. Solid lines show the lattice orientations.
Figure 4C:
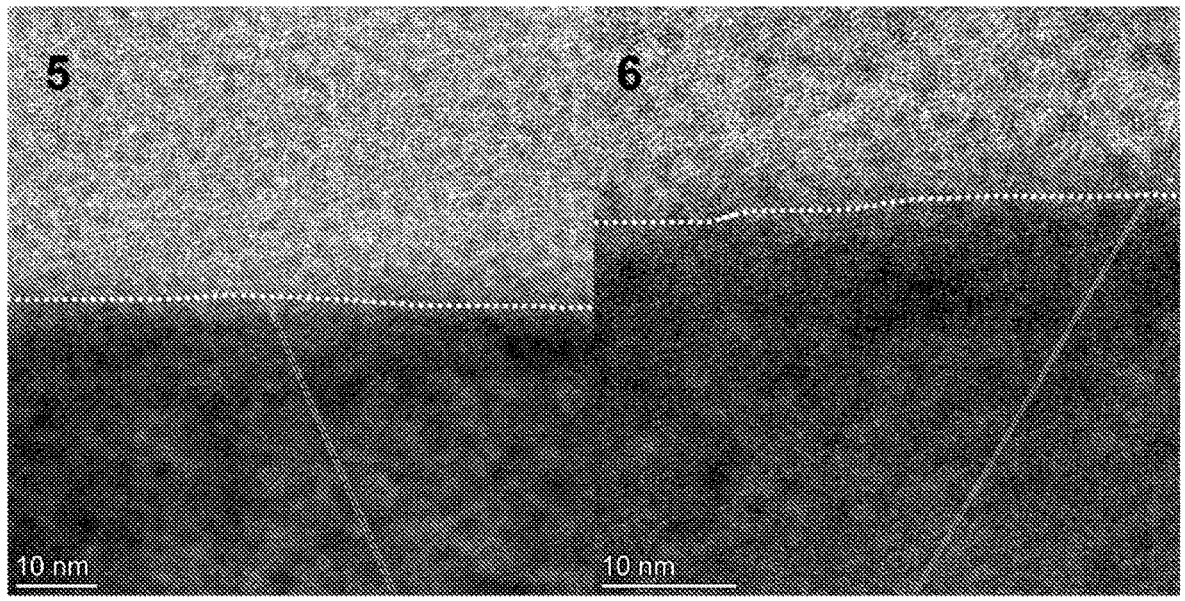
FIG. 4C shows cross-sectional HRTEM images at the perovskite (dark)/C$_{60}$ (bright) interfaces (dash lines) of tape-treated MAPbI$_3$ devices at a randomly captured location. Solid lines show the lattice orientations.
Figure 4D:
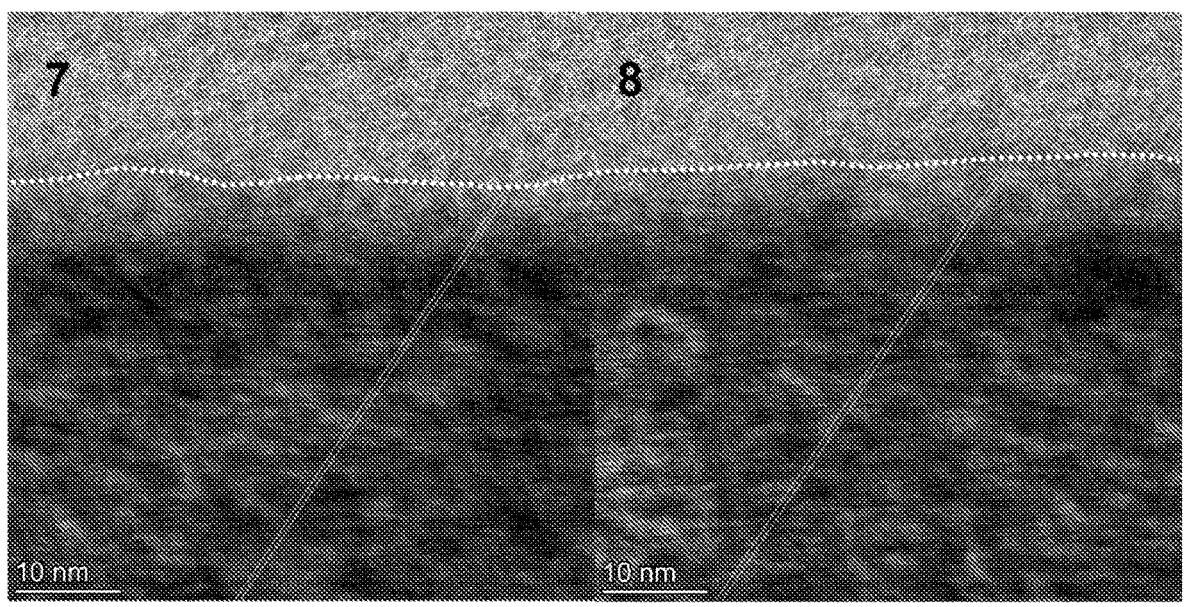
FIG. 4D shows cross-sectional HRTEM images at the perovskite (dark)/C$_{60}$ (bright) interfaces (dash lines) of tape-treated MAPbI$_3$ devices at a randomly captured location. Solid lines show the lattice orientations.
Figure 4E:
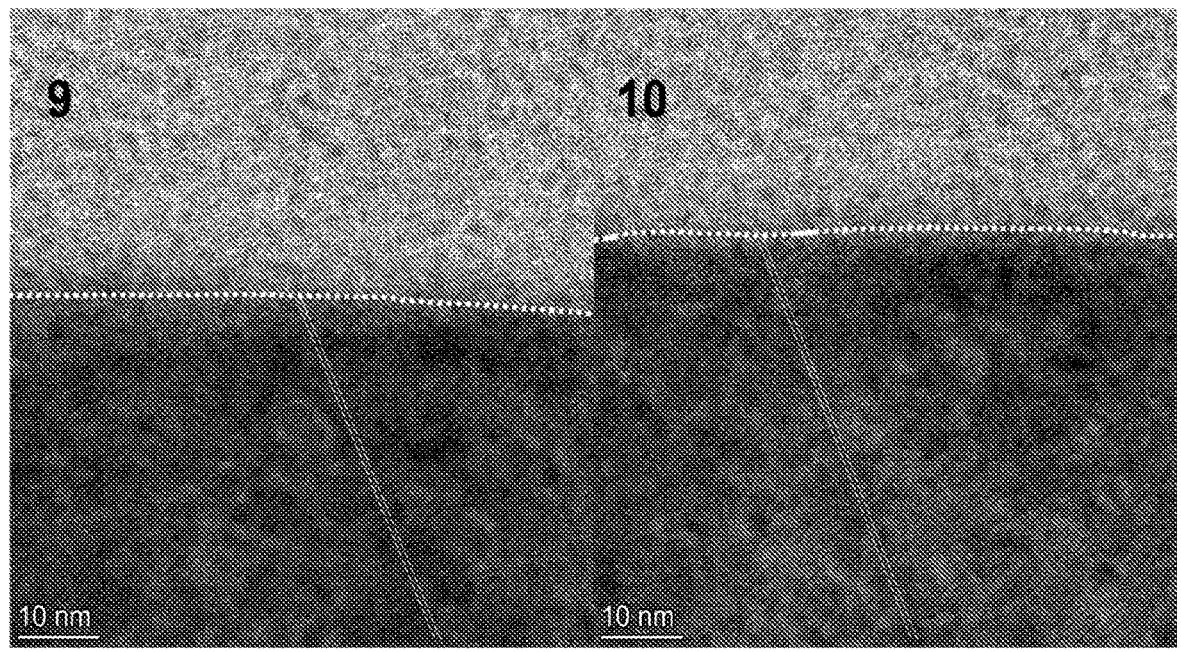
FIG. 4E shows cross-sectional HRTEM images at the perovskite (dark)/C$_{60}$ (bright) interfaces (dash lines) of tape-treated MAPbI$_3$ devices at a randomly captured location. Solid lines show the lattice orientations.
Figure 4F:
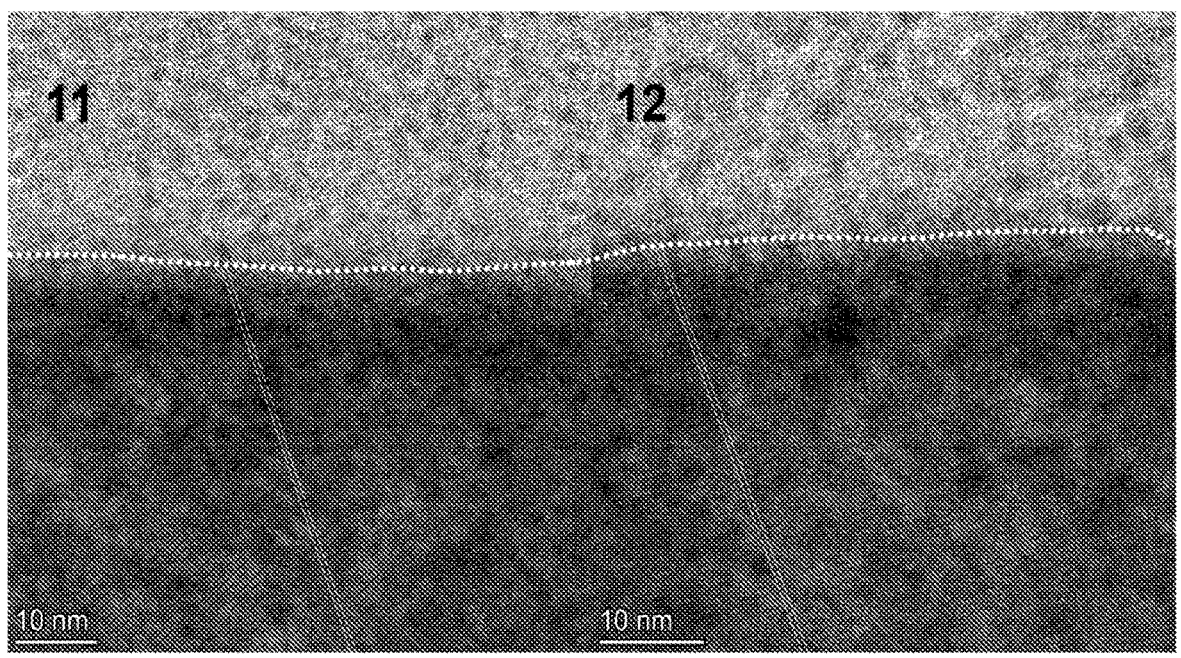
FIG. 4F shows cross-sectional HRTEM images at the perovskite (dark)/C$_{60}$ (bright) interfaces (dash lines) of tape-treated MAPbI$_3$ devices at a randomly captured location. Solid lines show the lattice orientations.
Figure 5A:
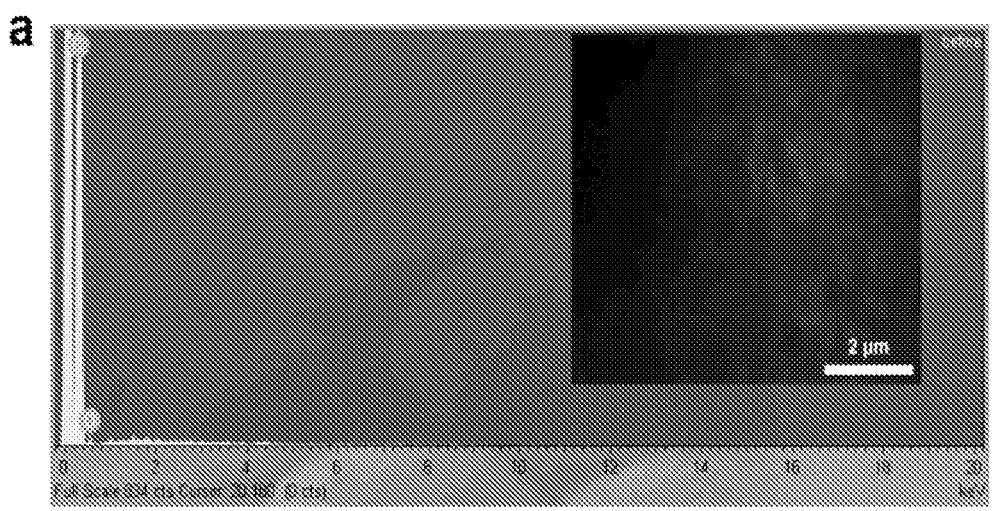
FIG. 5A shows an EDS spectrum of pristine tape. The inset shows the SEM image of the tape for EDS analysis.
Figure 5B:
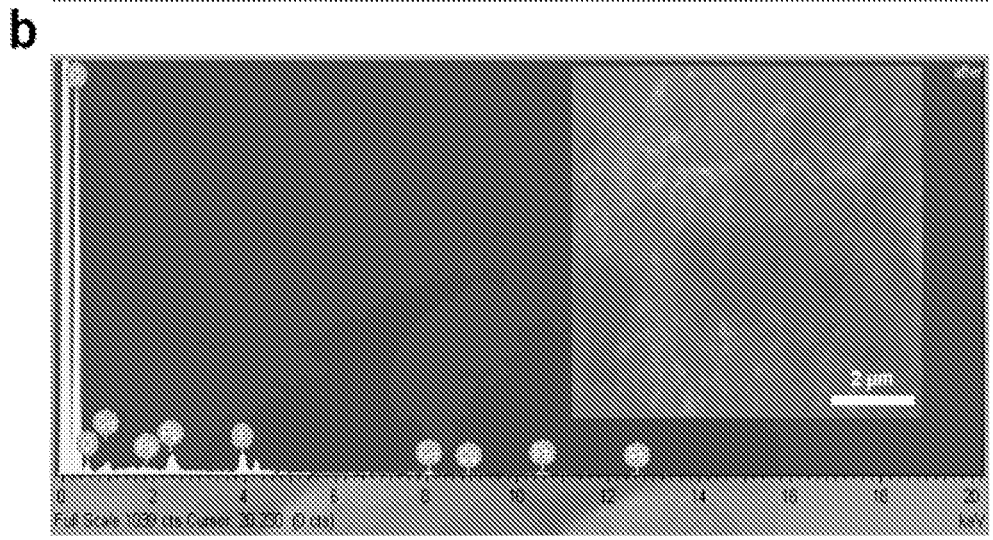
FIG. 5B shows an EDS spectrum of the tape peeled off of the MAPbI$_3$ film surface. The inset shows the SEM image of the tape for EDS analysis.
Figure 6:
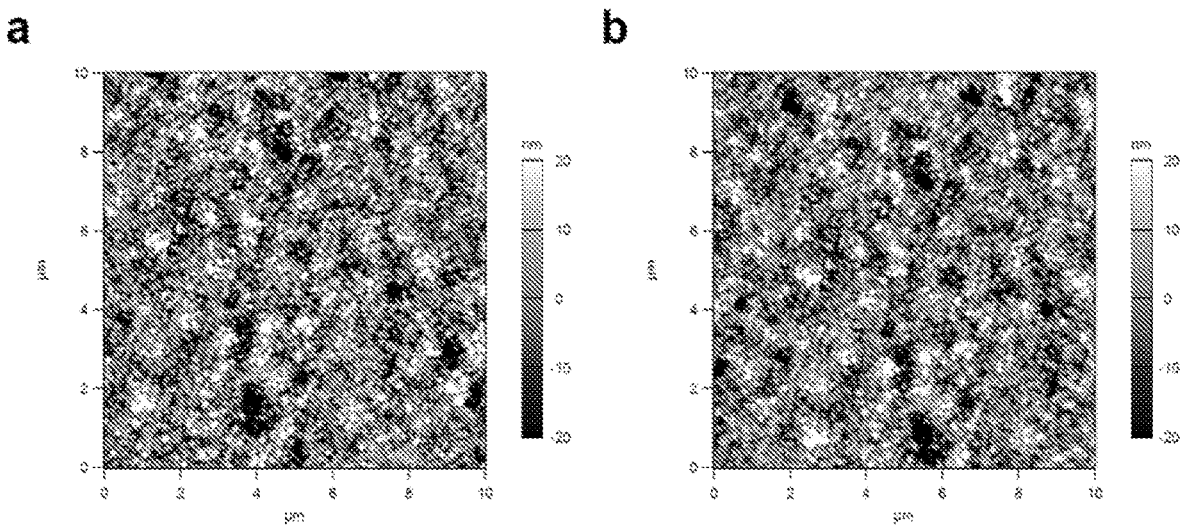
FIG. 6 shows AFM images of the identical MAPbI$_3$ film (a) before and (b) after tape treatment.

HRTEM measurements were conducted on tape-treated $MAPbI_3$ solar cells that contained both an electron transport layer and a metal electrode. One representative image is shown in FIG. 3B and twelve others at randomly selected locations in a 6 μm-long focused ion beam (FIB) lamellae of the same device are shown in FIG. 3A and FIG. 3B, respectively. No nanocrystal or amorphous phase was observed at the perovskite top surface in any of these HRTEM images. The perovskite lattices inside the grains were found to be continuous and extend directly to the perovskite/$C_{60}$ interface without the presence of obvious extended defects. To illustrate this, region 2 was magnified, which was 50 nm away from the perovskite/$C_{60}$ interface and region 1 at the interface of the perovskite/$C_{60}$. The (211) plane was marked in the figure. The same trend was also observed at twelve other locations FIG. 4A-FIG. 4F. This result confirms the effectiveness of the adhesive tape in removing the surface defective layers. In addition, energy dispersive spectroscopy (EDS) measurements were carried out to analyze the perovskite residuals on the tape after peeling. Both lead and iodide were detected on the tape with an atomic ratio of ~1:3 (FIG. 5A and FIG. 5B and Table 1). The surface topography changes of the $MAPbI_3$ films caused by tape treatment were characterized via both atomic force microscopy (AFM) and top-view SEM. As shown in FIG. 6, AFM measurement results show that the overall topography of the $MAPbI_3$ film did not change significantly, while the film became slightly smoother after tape treatment with the root mean square (RMS) roughness reduced from 11.39 to 9.15 nm after peeling. This also indicates an advantage of the tape treatment over polishing that the soft adhesive can have a conformal contact with the non-flat film surfaces so that the defective layers can be removed without the need to flatten the whole films. This is particularly attractive for applications where the surface textures are preferred to be retained, such as perovskite/silicon tandem solar cells. No pinhole in the film was observed in the SEM image of tape-treated $MAPbI_3$ surfaces (FIG. 7), indicating the bonding between large grains and poly(bis(4-phenyl) (2,4,6-trimethylphenyl)amine) (PTAA) coated ITO is stronger than that between the defective layer and the crystalline region.

TABLE 1

EDS analysis results on the tape peeled off a $MAPbI_3$ film

| Element | Atomic % |
| --- | --- |
| C | 94.16 |
| O | 4.58 |

TABLE 1-continued

EDS analysis results on the tape peeled off a MAPbI3 film

| Element | Atomic % |
|---|---|
| I | 0.73 |
| Cu | 0.32 |
| Pb | 0.21 |

The effectiveness and uniformity of the tape treatment was further investigated y carrying out multiple structural, optoelectrical, and mechanical characterizations. First, the crystallinity of the perovskite surface was examined via grazing incident X-ray diffraction (XRD) on the same MAPbI3 film before and after tape treatment. The incident angle of the X-ray was fixed at 0.1°, which corresponds to a penetration depth of ~20 nm at the X-ray photon energy of 8 keV (Yakunin, S. et al. *Nat. Photonics* 10, 585-589, (2016)).

Figure 8A:
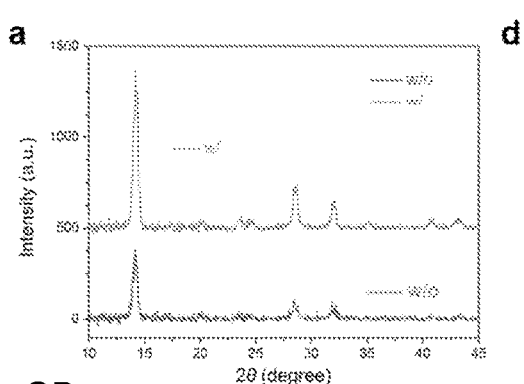
FIG. 8A shows grazing XRD spectra (vertically offset for clarity) of a MAPbI$_3$ film without and with tape treatment at an incident angle of 0.1°.
Figure 8B:
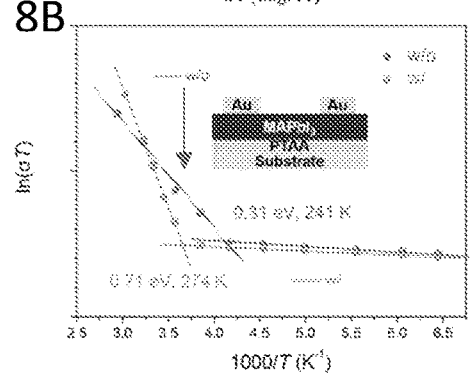
FIG. 8B shows temperature-dependent conductivity of the lateral structure device without and with tape treatment measured in the dark. The structure of the device for this measurement is shown in the inset.
Figure 8C:
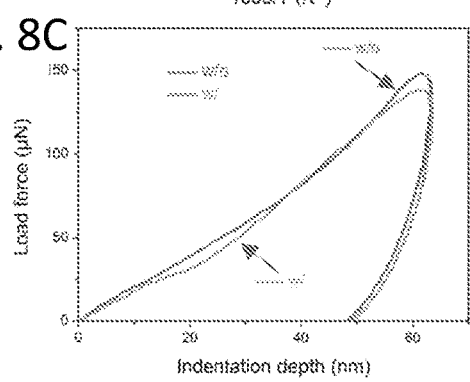
FIG. 8C shows loading and unloading force curves for MAPbI$_3$ films without and with tape treatment.

As shown in FIG. 8A, the diffraction peak intensity of all crystallographic planes increased significantly after tape treatment, confirming the exposure of the crystalline region by successful removal of nanocrystals or amorphous surfaces. Subsequently, the activation energy ($E_a$) for ion migration of the MAPbI3 films was measured via temperature-dependent dark conductivity. Lateral structure devices were fabricated by evaporating two Au electrodes on glass/PTAA/MAPbI3 films, which is shown in the inset of FIG. 8B. The $E_a$ can be extracted from the Nernst-Einstein equation: $\sigma(T)=(\sigma_0/T)\exp(-E_a/k_BT)$, where $k_B$ is Boltzmann constant. $\sigma_0$ is a constant, and T is temperature. The applied electric field was 0.4 V $\mu m^{-1}$, which is close to that in the operational solar cells. As shown in FIG. 8B, the conductivity can be well separated into electronic conduction and ionic conduction regions for both cases, which is typical for MAPbI3 (Yuan. Y. et al. *Adv. Energy Mater.* 5, 1500615, (2015); Xing. J. et al. *Phys. Chem. Chem. Phys.* 18, 30484-30490, (2016)). For the film without tape surface treatment, the ionic conductivity, with an $E_a$ of 0.31±0.02 eV, started to dominate the total conductivity when the temperature increased to 241 K. In contrast, the tape-treated film exhibited an increased transition temperature of 273 K and a larger $E_a$ of 0.71±0.03 eV, indicating the ion migration was greatly suppressed by eliminating defective surfaces that acted as the high-speed ion-migration channel. The surface mechanical properties of pristine and tape-treated MAPbI3 films were studied with a nanoindenter. The indentation depth of the Berkovich tip used in this measurement was fixed within 10% of the total film thickness to avoid the impact from the substrate (Mamun. A. A. et al. *Mater. Lett.* 229, 167-170, (2018)). As shown in FIG. 8C, the surface of the pristine MAPbI3 exhibited a hardness of 0.54±0.03 GPa, and the surface hardness increased to 0.64±0.05 GPa after tape treatment. This again indicates that pristine perovskite surfaces with defective surface layers are softer than the underlying high-crystallinity grain interior. Without wishing to be bound by theory, it is understood that the softer surface should result from the dangling chemical bonds and high-density defects on the film surface (Yuan, Y. & Huang. J. *Acc. Chem. Res.* 49, 286-293, (2016); Aristidou, N. et al. *Nat. Commun.* 8, 15218-15227, (2017)).

Figure 8D:
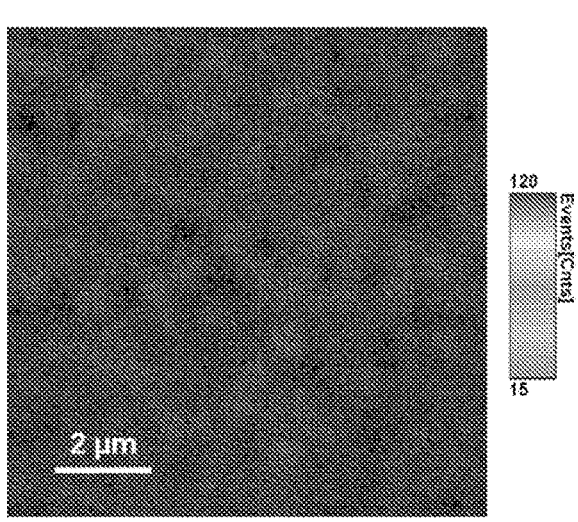
FIG. 8D shows PL mapping images of a MAPbI$_3$ film before (top) and after (bottom) tape treatment.
Figure 8D:
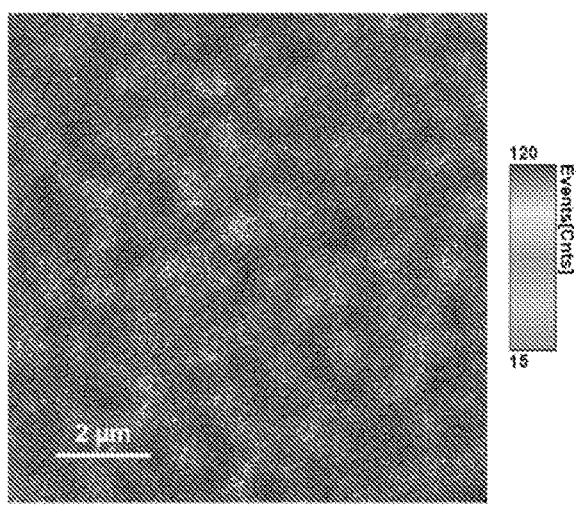

Steady-state photoluminescence (PL) were then mapped on the same MAPbI3 film before and after tape treatment to examine the uniformity of the tape treatment. As shown in FIG. 8D, the tape-treated MAPbI3 film exhibited higher PL intensity in comparison to the pristine film, indicating less non-radiative recombination after eliminating the defective surfaces. In addition, almost the entire measured area exhibited enhanced PL intensity and no dark area was observed after tape treatment, suggesting good uniformity of the tape treatment in removing the defective surfaces without introducing any physical damage to the films, such as peeling off of any grains from the film surface.

Figure 9A:
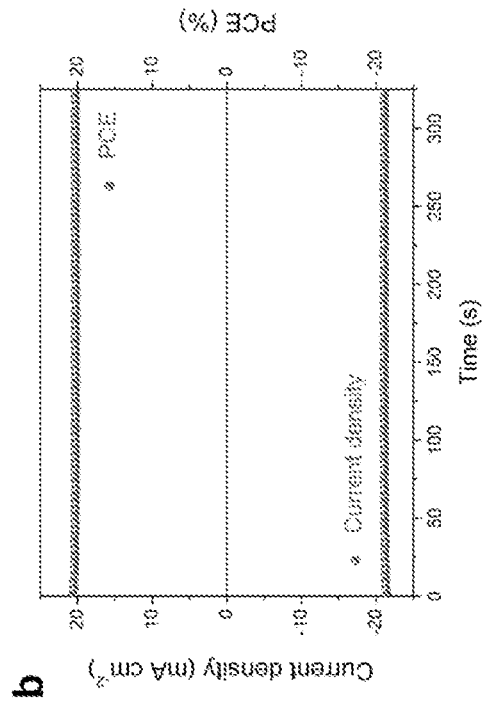
FIG. 9A shows J-V characteristics of PSCs without and with tape treatment. The inset shows the statistics of the PCE distribution for perovskite devices without and with tape treatment.
Figure 9B:
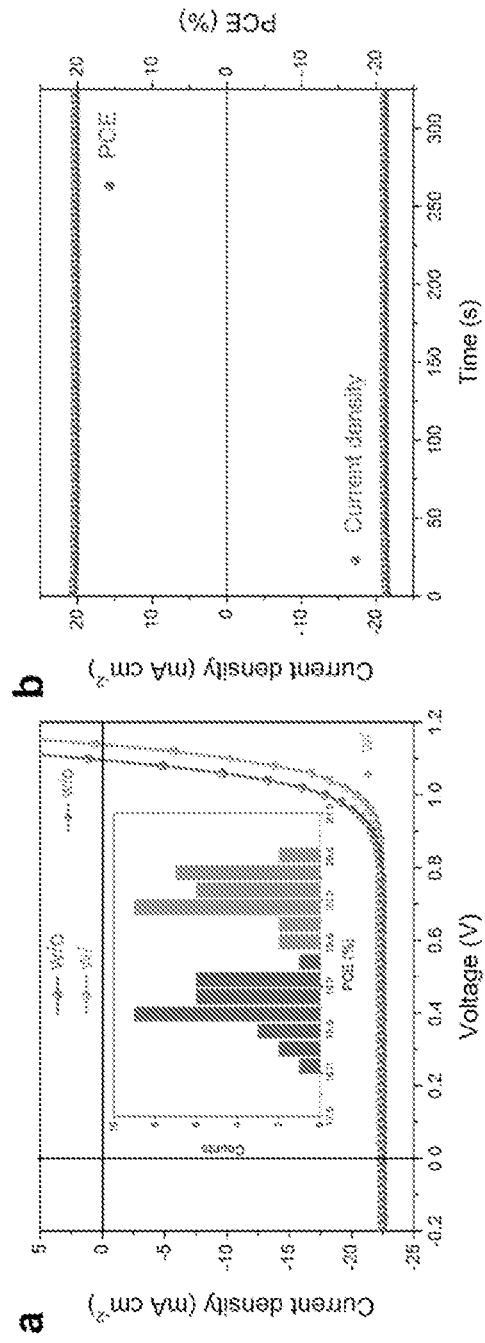
FIG. 9B shows the current density and steady-state power output of a well-performing MAPbI$_3$ device with tape treatment measured at a fixed bias of 0.96 V.
Figure 9C:
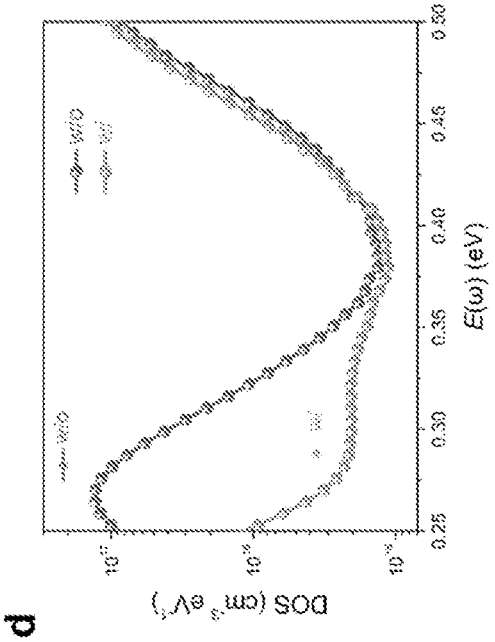
FIG. 9C shows a TPV spectrum of the perovskite devices based on control and tape-treated MAPbI$_3$ films.
Figure 9D:
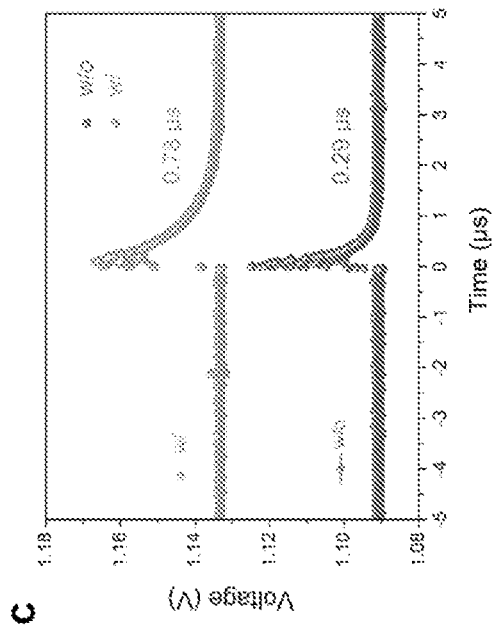
FIG. 9D shows a tDOS spectrum of the perovskite devices based on control and tape-treated MAPbI$_3$ films.
Figure 10:
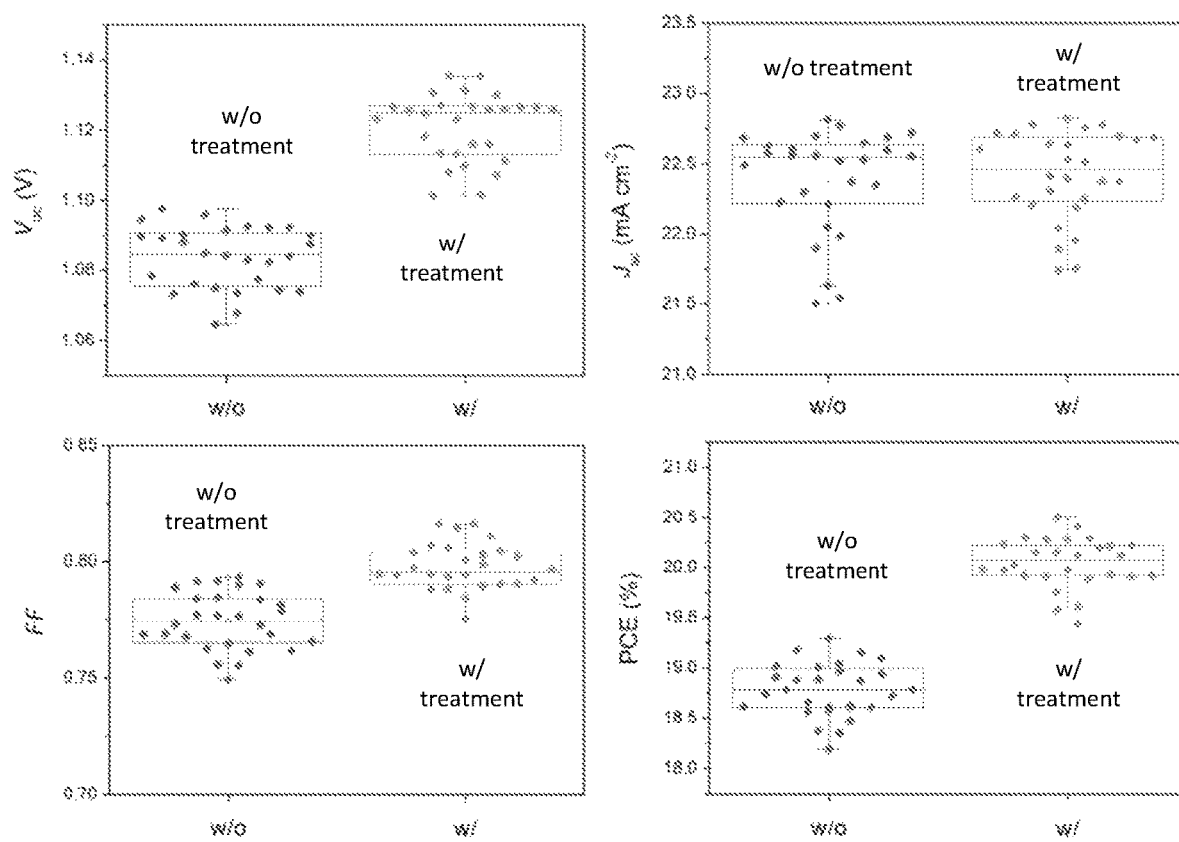
FIG. 10 shows a comparison of J-V metrics for 28 solar cells based on one-step prepared MAPbI$_3$ perovskite films without and with tape treatment.
Figure 11:
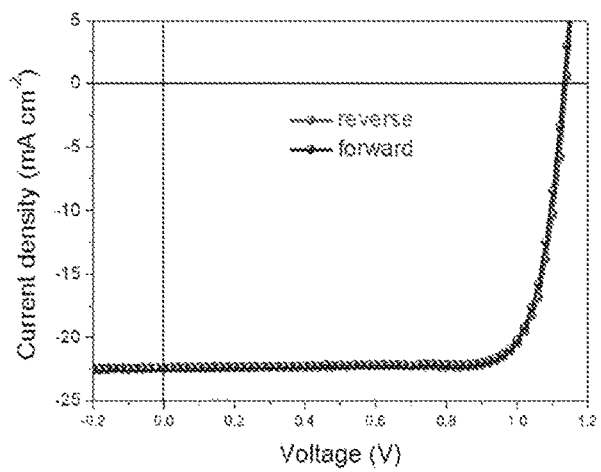
FIG. 11 shows J-V curves of the champion tape-treated MAPbI$_3$ device measured in reverse and forward scanning directions.
Figure 12:
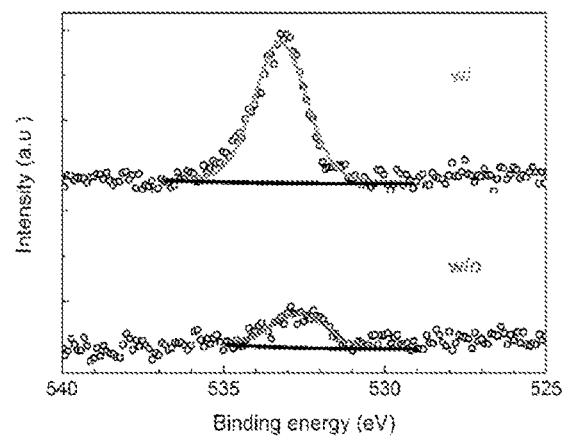
FIG. 12 shows an XPS Or, spectra of an MAPbI$_3$ film with and without tape treatment. Solid lines are the fitting results.
Figure 46:
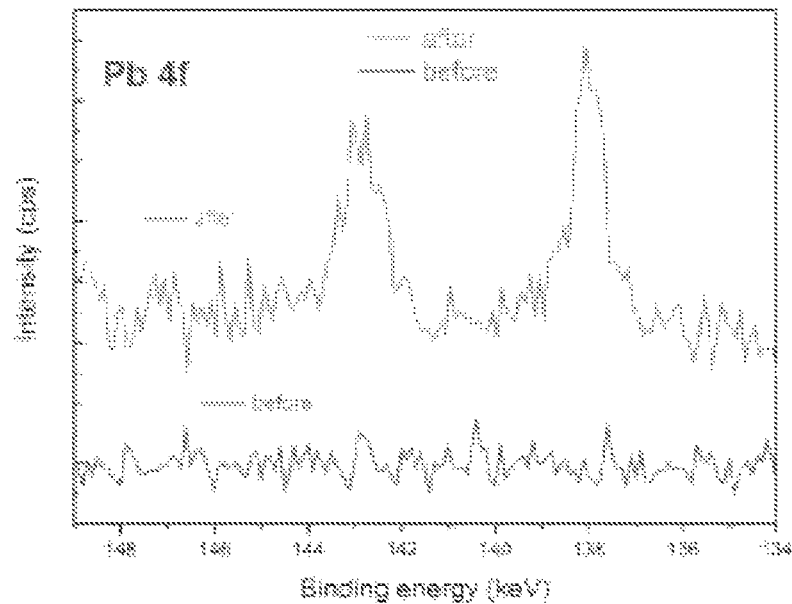
FIG. 46 shows XPS Pb4f spectra of the adhesive tape before and after surface treatment on a $MAPbI_3$ film.
Figure 47:
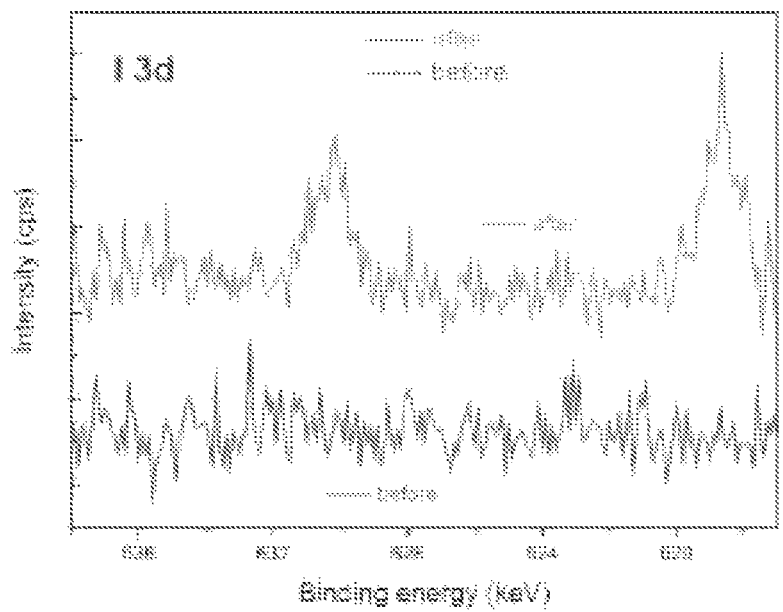
FIG. 47 shows XPS I3d spectra of the adhesive tape before and after surface treatment on a $MAPbI_3$ film.

PSCs were fabricated with a p-i-n planar heterojunction configuration of ITO/PTAA/perovskites/$C_{60}$/bathocuproine (BCP)/Cu. MAPbI3 films were deposited onto the PTAA covered ITO substrate with a one-step spin-coating process (Bai, Y. et al. *ACS Energy Lett.* 4, 1231-1240, (2019)). As shown in FIG. 9A, the control device without tape treatment exhibited an open-circuit voltage ($V_{oc}$) of 1.09 V, a short-circuit current density ($J_{sc}$) of 22.5 mA cm$^{-2}$, a fill factor (FF) of 78.9%, and thus a PCE of 19.3%, which are consistent with previous results (Bai, Y. et al. *ACS Energy Lett.* 4, 1231-1240, (2019)). After tape treatment, the device delivered an enhanced $V_a$ of 1.13 V and a larger FF of 81.0%, and a comparable $J_{sc}$ of 22.4 mA cm$^{-2}$, yielding a higher PCE of 20.5% from the J-V curve and a stabilized efficiency of 20.3% (FIG. 9B). The mean PCEs are 18.8±0.3% and 20.1±0.3% for perovskite devices without and with tape treatment, respectively. The photovoltaic parameters of the devices with and without tape treatment were analyzed, and the statistical distribution is shown in FIG. 10. No noticeable hysteresis was observed under forward and reverse photocurrent sweeps (FIG. 11 and Table 2). The enhanced $V_{oc}$ can be attributed to suppressed non-radiative recombination, which is supported by the enhanced PL intensity shown in FIG. 8D and tripled charge recombination lifetime measured by transient photovoltage (TPV) at a light bias of 1 sun intensity (FIG. 9C). A reduced trap density in the tape-treated perovskite device was also discovered by the thermal admittance spectroscopy measurement result shown in FIG. 9D. The tape-treated device exhibited a much lower trap density of states (tDOS) in shallow trap depth region (0.25 to 0.35 eV). Without wishing to be bound by theory, the reduced trap density can be attributed to the removal of defective surfaces. However, it was discovered that pressing the tape onto the perovskite surface could leave a thin layer of polymer (rubber) adhesive on the top of the films, which was also observed to have passivation effects on the devices. The adhesive residuals on the perovskite surfaces were confirmed by X-ray photoelectron spectroscopy (XPS). As shown in FIG. 12, the intensity of the $O_{1s}$ peak on the surface of the MAPbI3 film increased significantly after tape treatment. Without wishing to be bound by theory, it is understood that this result should originate from the polymer resin residues, which is a component in tape adhesives. This result also indicates that the adhesive residual does not appear to have any detrimental effects on the device efficiencies, which is consistent with previous studies investigating how an insulating layer of many compositions also has passivation effects on perovskites due to the various types of passivation functional groups (Wang. Q. et al. *Adv. Mater.* 28, 6734-6739, (2016); Zhao, Y. et al. *Nat. Commun.* 7, 10228-10236, (2016)). XPS spectra of the tape before and after surface treatment of a MAPbI3 film show both Pb and I signals (FIGS. 46 and 47), which further confirms that the defective perovskite surface layer was removed by the adhesive tape.

Figure 13:
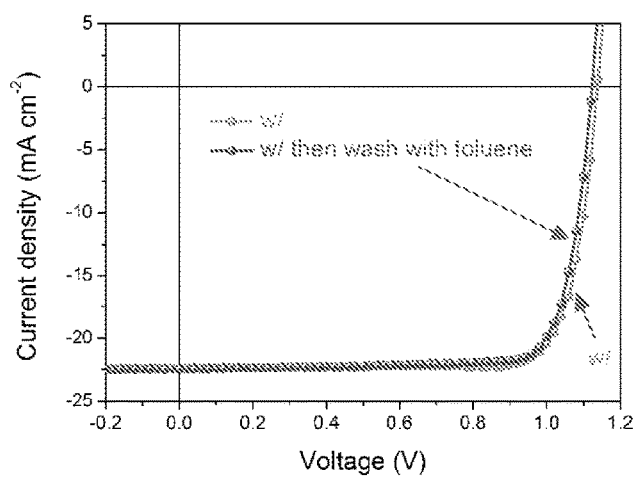
FIG. 13 shows reverse-sweep J-V curves of tape-treated PSCs with and without toluene washing.
Figure 44:
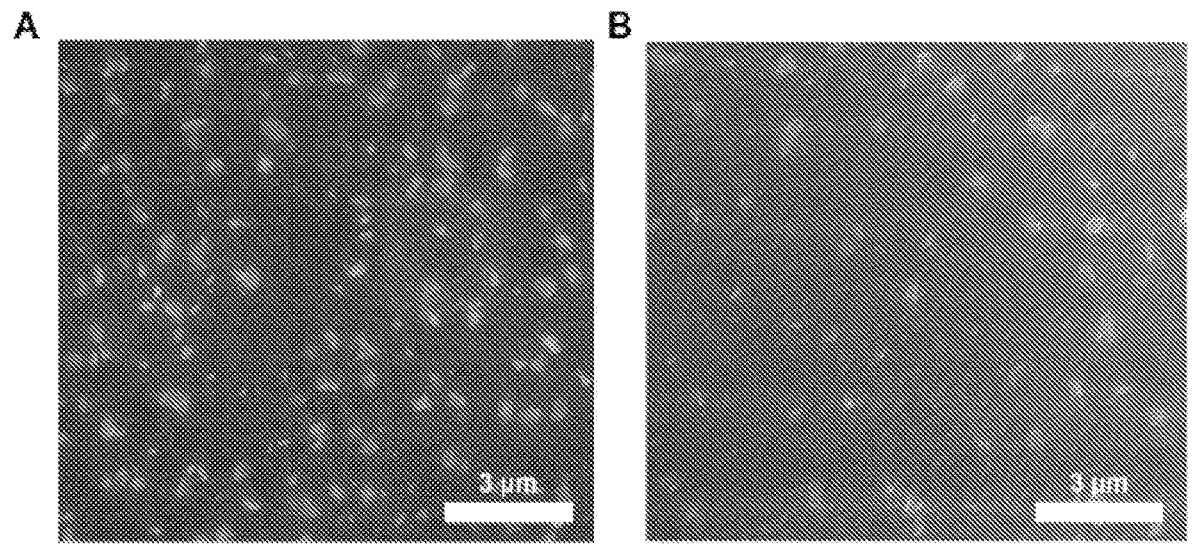
FIG. 44 shows top-view SEM images of $MAPbI_3$ films having excess $PbI_2$ without (A) and with (B) tape treatment.
Figure 45:
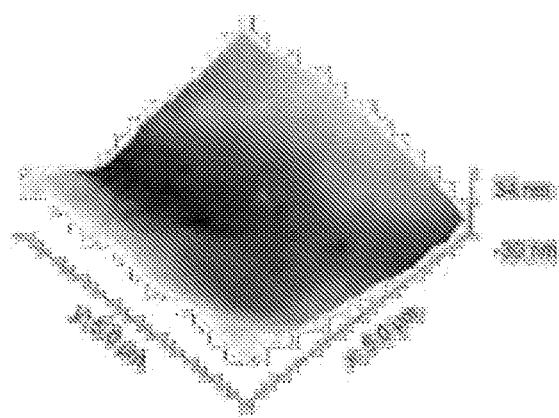
FIG. 45 shows AFM characterization of a piece of adhesive tape utilized in investigations herein.

To quantify the passivation effects from the adhesive, the performance of the tape-treated devices was investigated with and without toluene washing. It was found that the $V_{oc}$ slightly decreased after washing off of the adhesive layer with toluene (FIG. 13 and Table 3). Therefore, the reduced trap density is a result of both the removal of defective surfaces and the passivation effect of the adhesive residuals. Overall, the longer carrier recombination lifetime and lower trap density of the tape-treated devices demonstrate how tape treatment can effectively reduce the perovskite surface defects, accounting for the suppressed charge recombination and thus enhanced device efficiency. It was also discovered that the adhesive tape was effective in removing excessive $PbI_2$ particles, which have been reported to cause the degradation of perovskite due to photolysis effects (Liu, F. et al. *Adv. Energy Mater.* 6, 7849; Roose, B. et al. *J. Phys. Chem. Lett.* 11, 6505-6512). As shown in FIG. 44, the $MAPbI_3$ film processed from a $PbI_2$-excess precursor solution ($PbI_2$:MAI molar ratio of 1.05:1) exhibited white $PbI_2$ particles on its top surface, which were then effectively removed after treatment with adhesive tape. Accordingly, this study also provides a simple strategy to remove excess $PbI_2$, thereby further enhancing the light stability of perovskite films.

TABLE 2

Device parameters of champion one-step $MAPbI_3$ PSC from reverse and forward J-V sweep.

| Sweep direction | $V_{oc}$ (V) | $J_{sc}$ (mA cm$^{-2}$) | FF | PCE (%) |
|---|---|---|---|---|
| Forward | 1.13 | 22.4 | 0.811 | 20.5 |
| Reverse | 1.13 | 22.4 | 0.807 | 20.4 |

TABLE 3

Device parameters of the $MAPbI_3$ PSCs without, with tape treatment, and with tape treatment then washed by toluene.

Figure 15:
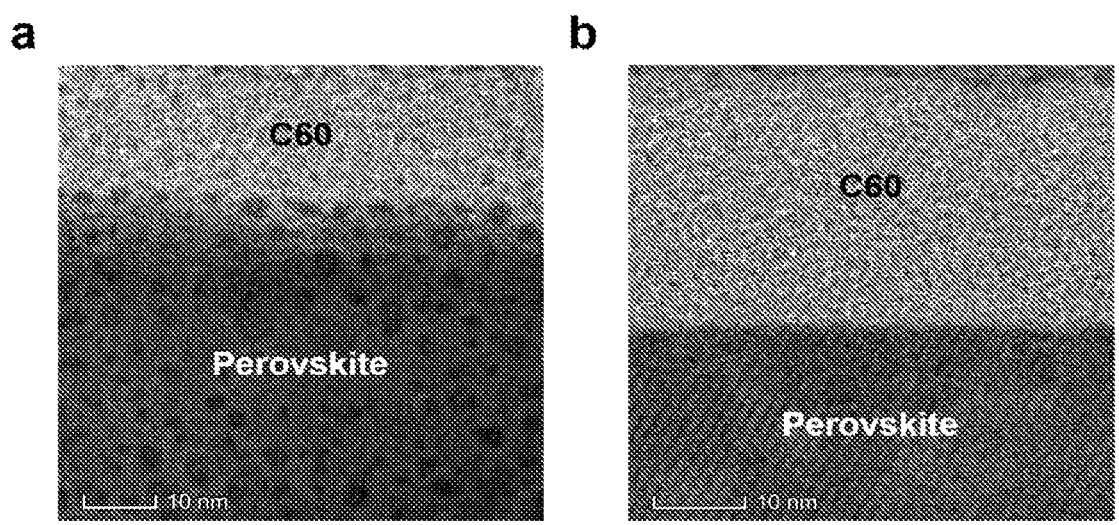
FIG. 15 shows cross-sectional HR-TEM images of the pristine Cs$_{0.05}$FA$_{0.81}$MA$_{0.14}$PbI$_{2.55}$Br$_{0.45}$ perovskite/C$_{60}$ interface showing both (a) poor and (b) high crystallinity regions.
Figure 16:
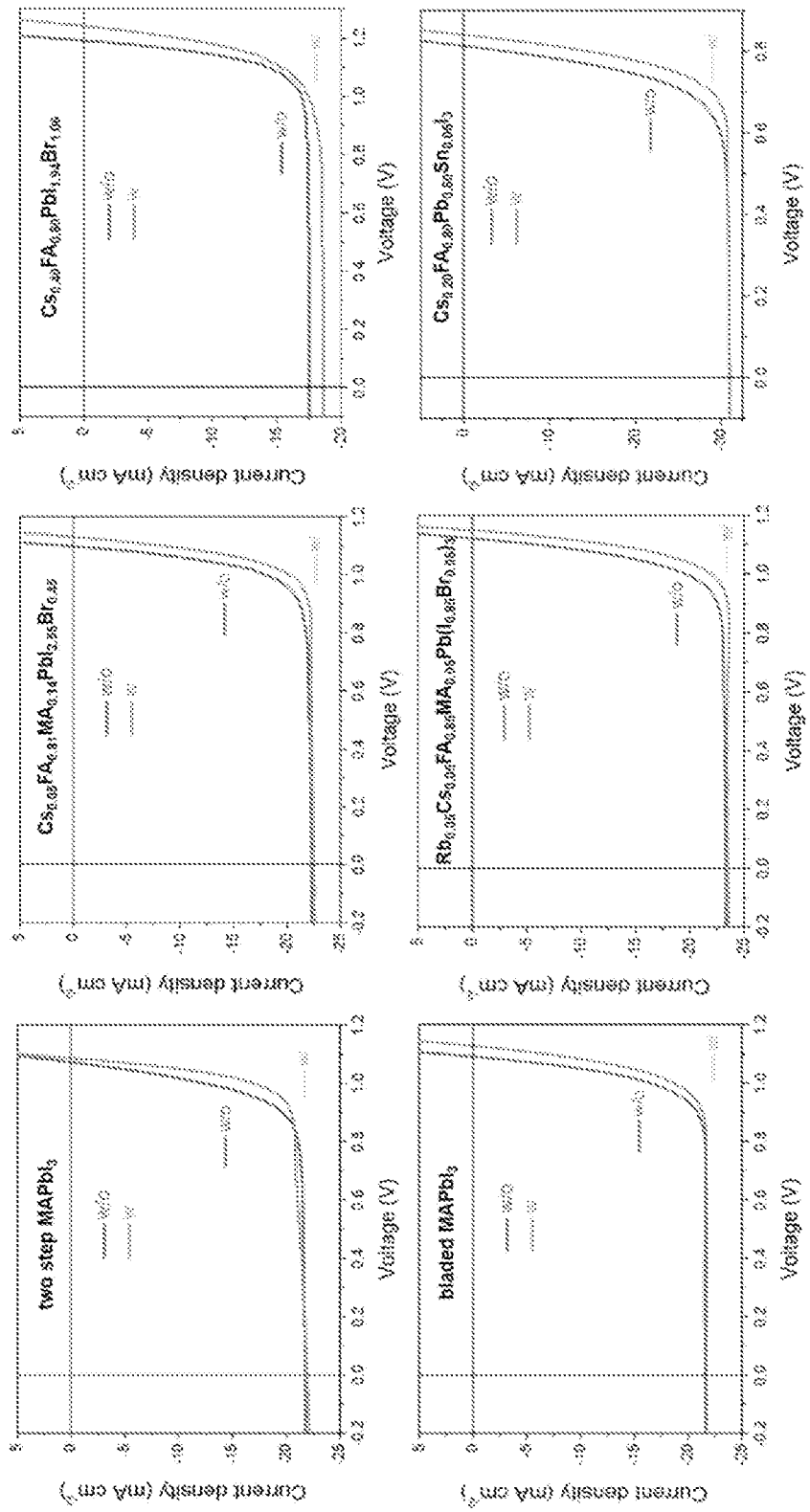
FIG. 16 shows reverse-sweep J-V curves of control and tape-treated PSCs with various compositions prepared via the methods described herein.
Figure 48:
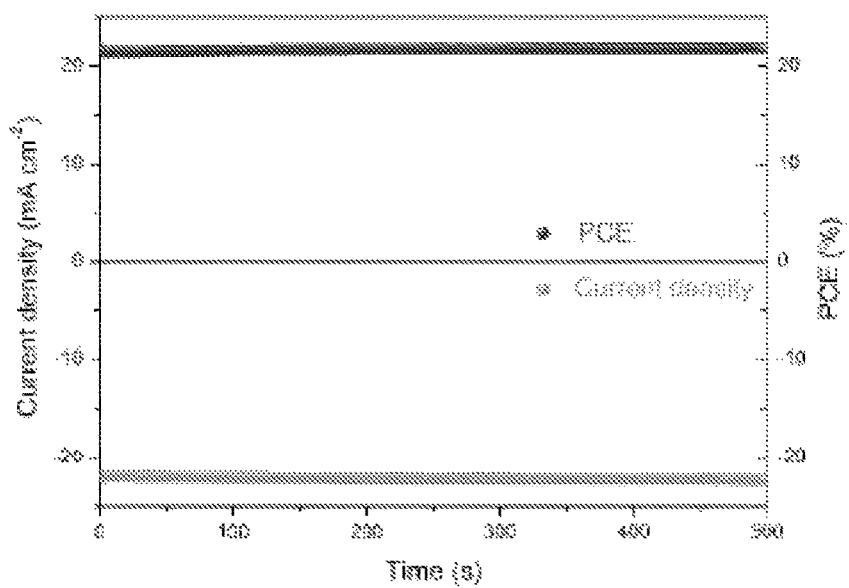
FIG. 48 shows current density and steady-state power output of a $Rb_{0.5}Cs_{0.05}FA_{0.85}MA_{0.05}PbI_{2.85}Br_{0.15}$ device with tape treatment measured at a fixed bias of 0.98 V.
Figure 49:
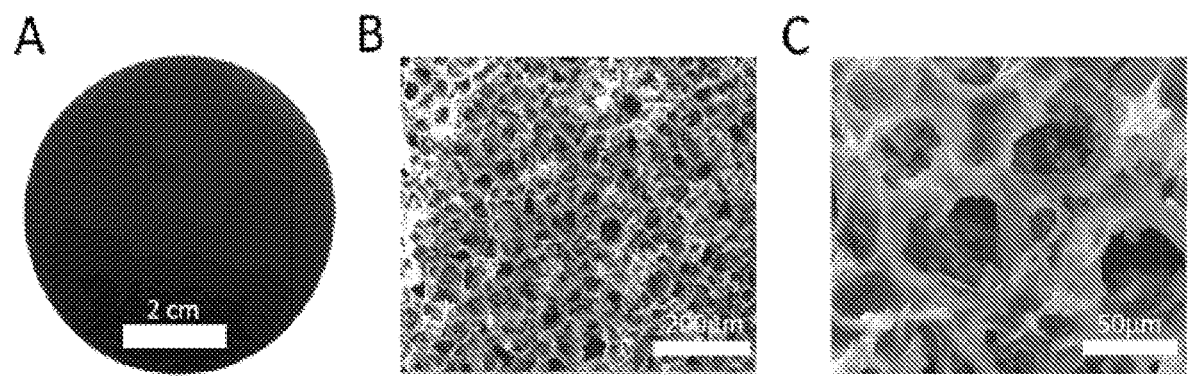
FIG. 49 shows a photo (A) and SEM images (B) and (C) of a ChemoMet soft pad used in investigations described herein.
Figure 50:
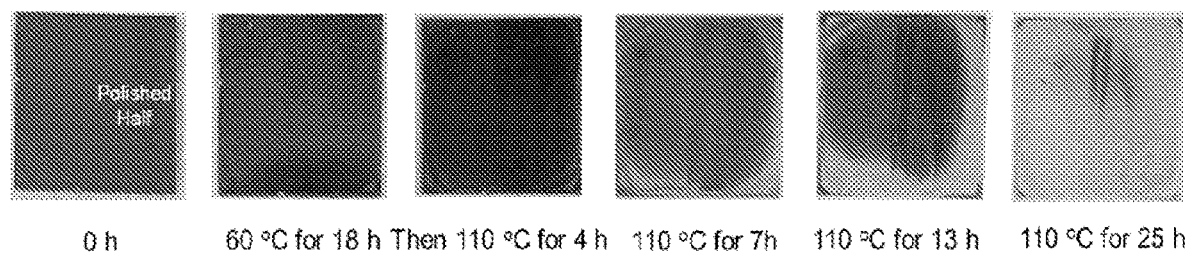
FIG. 50 shows photographs of polished and unpolished $MAPbI_3$ thin films that underwent a thermal stability test. The right half of the perovskite film was polished.
Figure 51:
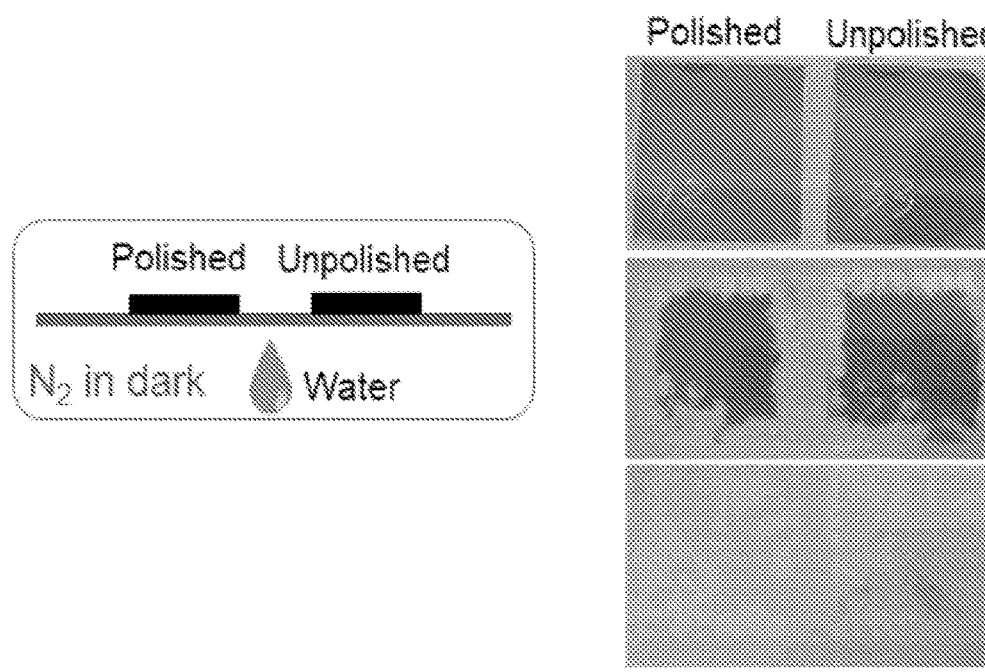
FIG. 51 shows photographs of polished and unpolished $MAPbI_3$ thin films that underwent a moisture stability test.
Figure 52:
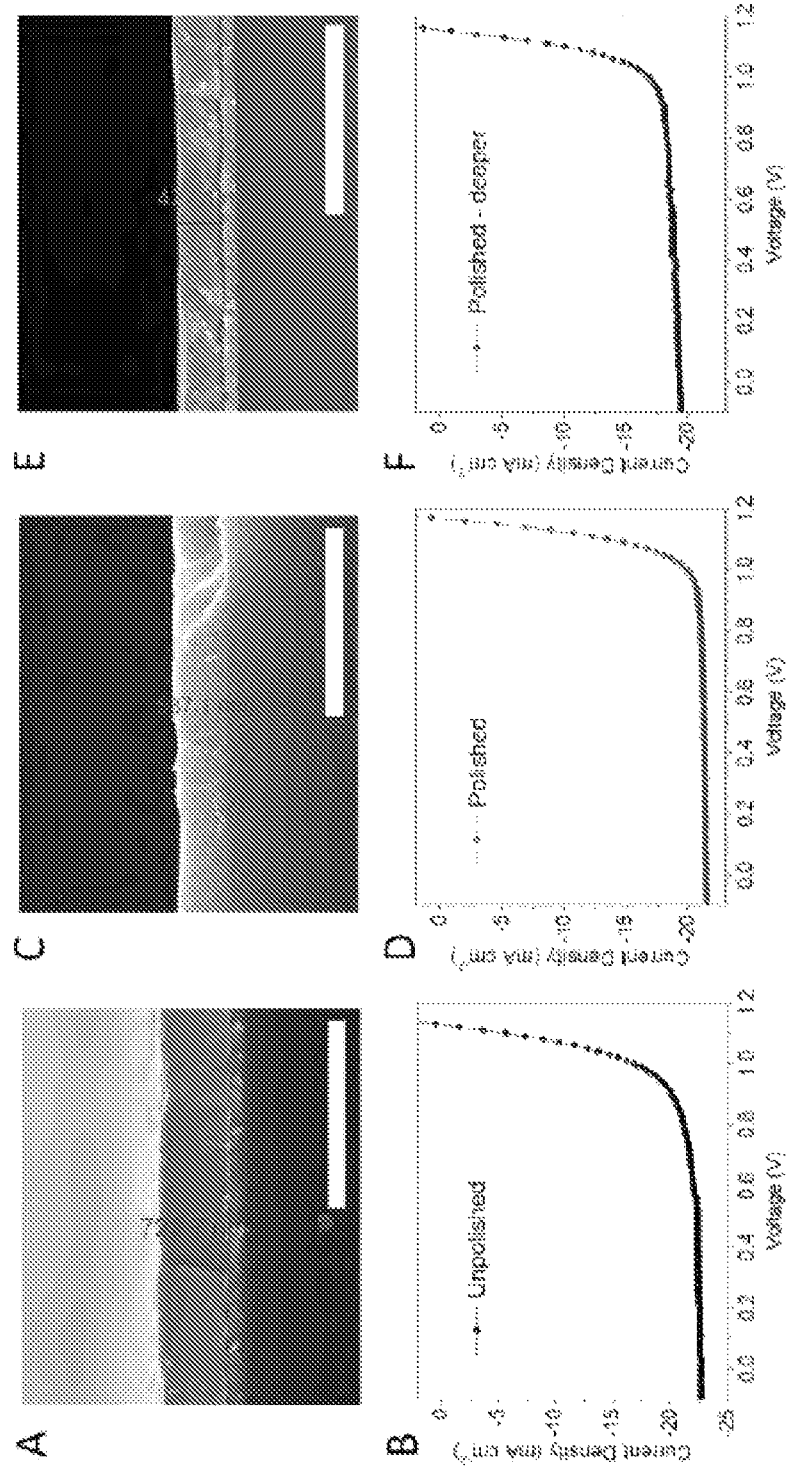
FIG. 52 shows images and data plots demonstrating the device performance of $MAPbI_3$ thin film solar cells varying with polishing depth. Cross-section SEM images and J-V curve of (A-B) unpolished devices. (C-D) polished devices, (E-F) deeper polished devices. The scale bar is 2 μm. The initial thin films were deposited with a thickness of ~730 nm, and cross-section SEM image is shown in inset "A". Then, the films were polished down to thicknesses of ~530 nm and ~440 nm, respectively, as shown by the cross-section SEM images in insets "C" and "E." $MAPbI_3$ thin film solar cells were fabricated with a device structure of ITO/PTAA/$MAPbI_3$/PCBM/C60/BCP/Cu using these films. The solar cell devices containing the polished films exhibited a higher VOC of 1.16-1.17 V and a higher FF of 0.80 compared to devices containing an unpolished film. Without wishing to be bound by theory, it is understood that the lower JSC of the devices containing polished films compared to devices containing unpolished ones is related to the reduced light absorption of thinner films after polishing. The device performances are summarized in Table 6.
Figure 53:
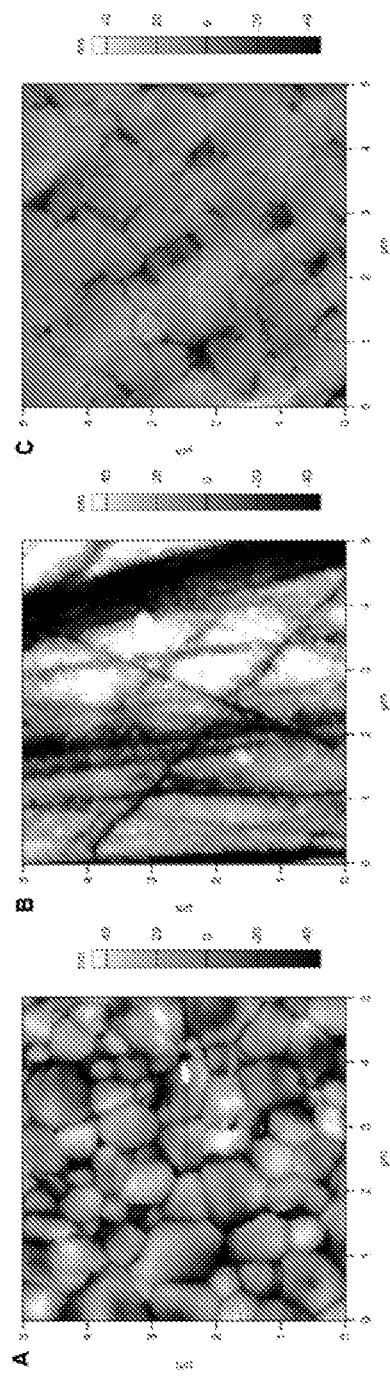
FIG. 53 shows AFM images of $MAPbI_3$ film surfaces with a detected area of 5×5 μm region, (A) before polishing; (B) polished using 3M sandpaper; and (C) polished using a ChemoMet pad.

| Tape treatment | $V_{oc}$ (V) | $J_{sc}$ (mA cm$^{-2}$) | FF | PCE (%) |
|---|---|---|---|---|
| without | 1.09 | 22.5 | 0.789 | 19.3 |
| with | 1.13 | 22.4 | 0.811 | 20.5 |
| with washed with toluene | 1.12 | 22.4 | 0.806 | 20.2 | cating that there are defective layers residing on the surface of all perovskites investigated. This appears to be a common phenomenon for perovskite films independent of compositions or preparation methods; however, the increases in peak intensity after tape treatment vary with perovskite compositions. $MAPbI_3$ films exhibited the largest XRD intensity increase after tape treatment. This result indicates that the $MAPbI_3$ film is perhaps one of the most facile compositions for forming defective regions on the film surface. This observation is in accordance with the HRTEM results for the composition, $Cs_{0.05}FA_{0.81}MA_{0.14}PbI_{2.55}Br_{0.45}$. FIG. 15 shows the co-existence of amorphous phase and high-crystallinity regions on the surface of $Cs_{0.05}FA_{0.81}MA_{0.14}PbI_{2.55}Br_{0.45}$ (CsFAMA) grains, while most of the $MAPbI_3$ film surfaces are covered by an amorphous phase. Without wishing to be bound by theory, this observation could be a result of the MA cations being more volatile and more able to escape the $MAPbI_3$ surfaces during thermal annealing (Ciccioli, A. & Latini, A. *J. Phys. Chem. Lett.* 9, 3756-3765, (2018); Turren-Cruz, S.-H., Hagfeldt, A. & Saliba, M. *Science* 362, 449-453, (2018)). Subsequently, PSCs based on these films were fabricated, the detailed device performance parameters for which are summarized in Table 4. The corresponding J-V curves are depicted in FIG. 16. The tape treatment works well on the perovskite compositions in improving efficiencies, with a PCE of 22.0% achieved for the $Rb_{0.05}Cs_{0.05}FA_{0.51}MA_{0.05}PbI_{2.85}Br_{0.15}$ (RbCsFAMA) based p-i-n structure devices (stabilized PCE of 21.8%, FIG. 48). It is also worth noting that the tape treatment increased the PCEs of Sn-containing narrow-bandgap (1.21 eV) PSCs with a composition of $Cs_{0.20}FA_{0.80}Pb_{0.50}Sn_{0.50}I_3$ from 18.6% to 20.2%, which is a significant improvement for Pb—Sn binary PSCs (Yang. Z. et al. *Nat. Commun.* 10, 4498-4506, (2019); Kapil, G. et al. *ACS Energy Lett.* 4, 1991-1998, (2019); Lin, R. et al. *Nat. Energy* 4, 864-873, (2019)).

TABLE 4

Photovoltaic parameters of the PSCs with and without tape treatment.

| Composition | Tape treatment | $V_{oc}$ (V) | $J_{sc}$ (mA cm$^{-2}$) | FF | PCE (%) |
|---|---|---|---|---|---|
| $MAPbI_3$ (one step) | without | 1.09 | 22.5 | 0.789 | 19.3 |
| | with | 1.13 | 22.4 | 0.811 | 20.5 |
| $MAPbI_3$ (two step) | without | 1.07 | 21.7 | 0.762 | 17.8 |
| | with | 1.09 | 21.9 | 0.784 | 18.7 |
| $MAPbI_3$ (doctor bladed) | without | 1.10 | 21.7 | 0.790 | 18.8 |
| | with | 1.13 | 21.5 | 0.806 | 19.6 |
| $Cs_{0.05}FA_{0.81}MA_{0.14}PbI_{2.55}Br_{0.45}$ (one step) | without | 1.09 | 22.3 | 0.788 | 19.2 |
| | with | 1.13 | 22.5 | 0.808 | 20.5 |
| $Rb_{0.05}Cs_{0.05}FA_{0.85}MA_{0.05}PbI_{2.85}Br_{0.15}$ (one step) | without | 1.12 | 23.3 | 0.788 | 20.6 |
| | with | 1.15 | 23.4 | 0.817 | 22.0 |
| $Cs_{0.40}FA_{0.60}PbI_{1.94}Br_{1.06}$ (one step) | without | 1.19 | 17.5 | 0.820 | 17.1 |
| | with | 1.24 | 18.6 | 0.763 | 17.6 |
| $Cs_{0.20}FA_{0.80}Pb_{0.50}Sn_{0.50}I_3$ (one step) | without | 0.81 | 31.0 | 0.743 | 18.6 |
| | with | 0.84 | 31.0 | 0.776 | 20.2 |

Figure 14:
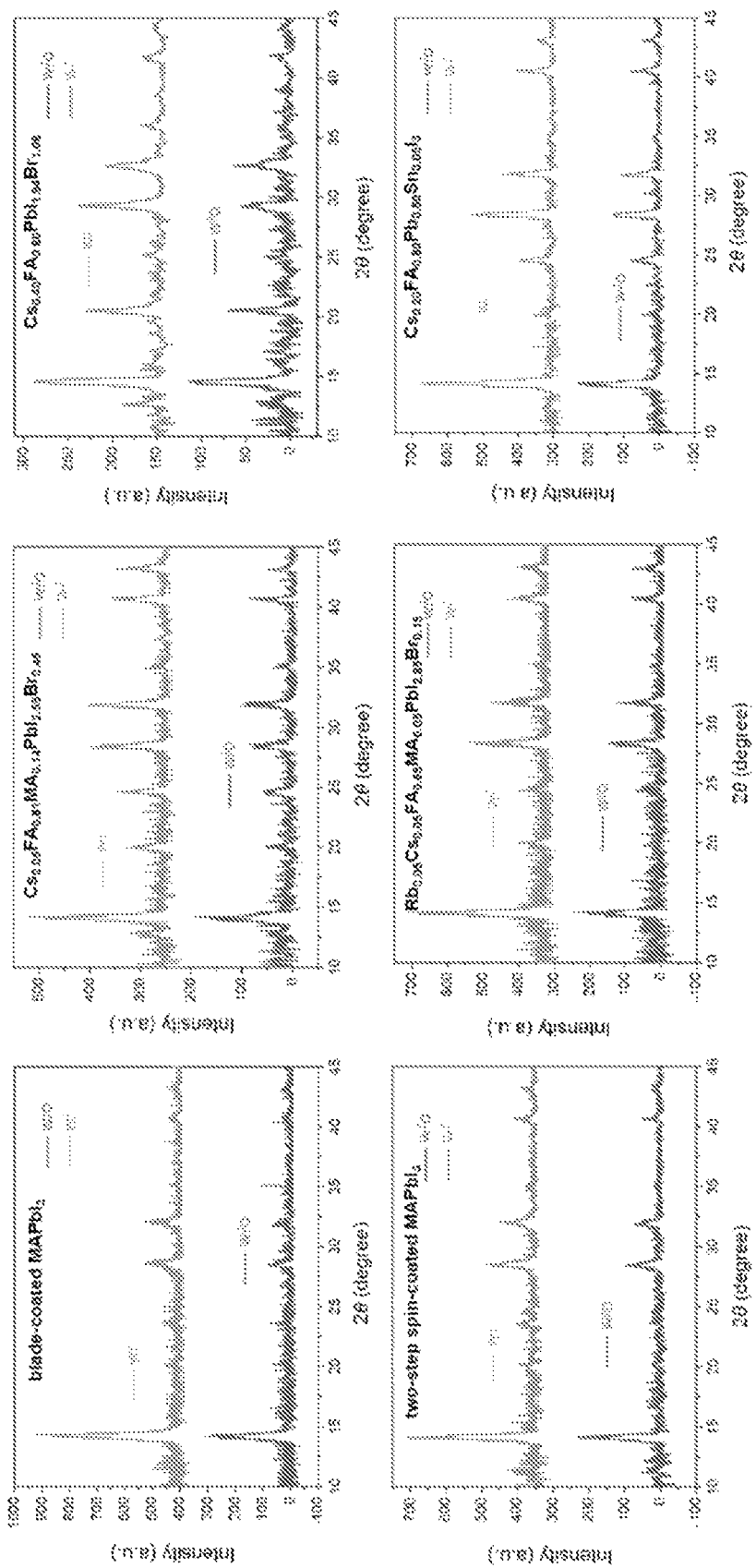
FIG. 14 shows grazing XRD spectra (vertically offset for clarity) of perovskite films with various compositions prepared via the methods described herein. The incident angle of X-ray is 0.1°.

To further test the broad applicability of the taping surface treatment method, the method was applied to a set of mixed cation and halide perovskite compositions containing cesium (Cs), rubidium (Rb) or tin (Sn), as well as $MAPbI_3$ films prepared via different methods, including one-step and two-step spin-coating methods and blade-coating. The grazing XRD spectra in FIG. 14 show enhanced XRD peak intensity after tape treatment on the perovskite films, indi- The stability of $MAPbI_3$ films prepared by the one-step method was tested under light-soaking condition with simulated AM 1.5G irradiation. Only half the area of each film was treated by tape so that the impact of film-to-film quality variation could be excluded in the stability study. As presented in FIG. 17A, the tape-treated right half still maintained its black perovskite phase after an eight-hour light soaking, while the control half already decomposed into yellow lead iodide phases in less than four hours, indicating that tape treatment can improve film light stability. Without wishing to be bound by theory, it is understood that the improved film stability can be attributed to the removal of the defective surface layer. However, the aforementioned adhesive residuals left on the top of the films can further encapsulate the perovskite films. This is supported by the worse light stability of the film after using toluene to wash off the residue adhesive, as shown in FIG. 18.

Figure 19:
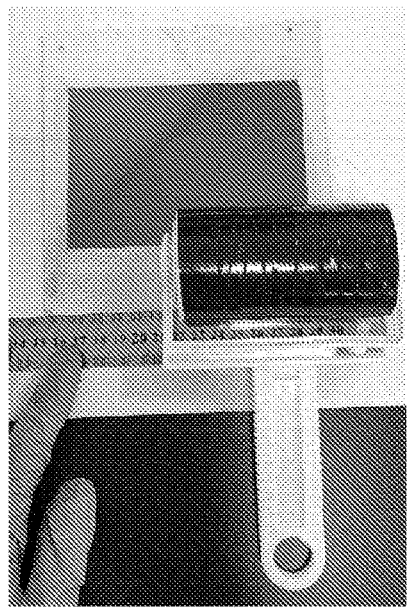
FIG. 19 shows a photograph of a person pressing a tape roller onto a large MAPbI$_3$ perovskite film (~100 cm²).

The taping surface treatment method can be used to stabilize large-area perovskite modules. To demonstrate this, tape was pressed from a wide tape roller onto a large area (~100 cm$^2$) blade-coated MAPbI$_3$ film (FIG. 19) and then light-soaked under simulated AM 1.5G intensity for 3.5 hours. As shown in FIG. 17B the tape-treated half exhibited much better light stability, and the uniformity of the tape treatment was good since no yellow spotting was observed. The speed of the pressing and peeling was tested and verified to be fast enough for integration into a roll-to-roll fabrication line with linear process speed in excess of 500 mm s$^{-1}$, which is the fast coating speed reported for scalable perovskite coating (Deng, Y. et al. *Sci. Adv.* 5, eaax7537, (2019)). The surface treatment method is also economical. As such, the tape treatment methods described herein hold great promise in the scalable fabrication of stable and efficient perovskite solar modules.

Figure 20:
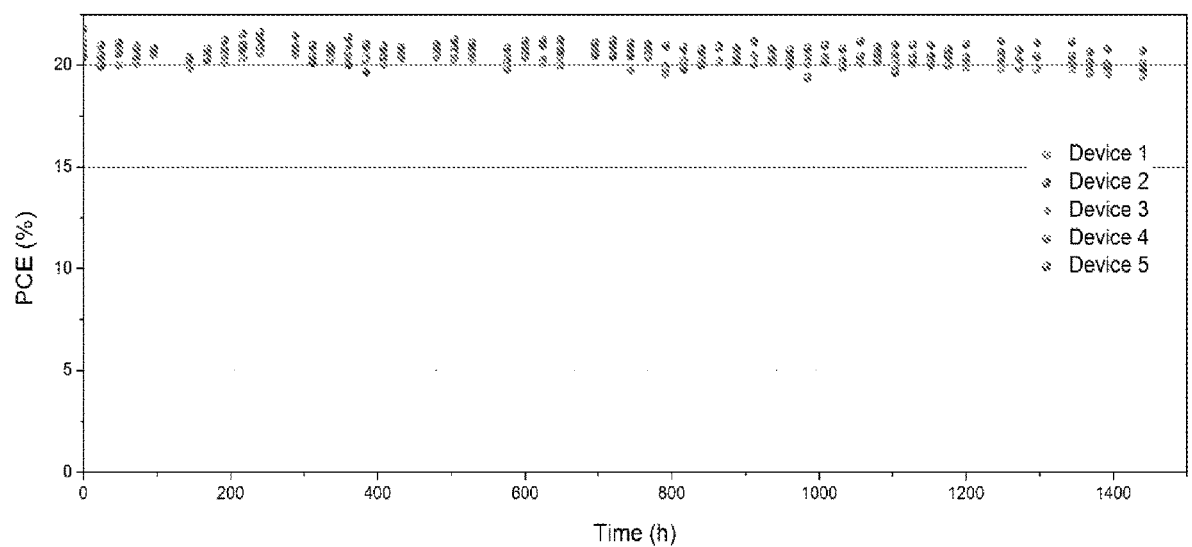
FIG. 20 shows the operational stability test of five encapsulated solar cell devices based on Rb$_{0.05}$Cs$_{0.05}$FA$_{0.85}$MA$_{0.05}$PbI$_{2.85}$Br$_{0.15}$ perovskite active layers with tape treatment.

Long-term operational stability of encapsulated RbCs-FAMA perovskite devices were tested under a plasma lamp with a light intensity equivalent to AM 1.5G in air with a relative humidity of ~60±10% (Yang, S. et al. *Science* 365, 473-478, (2019)). The light source contained a substantial ultraviolet component and no ultraviolet filter was used during the stability test. All devices were loaded with a resistor so that they worked at maximum power point (MPP) at the beginning of the tests. Instead of monitoring device stability at a reduced temperature of ~25° C. which can cause the overestimation of solar cell stability, the stability test was conducted at real operation temperature (Chen, B. et al. *Adv. Mater.* 31, 1902413-1902420, (2019)). Light illumination also heated the perovskite devices to ~65° C. measured at the glass surface. The PCE of an encapsulated control device degraded rapidly from 19.1% to 14.7% after testing for 324 hours (FIG. 17C). Conversely, the efficiency of a tape treated device only slightly dropped to 97.1% of its initial efficiency after light soaking for 1440 hours. These results indicate the high stability of the PSC in relation to other PSCs tested under these real operation conditions (Jung, E. H. et Nature 567, 511-515, (2019); Yang, S. et al. *Science* 365, 473-478, (2019); Christians, J. A. et al. *Nat. Energy* 3, 68-74, (2018); Arora. N. et al. *Science* 358, 768-771, (2017); Bai, S. et al. *Nature* 571, 245-250, (2019); Bi, D. et al. *Nat. Commun.* 9, 4482-4491, (2018); Wang, L. et al. *Science* 363, 265-270, (2019)). The operational stability of another five tape-treated devices was further investigated to check the reproducibility of the strategy. The stability data in FIG. 20 shows that tape-treated devices remained 95.2±1.9% of initial efficiencies after light soaking for over 1400 hours. This indicates the tape treatment method has a very good reproducibility and is thus promising for scalable manufacturing of perovskite modules.

Example 1A: Additional Example Showing Efficacy of Taping Method

Patterned ITO glass substrates were first cleaned by ultrasonication with soap, acetone, and isopropanol. The hole transport layer PTAA with a concentration of 2 mg mL$^{-1}$ dissolved in toluene was spin-coated at the speed of 4,000 rpm for 35 s and then annealed at 100° C. for 10 min. Before depositing the perovskite films, the PTAA film was pre-wetted by spinning 80 µl DMF at 4,000 rpm for 15 s to improve the wetting property of the perovskite precursor solution. The perovskite precursor solution was prepared by dissolving methylammonium iodide (MAI, 214.6 mg) and lead iodide (622.4 mg) into mixed solvent (DMF/DMSO=9:1). Then, 40 µl precursor solution was spun onto PTAA at 2.000 rpm for 5 s and 4,000 rpm for 20 s, and the film was quickly washed with 130 µl toluene at 7 s during spin-coating. Subsequently, the sample was annealed at 65° C. for 10 min and 100° C. for 10 min. For the perovskite films treated with the tape, a piece of 3M PVC electrical tape was pressed onto the top of the perovskite films, then the tape was carefully peel the tape off the film. The devices were finished by thermally evaporating C60 (30 nm). BCP (6 nm) and copper (80 nm) in sequential order.

Figure 7:
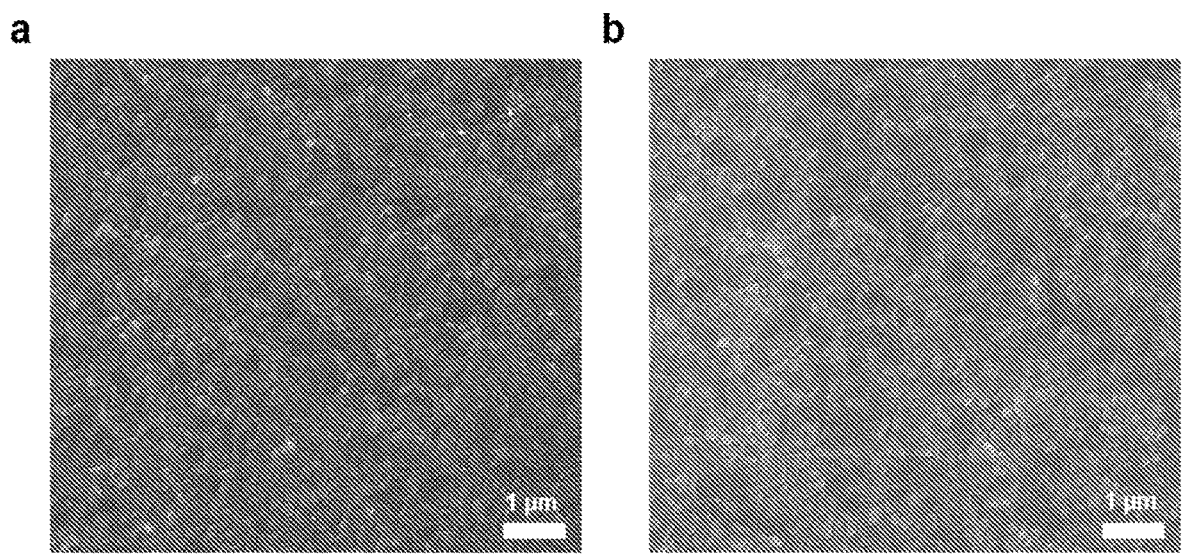
FIG. 7 shows top-view SEM images of the MAPbI$_3$ films (a) without and (b) with tape treatment.

FIG. 7 shows the J-V curves the control and tape peel-off perovskite devices. The control device had a $J_{sc}$ of 22.7 mA cm$^{-2}$, a $V_{oc}$ of 1.09V and a FF of 0.75, yielding a PCE of 18.6%. The tape treatment helped increase all the device parameters with a $V_e$ of 1.11 V, a $J_{sc}$ of 22.9 mA cm$^{-2}$, a FF 0.76 and thus a high PCE of 19.3%.

FIG. 8 shows the light stability test results of the unencapsulated MAPbI$_3$ control and tape peel-off devices. The control device completely died after 2.5-hour light soaking, while the tape-treated counterpart was able to survive for 7.5 hours, indicating the tape treatment can significantly improve the stability of MAPbI$_3$ devices.

Example 1B: Surface Treatment Using a Roller

Figure 21:
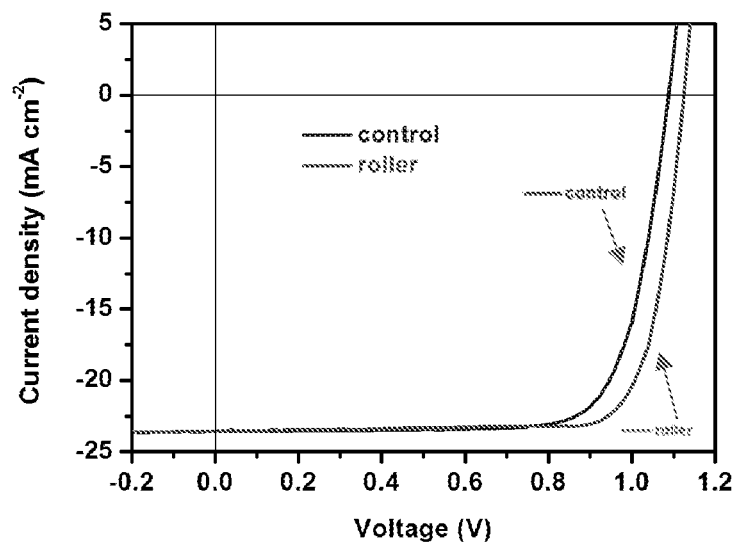
FIG. 21 shows J-V curves of the control and roller-pressed RCFM perovskite solar cells.
Figure 22:
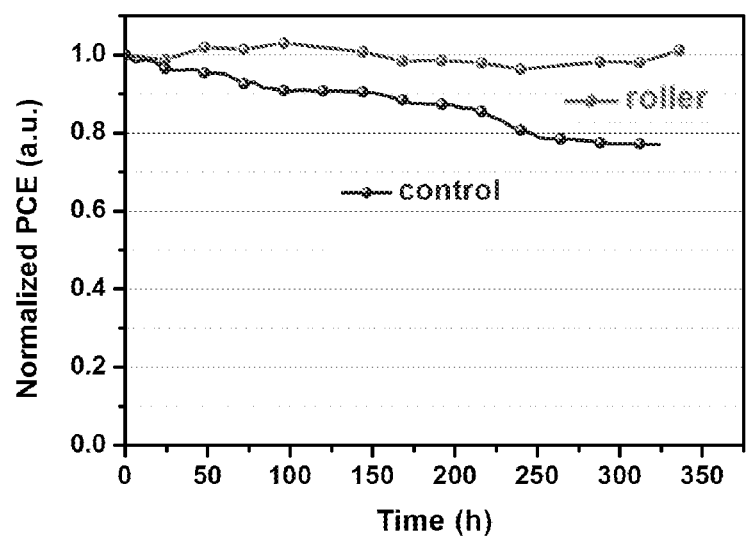
FIG. 22 shows the light stability test results of encapsulated control and roller-pressed RCFM perovskite solar cells.
Figure 23:
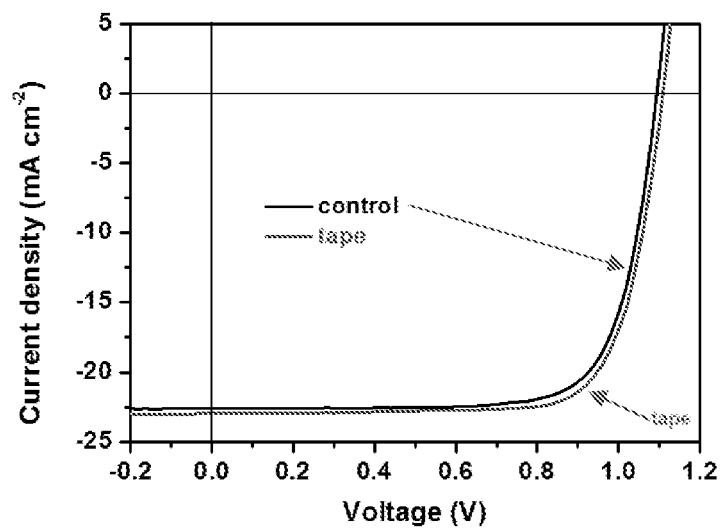
FIG. 23 shows J-V curves of a MAPbI$_3$ perovskite solar cell with and without tape surface treatment.
Figure 24:
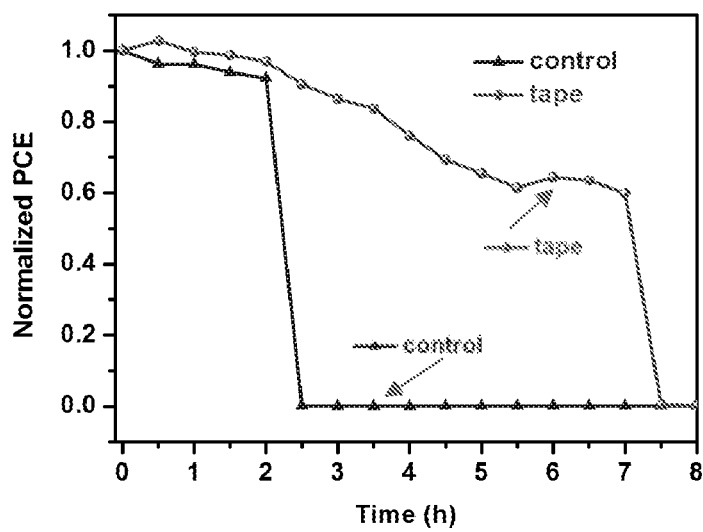
FIG. 24 shows light stability test results of an unencapsulated MAPbI$_3$ perovskite solar cell with and without surface tape treatment.

Patterned ITO glass substrates were first cleaned by ultrasonication with soap, acetone, and isopropanol. The hole transport layer PTAA with a concentration of 2 mg ml$^{-1}$ dissolved in toluene was spin-coated at a speed of 4,000 rpm for 35 s and then annealed at 100° C. for 10 min. Before depositing the perovskite films, the PTAA film was pre-wetted by spinning 80 µl DMF at 4,000 rpm for 15 s to improve the wetting property of the perovskite precursor solution. The perovskite precursor solution was prepared by dissolving rubidium iodide, cesium iodide, formamidinium iodide, formamidinium bromide, methylammonium bromide and lead iodide into a mixed solvent (DMF/DMSO=4:1) with a composition of Rb$_{0.05}$Cs$_{0.05}$FA$_{0.85}$MA$_{0.05}$PbI$_{2.85}$Br$_{0.15}$ (RCFM). Then, 40 µl of the precursor solution was spun onto PTAA at 2,000 rpm for 2 s and 4,000 rpm for 20 s, and the film was quickly washed with 130 µl chlorobenzene for 17 s during spin-coating. Subsequently, the sample was annealed at 100° C. for 10 min. For the perovskite films with surface treatment, a roller coated with a rubber-resin adhesive was pressed onto the top of the perovskite films, and rolled from side to side. The devices were finished by thermally evaporating C60 (30 nm), BCP (6 nm) and copper (80 nm) in sequential order. FIG. 21 presents the J-V curves for the control and roller pressed RCFM perovskite devices. The control device had a $V_{oc}$ of 1.09 V, a $J_{sc}$ of 23.5 mA cm$^{-2}$, and a FF of 0.77, yielding a PCE of 18.6% N. The tape treatment helped increase all of the device parameters, with a $V_{oc}$ of 1.12 V, a $J_{sc}$ of 23.6 mA cm$^{-2}$, a FF of 0.80, and thus a high PCE of 21.1%. FIG. 22 shows the light stability results of the encapsulated control and roller pressed RCFM perovskite devices. The roller pressed RCFM perovskite film based device exhibited better light stability, and no degradation was observed in more than 300-hour light soaking, while the control device degraded to 80% of its initial PCE.

Methods and Materials—Mechanical Polishing Methods

Materials

Chemicals and solvents were purchased from Sigma-Aldrich and Greatcell Solar Materials and were used without further purification. 3M sandpaper (Item No: 37-948 from Zona) and ChemoMet polishing pad (CHEMOMET, Item No: 407902, purchased from Buehler) were used. The 3M sandpaper featured micro-finishing sand with 1 μm size $Al_2O_3$ microparticles. The ChemoMet polishing pad was a soft, porous, chemically resistant synthetic polishing pad. A SEM study was conducted on the ChemoMet polishing pad, which indicated that it had a porous structure. In most experiments, the ChemoMet polishing pad was used for fine polishing of the perovskite samples, and the 3M sandpaper was used for coarse polishing. The Buehler pad comprised organosilicon polymers.

Mechanical Polishing Methods

For the polished perovskite samples used in TEM, XPS, GIXRD, devices, and nanoindentation and temperature dependent conductivity tests, the MHP films were polished using a ChemoMet soft compound pad and spin-coater. First, the films were fixed on the spin-coater. The abrasive paper was fixed on a metal flat block. Then, the paper was facing down and contacted the films with careful control. The top defective layers were polished off while the films spun at about 2250 rpm for 45s for each cycle with 2. This procedure can remove of about 45±10 nm thickness of the perovskite film.

Unless stated otherwise, the samples for film stability measurements were half-side polished by a ChemoMet polishing pad 60 times. For the half-side polished MHP films the ChemoMet soft compound pad was taped on a flat knob facing downward on the films. Then, the knob was moved in one direction gently on the half side of films by hand with a slight vertical pressure (<1.5 MPa) for 60 times in 2 minutes.

The 3M sandpaper was used before the ChemoMet soft pad, when it was desirable to polish off at least 100 nm depth from the perovskite surface. Typically, the 3M sandpaper was first used to effectively reduce the film thickness and then the ChemoMet pad was used to fine polish the final surface. To polish off 96 nm depth, the polishing process was conducted at 2500 rpm spinning speed for 45s per cycle with 1 cycle using 3M $Al_2O_3$ sandpaper and following 2 cycles using the ChemoMet soft pad. To polish off 118 nm depth, the same procedures were followed, but extended to a polishing time of 60s in the first step (only when using 3M sandpaper). To polish off 142 nm depth, the same procedures above were followed, but the polishing time was extended to 90s in the first step (only when using the 3M sandpaper).

For all of the samples prepared using the methods above, an antisolvent (ethyl acetate) was used to clean the sample by spin-coating it on the surface of the film after polishing.

Fabrication of MHP Solar Cells

PTAA films were first deposited on cleaned ITO substrates by spin coating PTAA in a toluene solution (2 mg mL$^{-1}$) at 6000 rounds per minute (rpm). The as-prepared films were then thermally annealed at 100° C. for 10 min. Following this, the perovskite layers were fabricated on PTAA-coated substrates. All the perovskite precursor solutions were prepared with the stoichiometric ratios. The details of the perovskite depositions for varied compositions are detailed below:

$MAPbI_3$ Composition:

The perovskite precursor solution was dissolved in a mixed solvent of dimethyl formamide (DMF) and dimethyl sulfoxide (DMSO) with a volume ratio of DMF:DMSO of 9:1. The 80 μL $MAPbI_3$ precursor solution (1.3 M) was spun onto PTAA at 2000 rpm for 2 s and 4000 rpm for 20 s, and at the $10^{th}$ second, the sample was quickly washed with 130 μL toluene during spin-coating. Subsequently, the $MAPbI_3$ samples were annealed at 70° C. for 10 min and 100° C. for 10 min.

$FA_{0.81}MA_{0.14}Cs_{0.05}Pb(I_{0.85}Br_{0.15})_3$ (CFM-Perovskite) Composition:

The perovskite precursor solution was dissolved in a mixed DMF and DMSO solvent with a volume ratio of DMF:DMSO of 4:1. The 80 μL CFM precursor solution (1.3 M) was spun onto PTAA at 2000 rpm for 2 s and 4000 rpm for 20 s, and at the $12^{th}$ second, the sample was quickly washed with 130 μL toluene during spin-coating. Subsequently, the CFI samples were annealed at 70° C. for 10 min and at 100° C. for 10 min.

$Cs_{0.4}FA_{0.6}Pb(I_{0.64}Br_{0.36})_3$ (CsFA-Perovskite) Composition:

The perovskite precursor solution was dissolved in a solvent mixture of DMF and DMSO with a 7:3 volume ratio of DMF:DMSO. The CsFA-perovskite precursor solution (1.35 M) was spin-coated on PTAA at 5000 rpm for 30s. The as-prepared transparent CsFA films turned brown under $N_2$ (~25 PSI) for 30 s, and then turned black under 100° C. annealing for 30 min.

For the polished MHP films and solar cells, the perovskite surface was polished with the mechanical polishing method as described above, before any layers were deposited on top of it.

Passivation Procedure

PCBM passivation. PCBM solution in o-dichlorobenzene (20 mg mL−1) was spin-coated on top of the $MAPbI_3$ perovskite layer at a speed of 6000 rpm, and then thermally annealed at 100° C. for 10 min.

Octylammonium Sulfate (OAS) Passivation

Octylammonium sulfate precursor solution was prepared by dissolving octylamine (Sigma-Aldrich, 99%) and sulfuric solution (Sigma-Aldrich, 99.999%) in mixed solvents (toluene/isopropanol=5:1) with a concentration of 4 mM. To treat the surface of the perovskite films, 100 μL of precursor solution was loaded onto the film and then spun at 6,000 rpm for 30 s, followed by thermal annealing at 100° C. for 10 min.

For solar cells investigated for device performance and stability measurements, the PCBM passivation layer was applied on the $MAPbI_3$ based solar cells, and both PCBM and the OAS passivation layers were applied on the CFM-perovskite based solar cells, respectively. No PCBM or OAS layer was included in the CsFA-perovskite based devices.

For TEM measurements conducted on the solar cells, the perovskite layers were connected to C60 layers without any interlayers in between.

Whether or not the devices had passivation treatments (PCBM or OAS passivation), the devices were completed by thermal evaporation of C60 (20 nm), BCP (8 nm), and Cu (80 nm). The device area was 8 mm$^2$.

Fabrication of MHP Samples for Stability Measurements
1) MAPbI$_3$ Thin Film Samples With Toluene Antisolvent MAPbI$_3$ thin films were deposited on substrates without a PTAA layer by using the same process implemented for the MAPbI$_3$ based solar cells described above.

2) MAPbI$_3$ Thin Film Samples With Ethyl Acetate Antisolvent

The 80 µL MAPbI$_3$ precursor solution (1.3 M) in mixed solvent (DMF:DMSO, v/v, 9:1), was spun onto substrates at 2000 rpm for 2 s and 4000 rpm for 20 s, and at the 10$^{th}$ second, the sample was quickly washed with 130 µL ethyl acetate during spin-coating. There was no thermal annealing.

3) Air-Flow Assisted Spin Coated MAPbI$_3$ Film

The 80 µL MAPbI$_3$ precursor solution (1.3 M) in mixed solvent (DMF:DMSO, v/v, 9:1), was spun onto substrates at 2000 rpm for 2 s and 4000 rpm for 20 s, and at the 10$^{th}$ second, the sample was blown under continuous N$_2$ (~25 PSI) during spin-coating. There was no thermal annealing.

4) Vacuum Assisted Spin Coated MAPbI$_3$ Film

The 80 µL MAPbI$_3$ precursor solution (1.3 M) in mixed solvent (DMF:DMSO, v/v, 9:1), was spun onto substrates at 2000 rpm for 2 s and 4000 rpm for 20 s, and at the 10$^{th}$ second, the sample was quickly washed with 130 µL toluene during spin-coating. Then, the sample was stored in the vacuum chamber for ten minutes without thermal annealing.

5) MAPbI$_3$ Film Fabricated by Interdiffusion Method

The 50 µL lead iodide (PbI$_2$) solution (650 mg mL$^{-1}$) in DMF was spun onto the substrates at 6000 rpm for 30 s, and the as-fabricated PbI$_2$ films were dried and annealed at 90° C. for 10 min. Then, 60 µL of a 65 mg ml$^{-1}$ methylammonium iodide (MAI) 2-propanol (IPA) precursor solution was spun onto the PbI$_2$ films, followed by a thermal annealing driven diffusion process at 100° C. for 30 min.

6) High Temperature Blade Coated MAPbI$_3$ Film

In the high temperature blade coating process, the solution used was 0.8 M MAPbI$_3$ in DMF. The solution was blade coated over the substrate at a speed of about 50 mm s$^{-1}$ on a hot plate set at 150° C.

7) Room Temperature Blade Coated MAPbI$_3$ Film

For room temperature blade coating, the solution used was 1.0 M MAPbI$_3$ in a mixed solvent of 40% 2-methoxyethanol and 60% acetonitrile with a small amount of DMSO (20% molar ratio to Pb$^{2+}$ ions). The coating speed was 99 mm/s with 20 PSI N$_2$.

8) CFM-perovskite and CsFA Perovskite Film

CFM-perovskite and CsFA perovskite thin films were deposited onto substrates without the PTAA layer, by using the same process in the solar cells based on CFM-perovskite and CsFA perovskite, respectively.

Device Characterization

Simulated AM 1.5G irradiation (100 mW cm$^{-2}$) was produced by a Xenon-lamp solar simulator (Oriel 67005, 150 W Solar Simulator) for current density-voltage (J-V) measurements. The light intensity was calibrated by a silicon diode (Hamamatsu S1133). Keithley 2400 Source-Meter was used for J-V measurements. Unless stated otherwise, the scanning rate was 0.1 Vs$^{-1}$, and the scanning direction for J-V measurements was from positive bias to negative bias (reverse scan) without a photomask. The area of the photomask was 6.08 mm$^2$. The EQE curves were characterized with a Newport QE measurement kit by focusing a monochromatic beam of light onto the devices.

Stability Tests

The effect of polishing treatment on stability was investigated on the perovskite films and solar cells. The stability of the non-encapsulated perovskite films was measured in air under illumination at 100 mW cm$^{-2}$. For stability characterization of the solar cells, the devices were encapsulated using epoxy with glass slides and operated with loads under illumination at 100 mW cm$^{-2}$, in air, with ultra-violet light and at around 65° C.

Fabrication and Characterization of Perovskite Light Emitting Diodes (LEDs)

The perovskite precursor solution for green LEDs was prepared by mixing CsI, PbBr$_2$, 3-(decyldimethylammonio)-propane-sulfonate inner salt (DPSI) in DMSO. The concentration of CsPbBr$_3$ was 0.25M and the DPSI concentration in the solution was 5 mg mL$^{-1}$. The solutions were filtered before use. The indium tin oxide (ITO)-coated glass substrates were sequentially cleaned in detergent, distilled water, acetone, and isopropanol by sonication. The cleaned substrates were treated in ultraviolet ozone for 15 min. Then, a PEDOT:PSS (AI 4083) aqueous solution was spin-coated at 3500 rpm for 40 s and baked at 125° C. for 30 min in ambient air. After that, the substrates were transferred into a nitrogen-filled glove box and perovskite solution was spin-coated on top of the substrate at 4000 rpm for 40 s, 500 µL chloroform was poured onto the perovskite film 20 s after the spin coating started. The perovskite films were annealed at 90° C. for 20 min. Finally, the fabrication of the LEDs was completed by thermally evaporating 1,3,5-Tris(1-phenyl-1H-benzimidazol-2-yl)benzene (TPBi) (40 nm), LiF (less than 1 nm), and an Al (100 nm) electrode. The device area was 0.10 cm$^2$ as defined by the overlapping area of the ITO and Al electrode. The current density (J)-voltage (V)-luminance characterization of the devices was performed in a N$_2$ glovebox without encapsulation. A Keithley 2400 source meter was used to measure the J-V data from 0 V to 7 V with a voltage scanning speed around 0.2 V s$^{-1}$. The luminance of the device was recorded simultaneously by Konica Minolta, LS-160, or a calibrated silicon photodiode (Hamamatsu, S2387 1010R) with an area of 10 mm*10 mm. The photodiode was placed on top of the LED to collect light. The EQE was calculated using a Lambertian profile and the obtained electroluminescence spectrum. The stability was measured in a glovebox under N$_2$.

FIB-TEM and SEM Characterization

The cross-section FIB sample lamella was prepared on a FEI Quanta 3D FEG instrument, and a low gallium ion beam current (28 pA for MAPbI$_3$ sample and 48 pA for CsFA samples) and voltage (5 kV) were applied during the final polishing process to minimize ion beam-induced sample damage. In general, the sample was lifted-out from the device with a 30 kV voltage and 30 pA current with a 1 um thickness. During the final thinning process, the voltage was set to 16 kV and the currents were 0.5 and 0.15 nA. Then, a final polish was done at 5 kV and 48 pA. The final lamella thickness was thinned/polished within 100 nm to ensure further characterization. Transmission electron microscopy (TEM) was performed on a FEI Talos F200X analytical scanning transmission electron microscope operating at 200 kV, and a low electron dose (100 e Å$^{-2}$) was applied to minimize the electron beam-induced artifacts (Rothmann M. et al., *Adr. Mater.* 30, 201800629 (2018)).

Scanning electron micrograph (SEM) images were taken on a FEI Helios 600 Nanolab Dual Beam System operating at 5 KV.

AFM Characterization

The atomic force microscope (AFM) images were scanned from an Asylum Research MFP3D Atomic Force Microscope. The scans conducted under tapping mode. The force constant of the cantilever was 40 N/m. The scanning rate was 0.5 Hz.

PL Intensity Mapping Measurements

PL mapping was conducted on a PicoQuant MT100 FLIM System with continuous N$_2$ flow on samples during room temperature measurements. A 485 nm pulsed laser (PicoQuant LDH-P-C-405B) with 1 MHz repetition was used as the excitation source, generating a pulse fluence of approximately 3 µJ cm$^{-2}$. The fluorescence mapping was conducted over a 10×10 µm region; the integration time was 7.8 ms/pixel for 78 nm pixels.

Nanoindentation Measurements

The mechanical properties of MHP films and single crystal were measured by Bruker Hysitron T1980 Triboindenter with a Berkovich Tip. All measurements were examined by a quartz reference check before tests. For MHP film samples with thicknesses of more than 500 nm, the indentation depth of 50 nm from the surface was measured to avoid any potential effects from the substrate (less than 10% of film thickness). For MHP bulk single crystal samples (1.5 mm-thick), the load force was fixed to measure the mechanical properties with a maximum indentation depth of 600 nm.

Ion Migration Activation Energy Characterization

The activation energy of ion migration was extracted from the dependence of the conductivity of the MAPbI$_3$ films on temperature. In short, a lateral structure device was used that consisted of two Cr (15 nm)/Au (25 nm) electrodes with a length of 1000 µm and a spacing gap of 50 µm deposited on the surface of MAPbI$_3$ polycrystalline films with and without polishing. In the measurement, a constant bias of 10 V was applied for all the devices. The measurements were performed in a Lakeshore Probe Station with white light through a quartz window. For each conductivity measurement, the current through the devices was stabilized for 5 minutes when an objective temperature was reached, before the current measurement was performed.

A semiconductor analyzer (Keithley 2400) was used for the current measurement with an applied bias of 10 V.

XPS Measurements

X-ray photoelectron spectroscopy (XPS) measurements were performed using a Kratos AXIS with Al Kα anode source (1486.6 eV) operating at 15 kV and 10 mA at 10$^{-8}$ Torr chamber pressure. A charge neutralizer was applied to minimize the energy drifting. The data were calibrated with the hydrocarbon C1s peak (284.8 eV) and processed by CasaXPS.

GIXRD Measurements

GIXRD measurements were conducted on a Rigaku SmartLab Diffractometer, which was configured in parallel beam with Cu Kα radiation (wavelength of 1.5418 Å). The incident angle was fixed at 0.22°, 1.5°, 2.20°, and 4.0°, respectively, and the scan axis was 2 theta. The penetration depth D(α), where the X-ray intensity was attenuated to 1/e, depends on the incident angle α as $$D(\alpha) = \frac{\sqrt{2}\lambda}{4\pi} \sqrt{\sqrt{(\alpha^2 - \alpha_c^2)^2 + 4\beta^2} + \alpha_c^2 - \alpha^2}.$$

Figure 25:
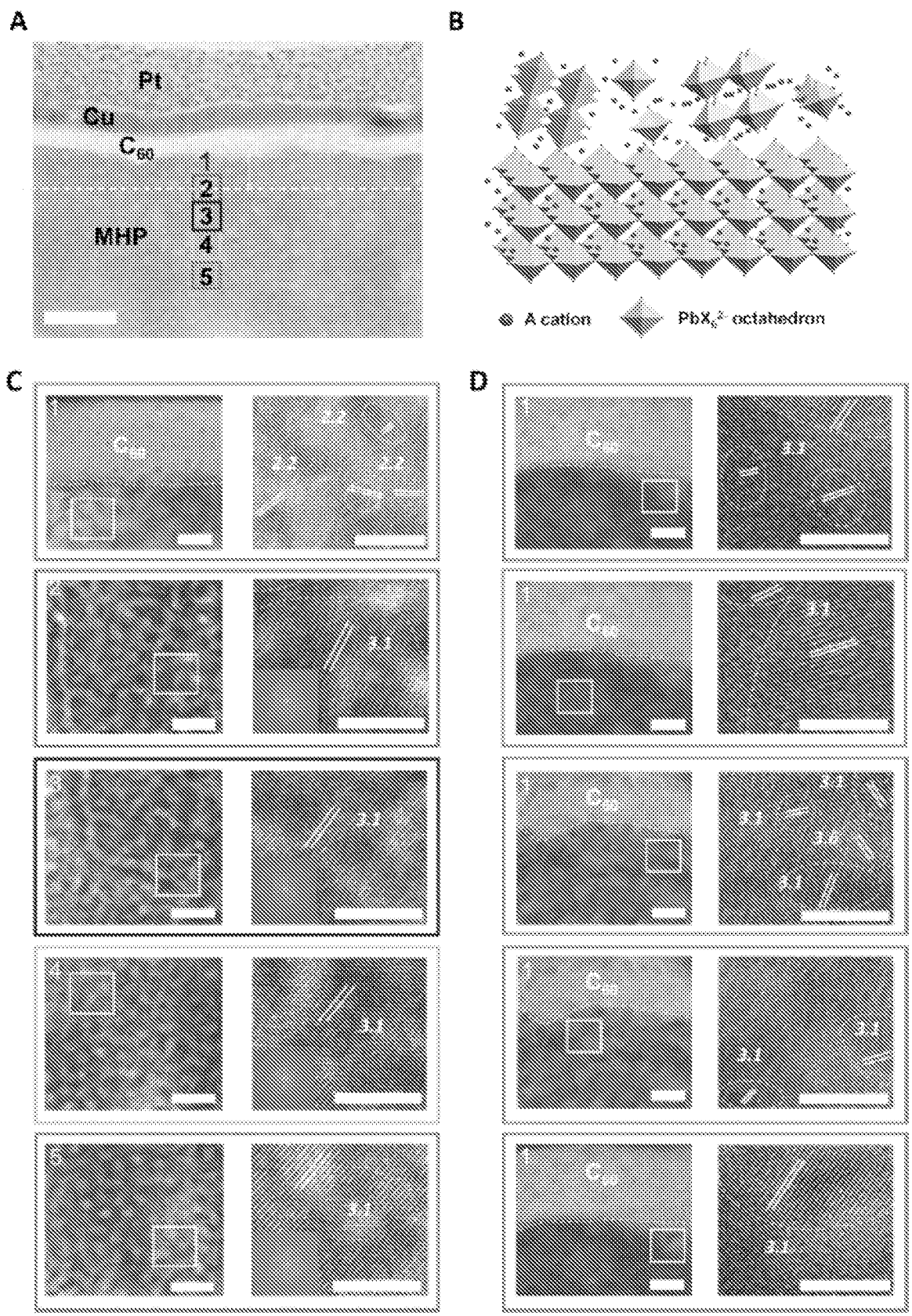
FIG. 25 shows (A) Cross-section TEM image of a device with a structure of ITO/PTAA/MAPbI$_3$/C$_{60}$/BCP/Cu. The interface area of region 1 is marked with "1". Locations 2-5 are marked by the squares for magnified HRTEM measurements. The scale bar is 100 nm. (B) Schematic illustration of the nanocrystals and amorphous-phase at the top surface of MHP polycrystalline films. (C) HRTEM images of MAPbI$_3$ at different positions 1-5 labelled in A, and (D) HRTEM images of another five positions randomly selected at the interface of MAPbI$_3$ and C60. All the scale bars in the left column are 10 nm, and all the scale bars in the right column are 5 nm. The area marked in white squares in the left columns were zoomed in in the right columns. The boundaries of the nanocrystals, as well as the boundaries between the perovskite and C60 in C and D are marked with a dashed line.

First, the morphology of MHP polycrystalline films was examined by cross-sectional HRTEM. The TEM images as shown in FIG. 25 were acquired at 5 different depths from a MAPbI$_3$ perovskite grain surface (i.e. C60/MHP interface) to the interior with locations labeled in a. The crystallographic orientation of the lattice at each location was determined by fast Fourier transformation (FFT) of the lattice, which are shown by the insets of the images in c. As shown in c of FIG. 25, the crystalline MAPbI$_3$ with an interplanar spacing of 3.1 Å exhibited locations inside the perovskite grain, corresponding to the (220) plane of MAPbI$_3$. There was no change in crystallographic orientation or any extended defects such as dislocations or twin boundaries from the grain interior up to the region of tens of nanometers below the top surface inside the single-grain. In contrast, the top surface of the MAPbI$_3$ layer with a thickness of 30-50 nm (region 1 shown in a and c) was mostly composed of nanocrystals, which is indicated by the dash lines in c and d of FIG. 25. An area without a clear crystalline structure from FFT imaging is referred as an amorphous phase region. Multiple randomly selected locations were scanned near the MAPbI$_3$/C60 interface at region 1 (marked in a) to verify this phenomenon. The HRTEM images are shown in d of FIG. 25. Again, both nanocrystals and amorphous regions were observed at the top surface of MAPbI$_3$ at every location measured. Some locations at interface region 1 exhibited other interplanar spacings of 2.2 Å corresponding to the crystal plane (224) in c of FIG. 25 and 3.6 Å corresponding to the crystal plane (202) as shown in d of FIG. 25. The morphology study further evidences the presence of a large density of defective regions close to the MAPbI$_3$ film top surface area, which is illustrated in b of FIG. 25.

Figure 26:
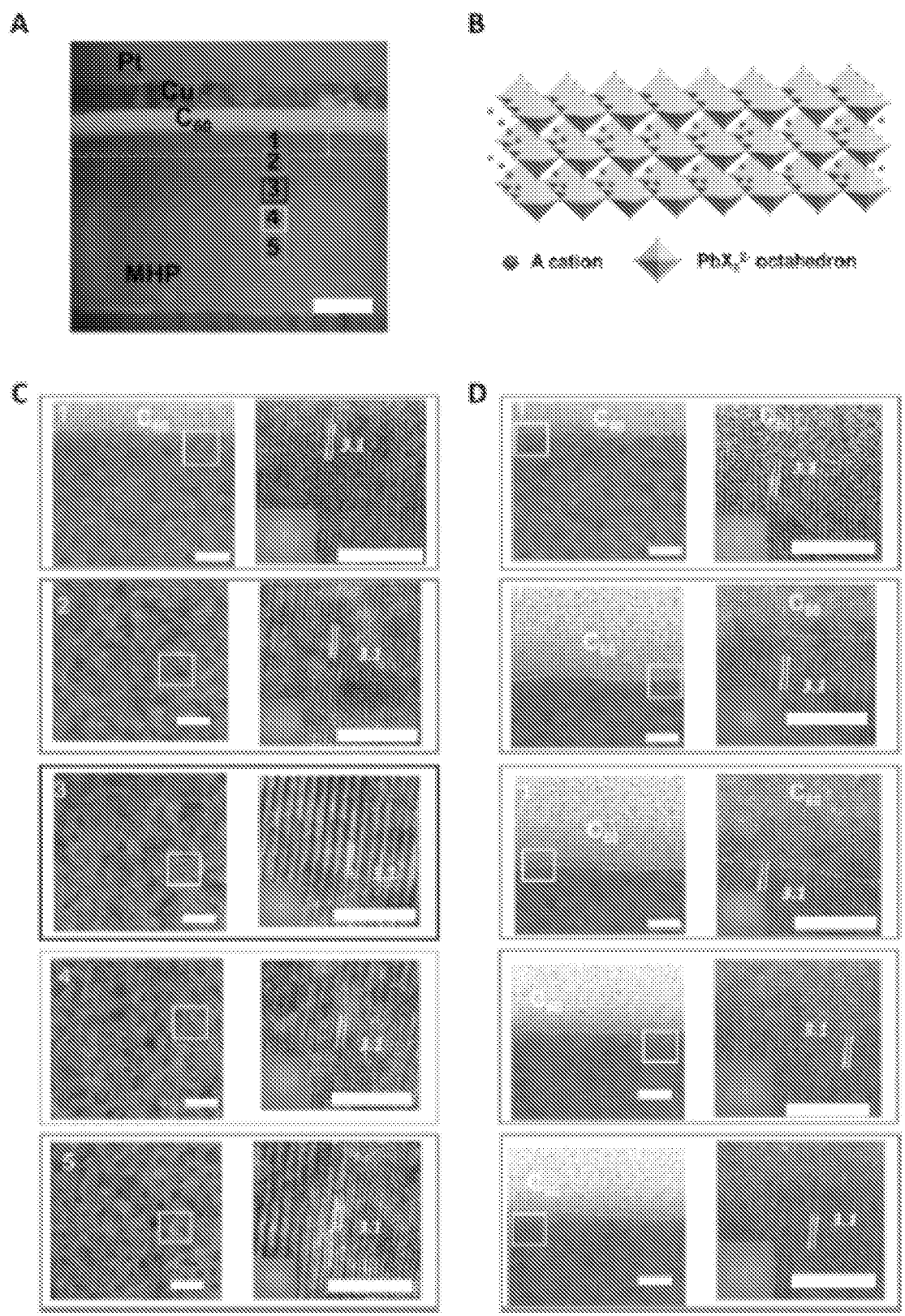
FIG. 26 shows the morphology at the top surface of polished MAPbI$_3$ thin films. (A) Cross-section TEM image of a device with structure of ITO/PTAA/polished MAPbI$_3$/C60/BCP/Cu. The interface area of region 1 is marked with "1". Locations 2-5 are marked by the squares for zoomed-in HRTEM measurements. The scale bar is 100 nm. (B) Schematic illustration of the top surface of polished MHP polycrystalline films. (C) HRTEM images of polished MAPbI$_3$ at different positions 1-5 labelled in A, and (D) the HRTEM images of another five positions randomly selected at the interface of polished MAPbI$_3$ and C60. All the scale bars in the left column are 10 nm, and all the scale bars in the right column are 5 nm. The area marked in squares in the left columns were zoomed-in in the right columns. The boundaries between perovskite and C60 in C and D are marked with a dashed line.

A mechanical polishing process using a ChemoMet soft pad as an abrasive paper was investigated to see whether it could remove the surface defective layer. HRTEM images as shown in FIG. 26 were acquired at 5 different depths from the surface of a polished MAPbI$_3$ perovskite film. C in FIG. 26 shows that both the surface and inside the perovskite grain have a crystalline structure with an interplanar spacing of 3.1 Å, corresponding to the (220) plane. In contrast to the as-cast perovskite films, the top surface of the polished MAPbI$_3$ layer did not show any nanocrystals or an amorphous region, as shown in c and d in FIG. 26. These results confirm that the applied polishing process can efficiently remove the surface defective layer.

X-ray photoelectron spectroscopy (XPS) and grazing incidence X-ray diffraction (GIXRD) measurements were conducted to investigate the chemical and structural properties of the top surface layer of MAPbI$_3$ films without and with polishing. From the XPS results shown in FIG. 27, the unpolished MAPbI$_3$ surface showed a molar ratio of N:Pb:I of 0.6:1:2.2. In contrast, the polished perovskite surface showed a N:Pb:I ratio of 0.8:1:2.7, which is closer to the stoichiometric ratio (1:1:3) of MAPbI$_3$. As seen here, more defects, such as MA and I vacancies, exist on the surface of as-cast MAPbI$_3$ films, compared to the polished films.

The GIXRD measurements in FIG. 28A show the X-ray penetration depth versus X-ray incident angle, giving an X-ray penetration depth of about 5 nm into MAPbI$_3$ with an incident angle of 0.3°. The GIXRD patterns in FIG. 28B show that PbI$_2$ exists on the surfaces of unpolished perovskite films, but is absent from the surfaces of polished perovskite films. This result is consistent with the XPS results, as polishing off of the defective layer that is rich in PbI$_2$ made the N:Pb:I ratio on the surface much closer to the stoichiometric ratio of MAPbI$_3$.

Figure 29A:
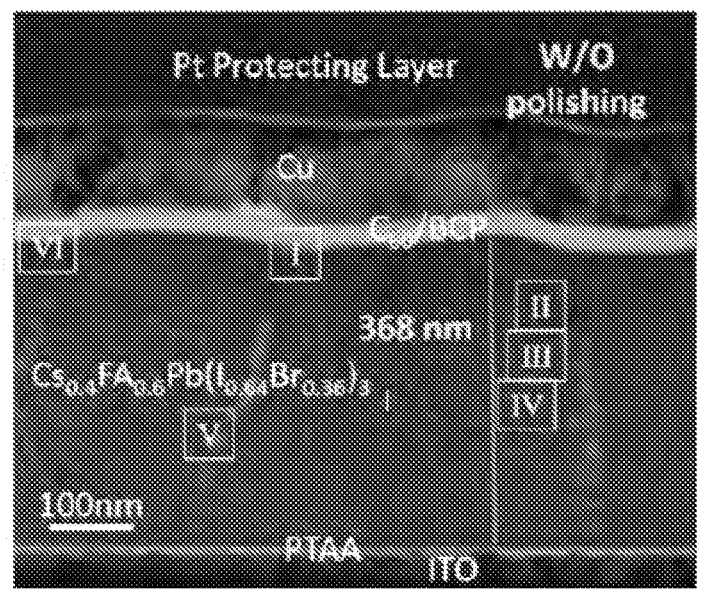
FIG. 29A shows a cross-section TEM image of CsFA-perovskite solar cell devices without polishing. Six different locations were randomly chosen to study, including two at the C60/CsFA-perovskite interface and four inside the perovskite film, in each CsFA-perovskite device were selected, and all locations marked. At each location, there were 6 zoomed-in images with an area of 100 nm$^2$ at different positions, which resulted in 36 HRTEM images shown in FIG. 29B-FIG. 29D.
Figure 29B:
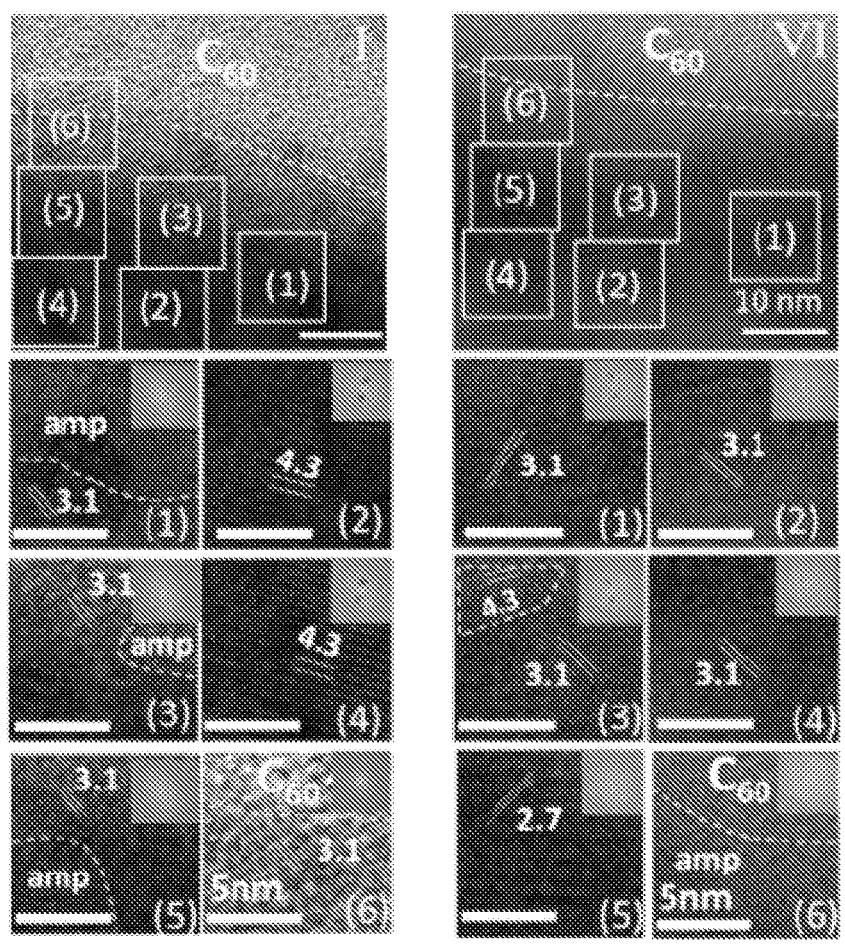
FIG. 29B shows HRTEM images at interface locations I and VI of CsFA-perovskite solar cell devices without polishing. Crystal planes and amorphous phase (amp) are marked. FFT patterns shown in each zoomed-in image, and the {110} crystal planes are marked in circles. All the scale bars in the top figures are 10 nm; and all the scale ban in the bottom zoomed in figures are 5 nm. The boundaries of nanocrystals, as well as the boundaries between perovskite and C60, are marked with dashed lines.
Figure 29C:
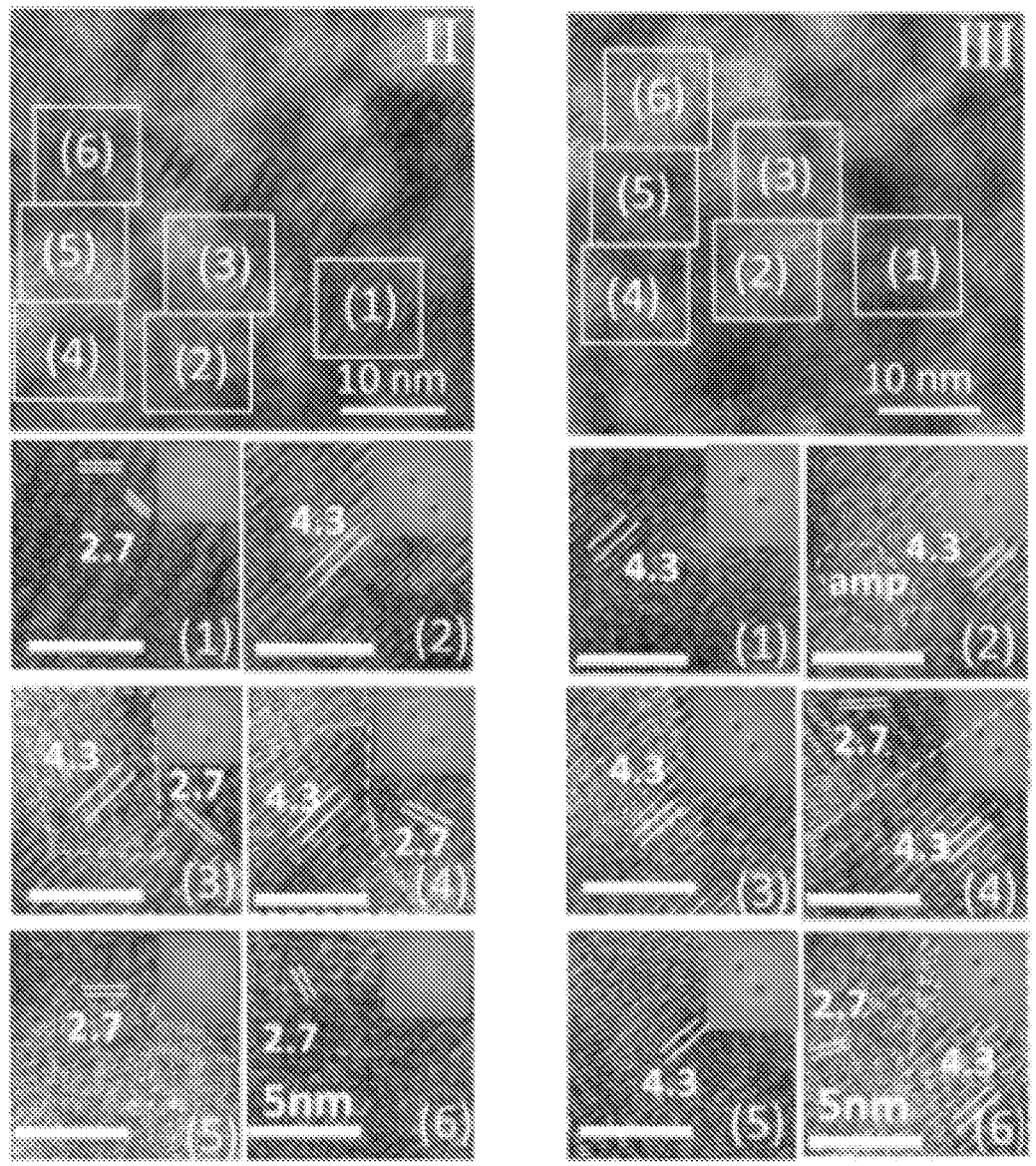
FIG. 29C shows HRTEM images at interior locations H and III of CsFA-perovskite solar cell devices without polishing. Crystal planes and amorphous phase (amp) are marked. FFT patterns are shown in each zoom-in image, and the {110} crystal planes are marked in circles.
Figure 29D:
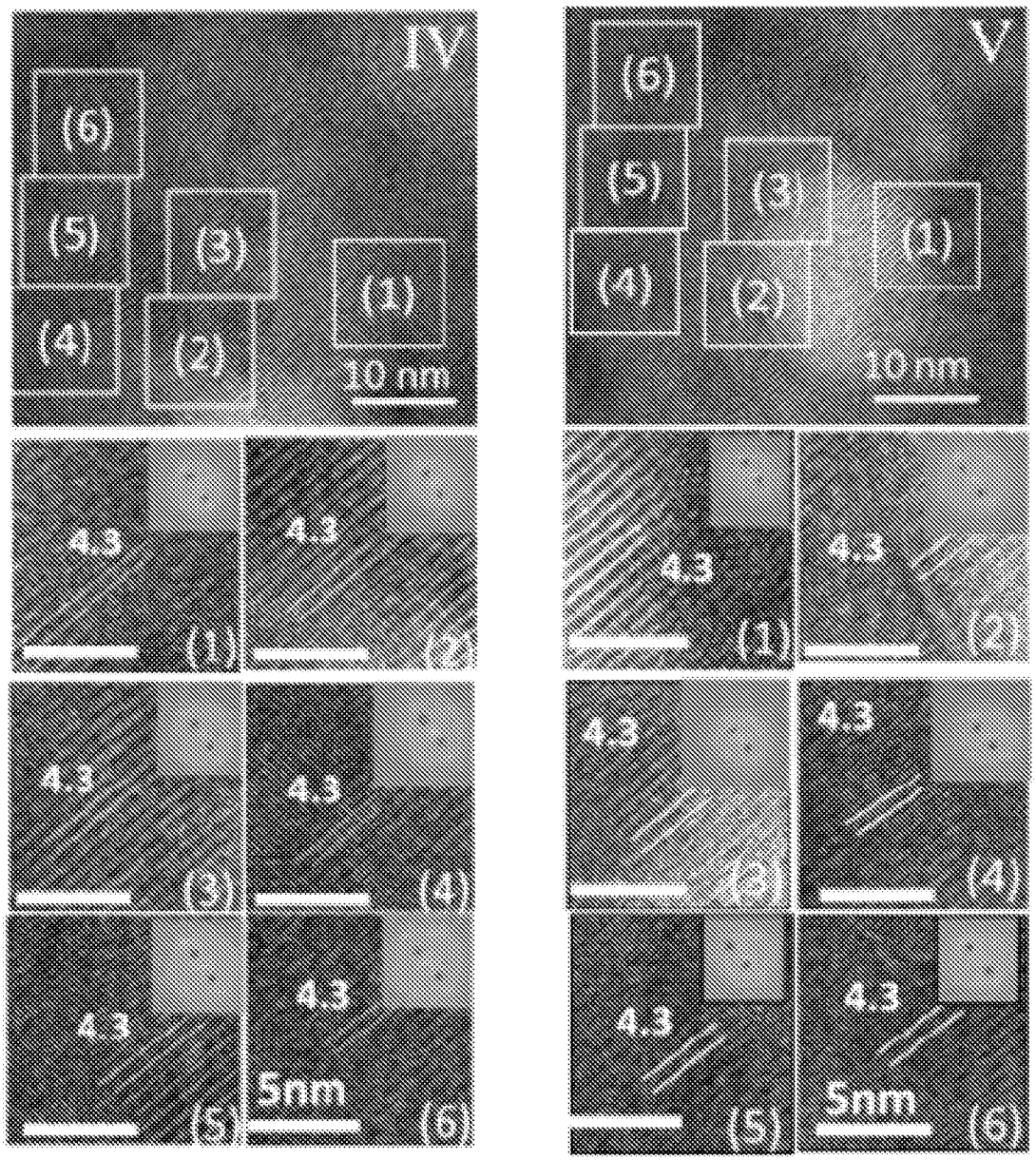
FIG. 29D shows HRTEM images at interior locations IV and V of CsFA-perovskite solar cell devices without polishing. Crystal planes are marked. FFT patterns are shown in each zoomed-in image, and the {110} crystal planes are marked in circles.
Figure 30:
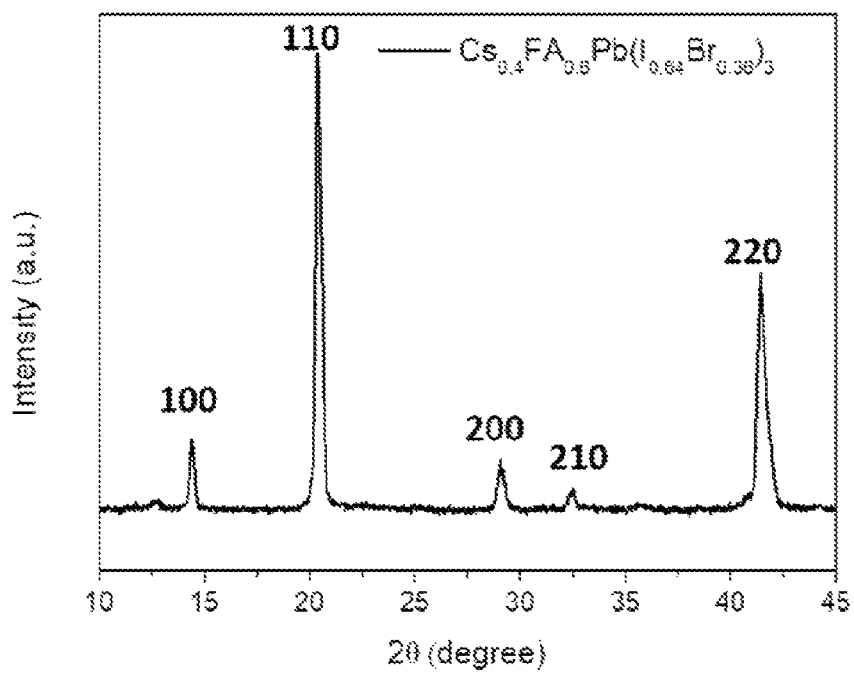
FIG. 30 shows an X-ray diffraction (XRD) pattern of a CsFA-perovskite thin film.
Figure 31A:
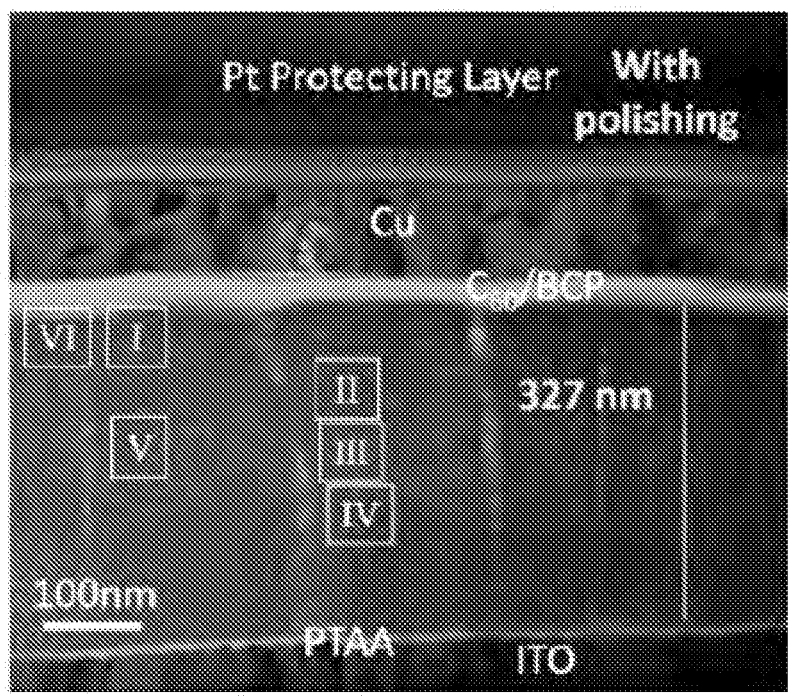
FIG. 31A shows a cross-section TEM image of CsFA-perovskite solar cell devices with polishing treatment. Six different locations were randomly chosen for study, including two at the C601CsFA-perovskite interface and four inside the perovskite film, in each CsFA-perovskite device selected, and all locations marked. At each location, there were 6 zoomed-in images with an area of 100 nm$^2$ at different positions, which resulted in 36 HRTEM images shown in FIG. 31B-31D.
Figure 31B:
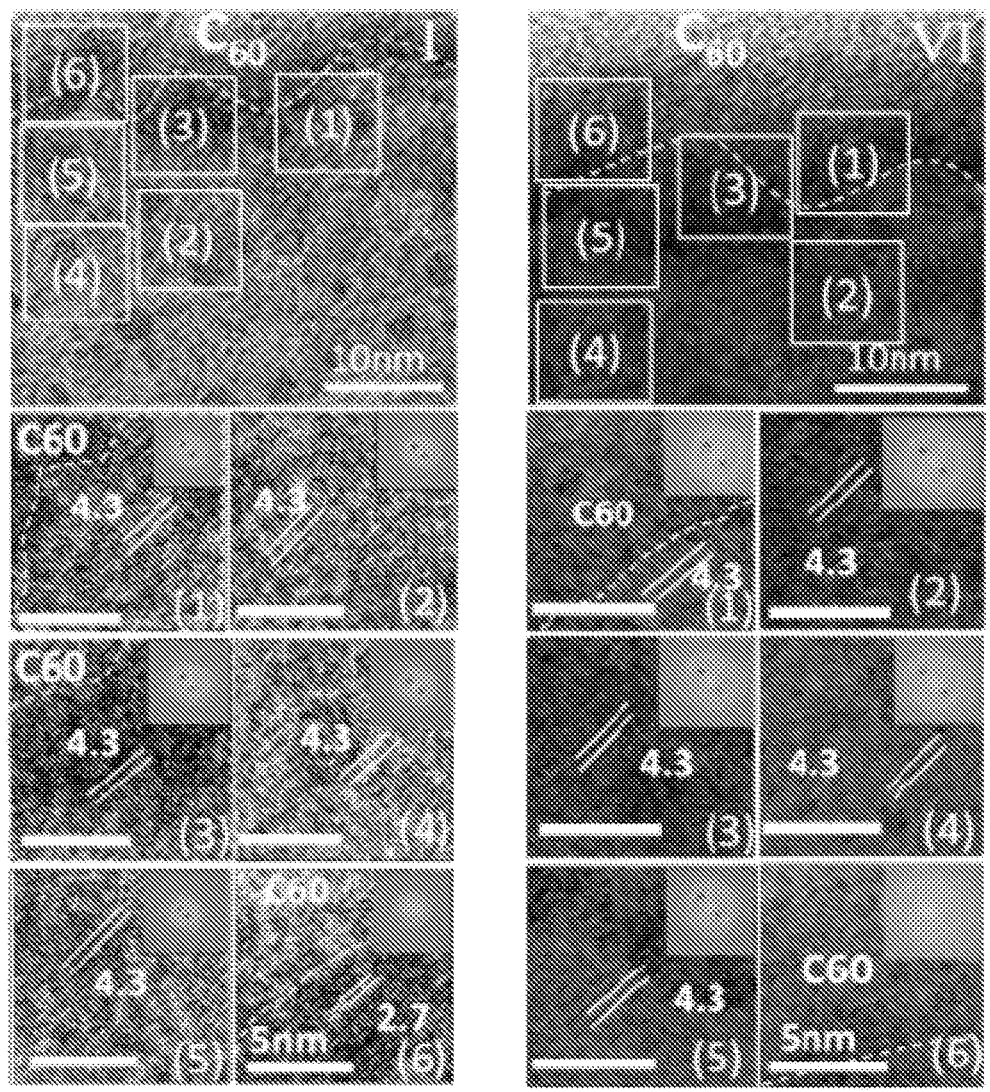
FIG. 31B shows HRTEM images at interface locations I and VI of CsFA-perovskite solar cell devices with polishing treatment. Crystal planes are marked. FFT patterns are shown in each zoomed-in image, and the {110} crystal planes are marked in circles. All the scale bars in the top figures are 10 nm; and all the scale bars in the bottom zoomed-in figures are 5 nm. The boundaries of the nanocrystals, as well as the boundaries between perovskite and C60, are marked in dashed lines.
Figure 31C:
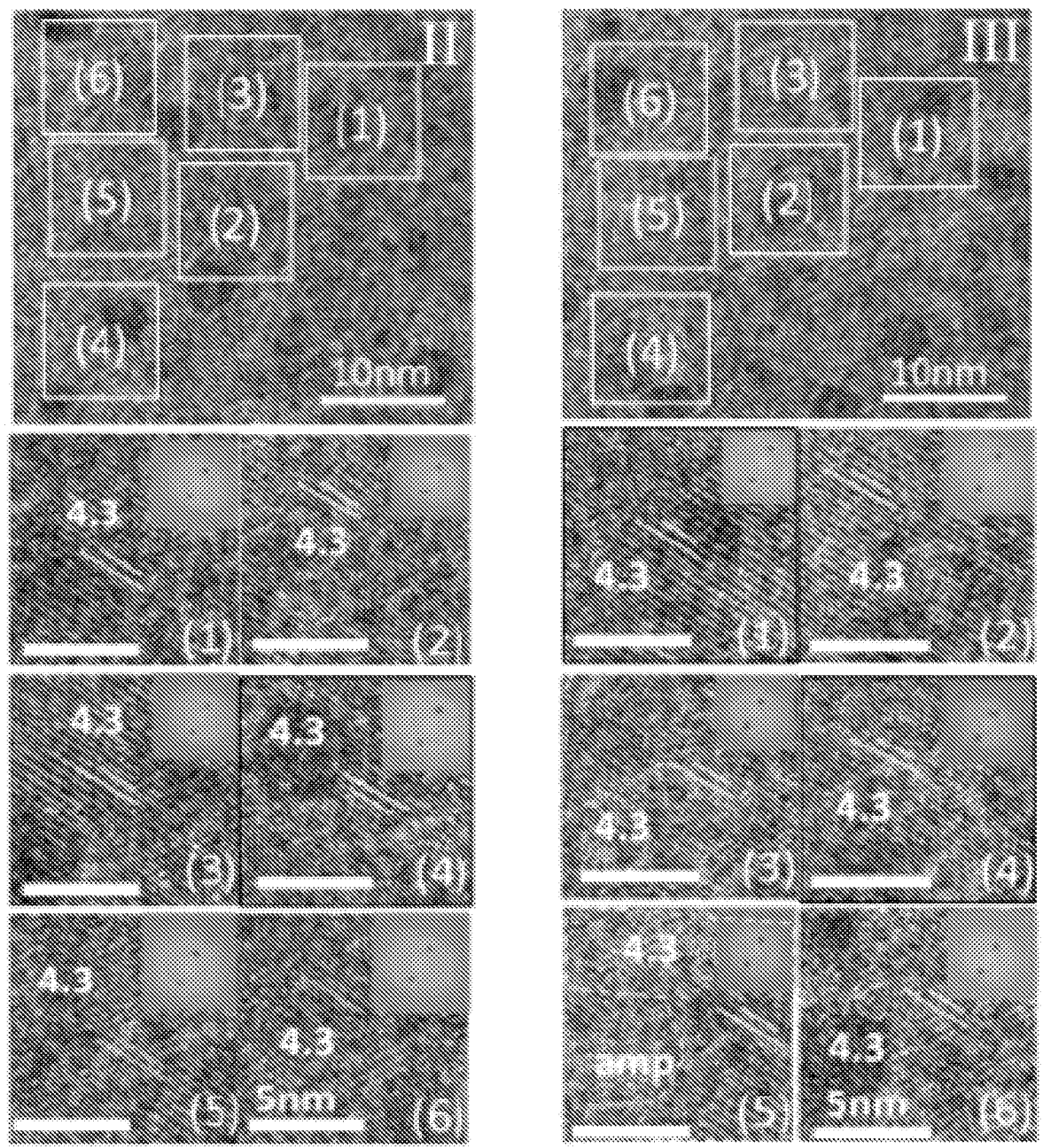
FIG. 31C shows HRTEM images at interior locations II and III of CsFA-perovskite solar cell devices with polishing treatment. Crystal planes and amorphous phase (amp) are marked. FFT patterns are shown in each zoomed-in image, and the {110} crystal planes are marked in circles.
Figure 31D:
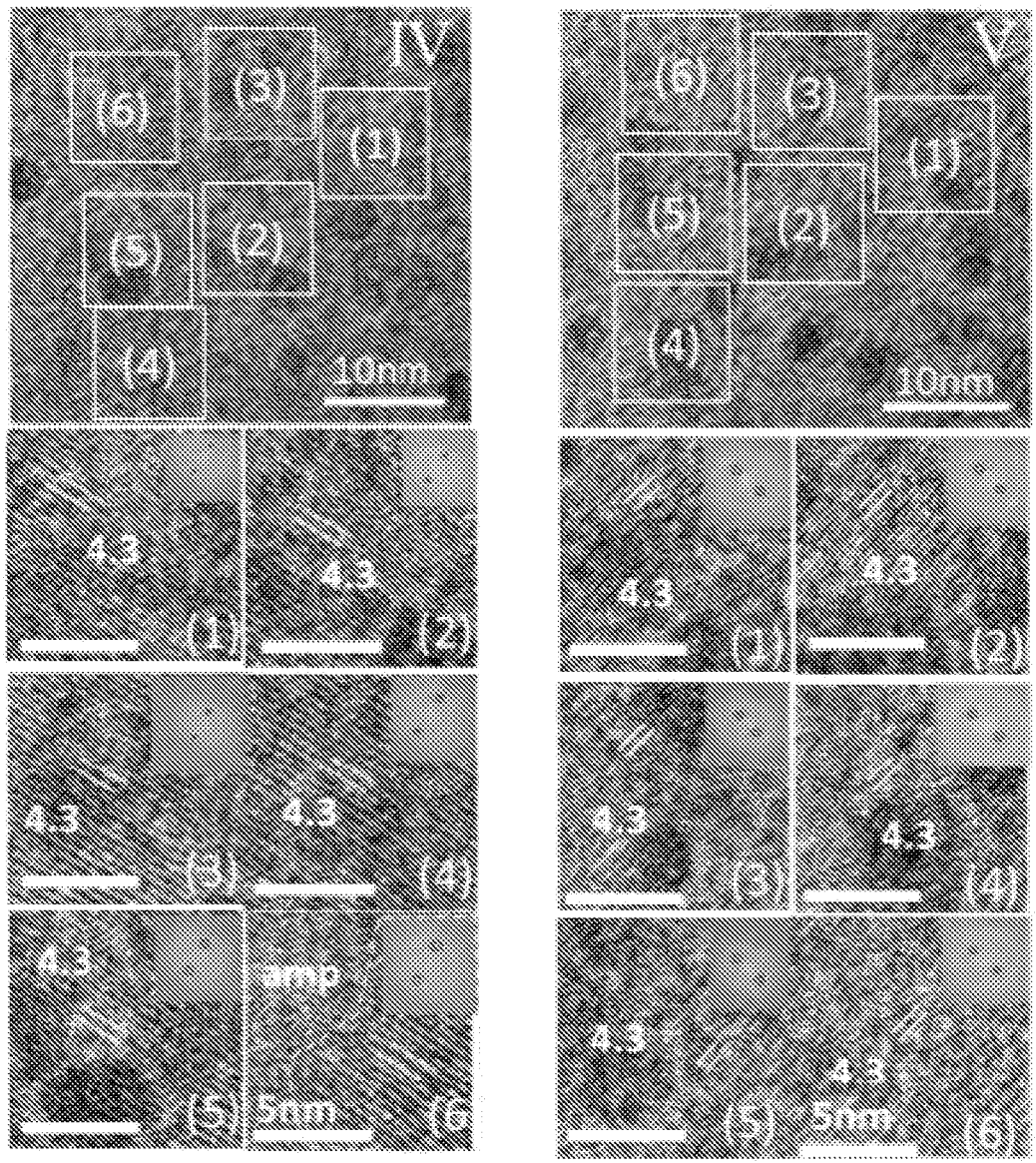
FIG. 31D shows HRTEM images at interior locations IV and V of CsFA-perovskite solar cell devices with polishing treatment. Crystal planes and amorphous phase (amp) are marked. FFT patterns are shown in each zoomed-in image, and the {110} crystal planes are marked in circles.

Additional perovskite compositions were investigated to see whether they too contain a defect layer and whether this layer could be removed by mechanical polishing. Cross-section HRTEM images of a MA-free perovskite with the composition Cs$_{0.4}$FA$_{0.6}$Pb(I$_{0.64}$Br$_{0.36}$)$_3$ (denoted as CsFA-perovskite hereinafter) polycrystalline films were investigated. For the HRTEM study, six different locations, two at the C60/CsFA-perovskite interface and four inside the perovskite film, in each CsFA-perovskite device were selected, with all locations marked in FIG. 29A-FIG. 29D. At each of the 6 locations, there were 6 zoomed-in images with an area of 100 nm² at different positions, which resulted in 36 HRTEM images for each sample. The X-ray diffraction pattern of the CsFA-perovskite film in FIG. 30 showed that the {110} planes have the strongest peak; therefore, the {110} crystal plane was tracked in the HRTEM images, which corresponds to a crystal plane spacing of 4.3 Å. At the region close to the C60/CsFA-perovskite interface as shown in FIG. 29B, many random orientated nanocrystals and amorphous regions were observed. Blurred amorphous regions were observed in many zoomed-in locations (1), (3), (5), at region I and (6) at region VI, and other crystalline regions with different crystallographic planes of (200) and (210) at regions I and VI, which exhibit a crystal plane spacing of 3.1 Å and 2.7 Å, respectively. From the interface regions to the grain interiors shown in FIGS. 29B-29D, random orientated nanocrystals and amorphous regions gradually reduced, with the grain interiors in FIG. 29D showing good crystallinity with no significant change of crystallographic orientation identified in a single grain of the CsFA-perovskite. After polishing off the top layer by about 40 nm, the perovskite grain interiors (FIG. 31C-31D) maintained good crystallinity with continuous {110} crystal planes, and most of the random oriented nanocrystals and amorphous-phase regions on the surface were removed, as shown in FIG. 31B. No damage as a result of the polishing was discovered.

The light stability of $MAPbI_3$ films with and without surface polishing was then investigated. $MAPbI_3$ films were continuously illuminated under ambient air by a plasma lamp with strong ultraviolet and near infrared radiation at one-sun light intensity (Yang S. et al., *Science* 365, 473-478 (2019)).

Figure 32:
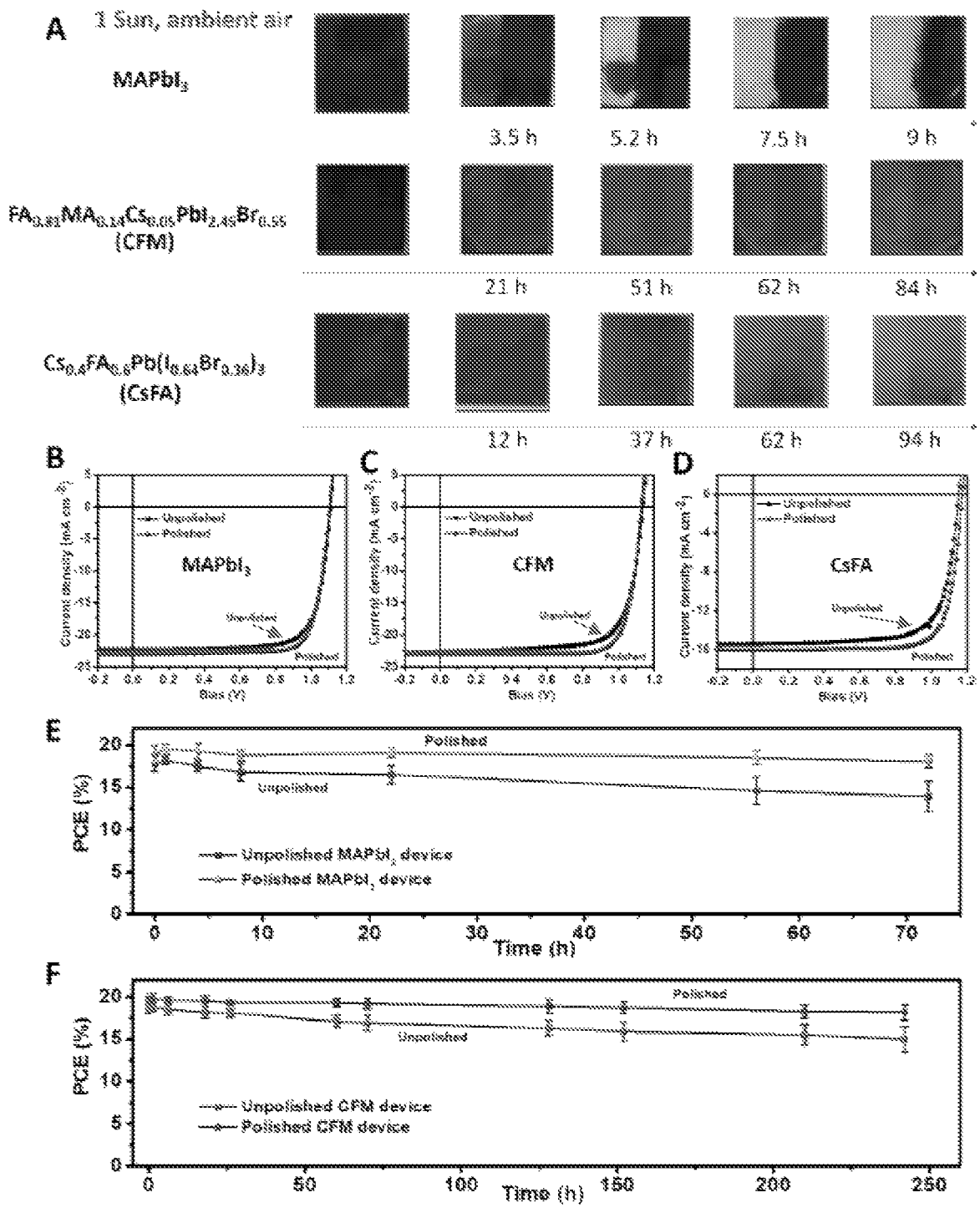
FIG. 32 shows photographs of MAPbI$_3$ deposited by anti-solvent methods with ethyl acetate dripping. CFM-perovskite, and CsFA-perovskite films after illumination for different durations under a light intensity of 100 mW cm$^{-2}$ in ambient air. The right half sides of all samples were polished before the light stability test. The J-V curves of solar cells are based on (B) MAPbI$_3$, (C) CFM, and (D) CsFA films without and with polishing treatment. The light stability of encapsulated devices of solar cells based on (E) MAPbI$_3$, and (F) CFM films were investigated without and with polishing treatment, under continuous illumination at one-sun intensity. Five devices were tested.
Figure 33:
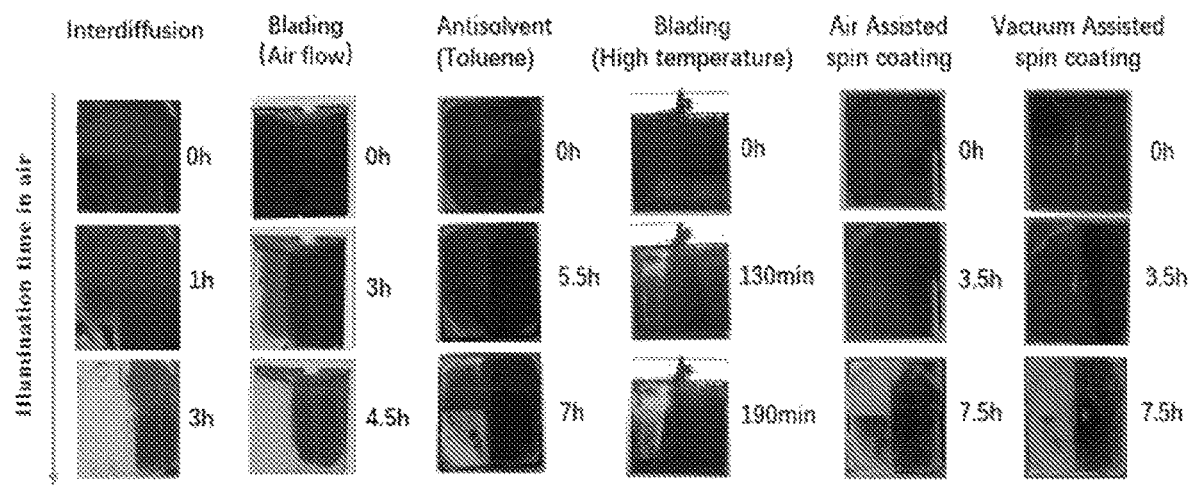
FIG. 33 shows photographs of MAPbI$_3$ films deposited by different solution processing under illumination at an intensity of 100 mW cm-2 for different durations. The right half sides of each samples were polished before light stability tests.
Figure 34:
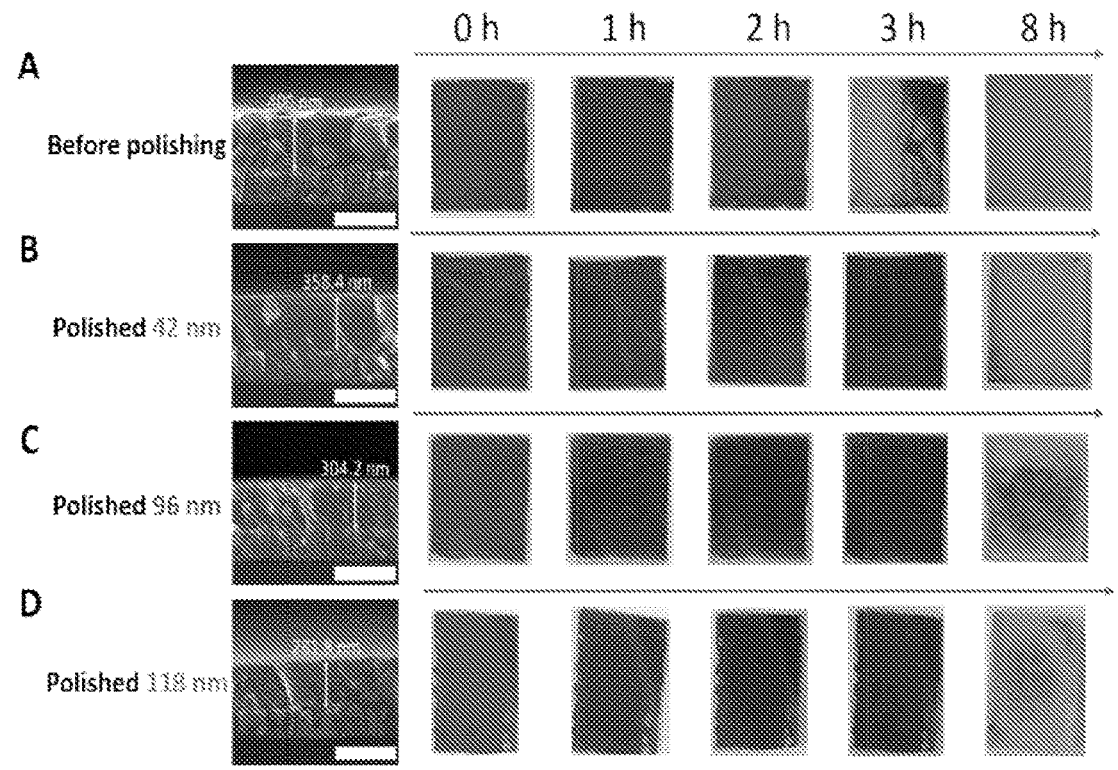
FIG. 34 shows photographs of the MAPbI$_3$ films on glass stability tests with different polishing depths by polishing-off layer-by-layer: A) initial thickness of 400 nm. B) polished-off 42 nm. C) polished-off 96 nm. D) polished-off 118 nm. The cross-section SEM images are shown in the left column, and the scale bar inside is 500 nm.

So as to avoid the influence of the perovskite film morphology variability on the stability of the films, only half of each perovskite thin film was polished, while the other half was unpolished. It is generally known that $MAPbI_3$ decomposes to $PbI_2$, and other species such as $CH_3I$, $NH_3$, $I_2$, and $H_2$ etc., under illumination in air, resulting in de-coloring of the films (Wang S. et al., *Nat. Energy* 2, 16195 (2017)); Juarez-Perez, E. J., Hawash, Z., Raga, S. R., Ono, L. K. & Qi, Y. *Energy Environ. Sci.* 9, 3406-3410 (2016); Juarez-Perez, E. J., Ono, L. K., Uriarte, I., Cocinero, E. J. & Qi. Y. *ACS Appl. Mater. Interfaces* 11, 12586-12593 (2019)). As the photographs show in FIG. 32, the polished half side of the $MAPbI_3$ film degraded more slowly than that of the non-polished half side of the same sample. To determine whether this phenomenon is dependent on film deposition method, the stability of the $MAPbI_3$ thin films deposited by several different solution processing methods, including the anti-solvent method by using varied dripping solvents (toluene, ethyl acetate) air-quenched one-step spin-coating method, vacuum-assisted one-step spin-coating method, two-step inter-diffusion method, and blade coating method at high temperature and room temperature (Jeon N. J. et al., *Nat. Mater.* 13, 897-903 (2014); Huang F. et al., *Nano Energy* 10, 10-18 (2014); Li X. et al., *Science* 353, 58-62 (2016); Xiao Z. et al., *Energy Environ. Sci.* 7, 2619-2623 (2014): Deng Y. et at, *Energy Environ. Sci.* 8, 1544-1550 (2015); and Deng Y. et al., *Sci. Adv.* 5, eaax7537 (2019)). It was found that the non-polished half of all $MAPbI_3$ films degraded faster than the polished half of the same thin film, regardless of the film deposition methods as shown in FIG. 33. The light soaking stability of $MAPbI_3$ films was also tested with different polishing-depths. As shown in FIG. 34, the films polished by 96 nm and 118 nm showed better stability than the one polished by 42 nm. This can be explained by the relatively large roughness of the perovskite films. The light stability of the MHP films was further investigated with other compositions. Both polished CsFA-perovskite and CFM-perovskite ($FA_{0.81}MA_{0.14}Cs_{0.05}PbI_{2.5}Br_{0.45}$ (FA=$HC(NH_2)2$) (CFM-perovskite)) films showed better stability than unpolished areas under illumination in ambient air, as shown by the light soaking results in FIG. 31. These results show that the defective layers accelerate the degradation of perovskites, while removal of the defective layers by mechanical polishing can make the MHP films much more stable under illumination.

Figure 35:
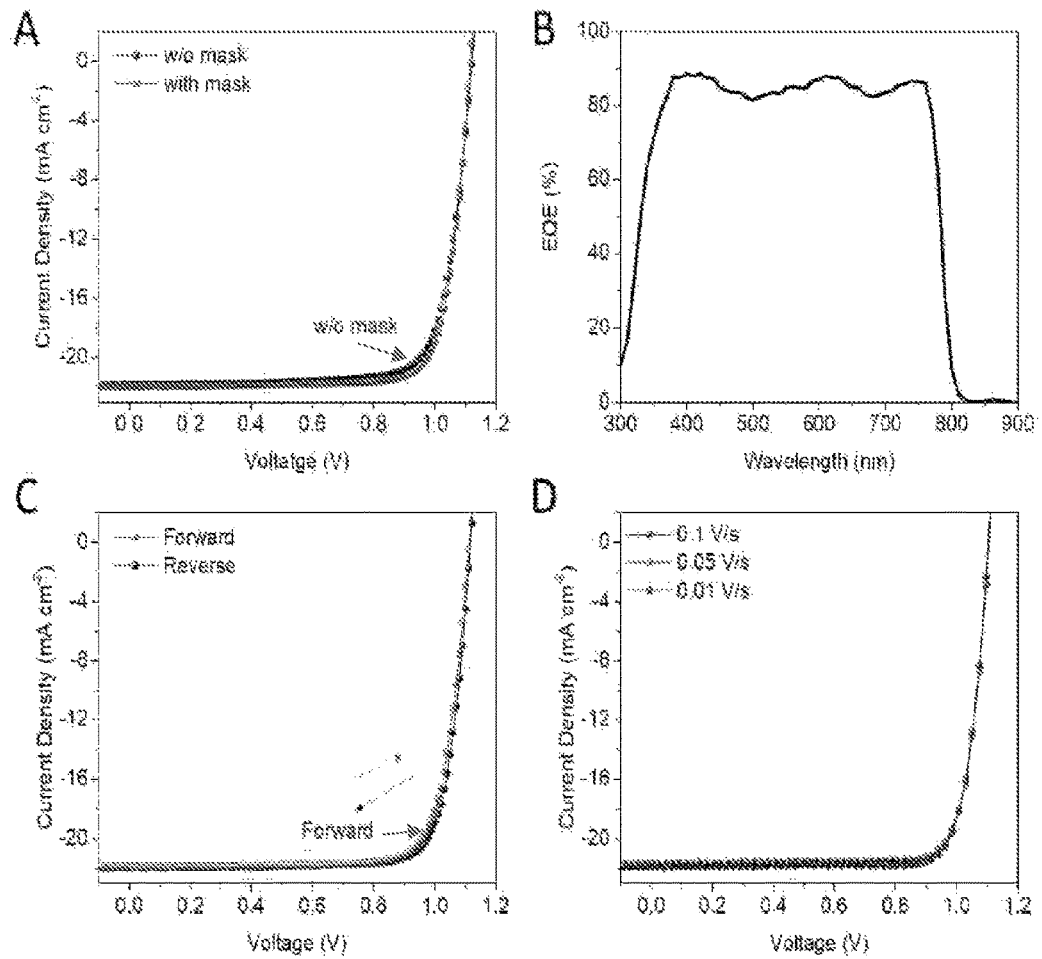
FIG. 35 shows the device performance of solar cells based on MAPbI$_3$ films after polishing. (A) J-V curves of the device with and without shadow mask. The device area is 8 mm$^2$ without mask, and 6.08 mm$^2$ using the shadow mask. (B) EQE measurement. (C) J-V curves in forward and reverse scan of the polished device, and (D) the comparison in different reverse scan rate.
Figure 36A:
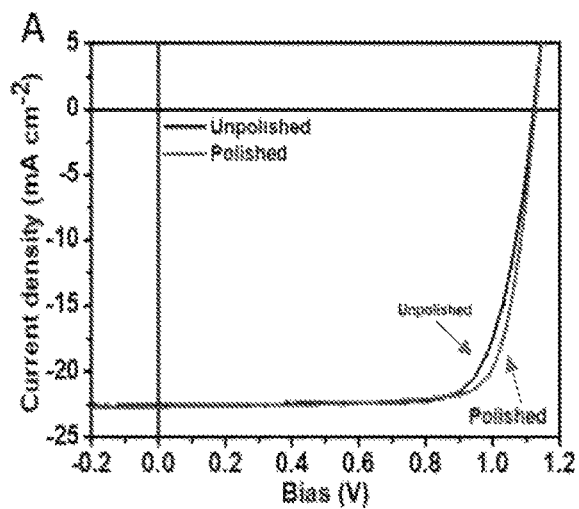
FIG. 36A shows a plot of typical J-V curves of solar cells based on octylammonium sulfate passivated $FA_{0.81}MA0.14Cs_{0.05}PbI_{2.45}Br_{0.55}$ (CFM) without and with polishing treatment.
Figure 36B:
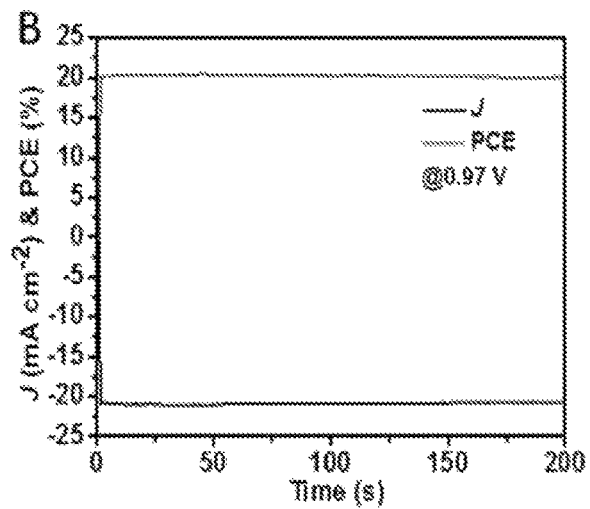
FIG. 36B shows a plot of stable output J and PCE at bias of 0.97 V of encapsulated solar cells based on CFM with polishing treatment and octylammonium sulfate passivation.
Figure 37:
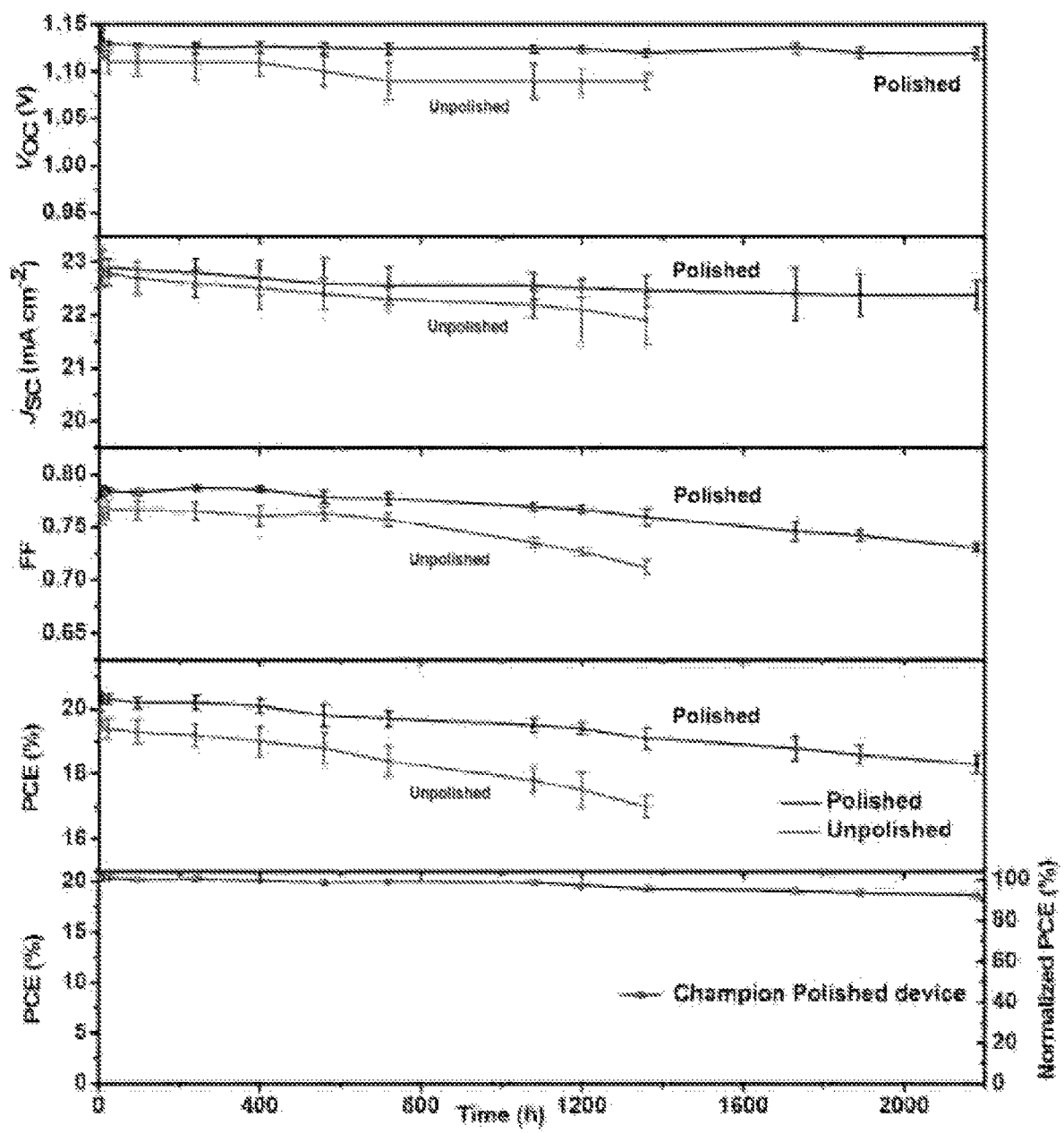
FIG. 37 shows plots indicating the enhancement of device stability as a result of mechanical polishing. The device parameter evolution of encapsulated solar cells based on unpolished and polished $FA_{0.81}MA_{0.14}Cs_{0.05}PbI_{2.45}Br_{0.55}$ (CFM) with octylammonium sulfate passivation under continuous illumination at one sun intensity, which was tested in air, with UV light and at around 65° C. Except for the bottom figure which showed the champion stability of a polished device, the other figures exhibited the mean values within standard deviations.

To evaluate the impact of polishing on the stability of MHP solar cells, the operational stabilities of MHP solar cells with and without polished perovskite films were compared. The devices had a p-i-n planar structure of ITO/PTAA/MHP/C60/BCP/Cu without and with [6,6]-phenyl-C61-butyric acid methyl ester (PCBM) or an oxysalt passivation layer, and were encapsulated before the stability tests. The device stability was measured at operation conditions under a plasma lamp with a light intensity of 100 mW cm$^{-2}$ and a similar spectrum to AM 1.5 G light with strong UV components (Yang S. et al., *Science* 365, 473-478 (2019)). The devices were connected to a load so that they operated at the maximum power point (MPP) at the beginning of the test. The load was then fixed for the duration of the measurement, which could slightly underestimate the stability of the solar cells, as the MPP typically shifts during these tests. The stability testing was conducted in air, and the surface of the devices showed a stabilized temperature of ~65° C. under continuous illumination. As shown in FIG. 31, the solar cells with polished perovskite films of various compositions exhibited higher PCEs than the control devices with as-cast MHP films, which indicates the defective surface layers also reduce device efficiency. Devices containing polished $MAPbI_3$ showed no negligible difference from J-V scanning at different directions and speeds, or with and without a photomask, and the calculated JSC from the EQE matched well with that from J-V scanning (FIG. 35). The solar cells with polished $MAPbI_3$ films exhibited better light stability compared to the control devices (FIG. 31). After continuous illumination for 72 h. the PCEs of the solar cells based on polished $MAPbI_3$ films decreased by 3.8% on average. In contrast, the devices with pristine $MAPbI_3$ films showed a much larger PCE loss of 22% under the same test conditions. A similar trend of increased stability after polishing was also observed in solar cells with CFM-perovskite films. After continuous illumination for 242 hours (FIG. 31), the PCEs of the devices with unpolished CFM-perovskite decreased by 20% on average, while the polished ones showed a decrease of PCE by only 6.7% on average. The stability of the solar cells with polished CFM films was further improved by using a wide bandgap oxysalt layer to replace PCBM, which further stabilized the perovskite surfaces (Yang S. et al., *Science* 365,473-478 (2019)). It can be seen that polishing further improved the device stability of the oxysalt-passivated devices to a new high level, in addition to slightly enhancing device efficiency (FIG. 35). FIG. 37 showed the evolutions of open circuit voltage (VOC), short-circuit current (JSC), fill factor (FF) and PCE of the oxysalt-passivated CFM perovskite solar cells with and without polishing. The oxysalt-passivated solar cells with polishing treatment showed 3% degradation on average relative to the original PCE after continuous illumination for ~1000 h. while the unpolished devices lost 8.7% of their efficiency on average. The polished device combined with oxysalt layer which showed the best stability under continuous illumination, had an initial PCE of 20.4% (FIG. 36B) estimated stabilized output. This device retained about 98.5% of its initial PCE after continuous illumination for 1000 h. After testing for 2180 h which is more than 3 months, the device still retained 93% of its initial PCE (FIG. 37).

Figure 38:
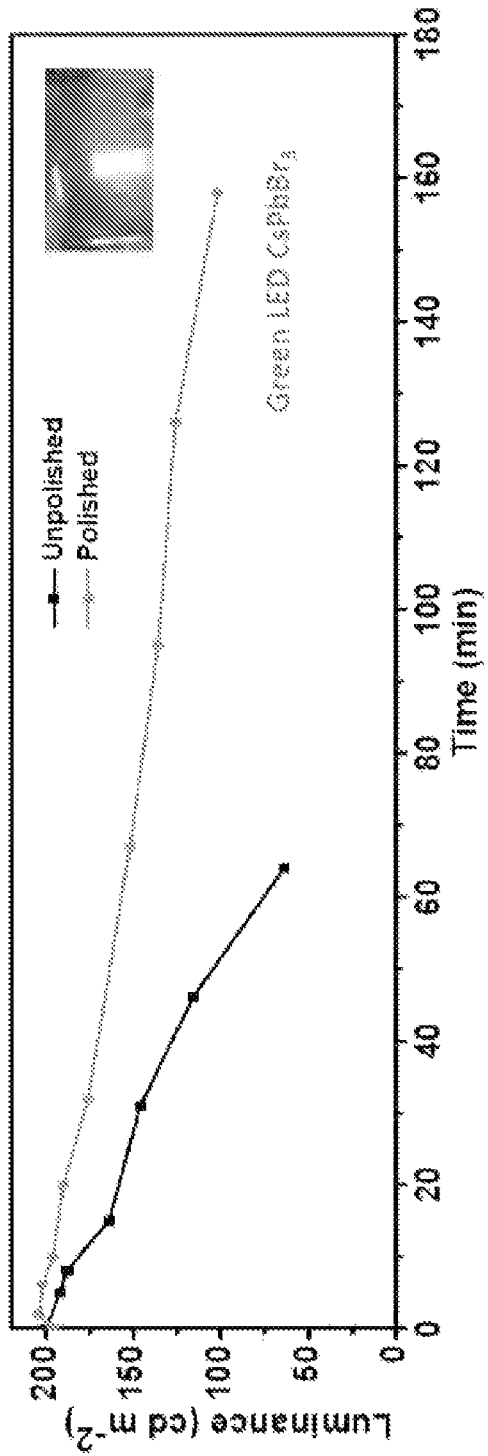
FIG. 38 shows stability test results of perovskite LEDs based on $CsPbBr_3$ after polishing treatment.

This method was also applied to treat the surfaces of polycrystalline $CsPbBr_3$ perovskite light emitting diodes (LEDs). Polishing was shown as an effective method to significantly enhance the operational stability of perovskite LEDs by extending the T50 lifetime by three times (i.e. the time it takes for the luminance to decrease by half of the original value). (FIG. 38).

Figure 27:
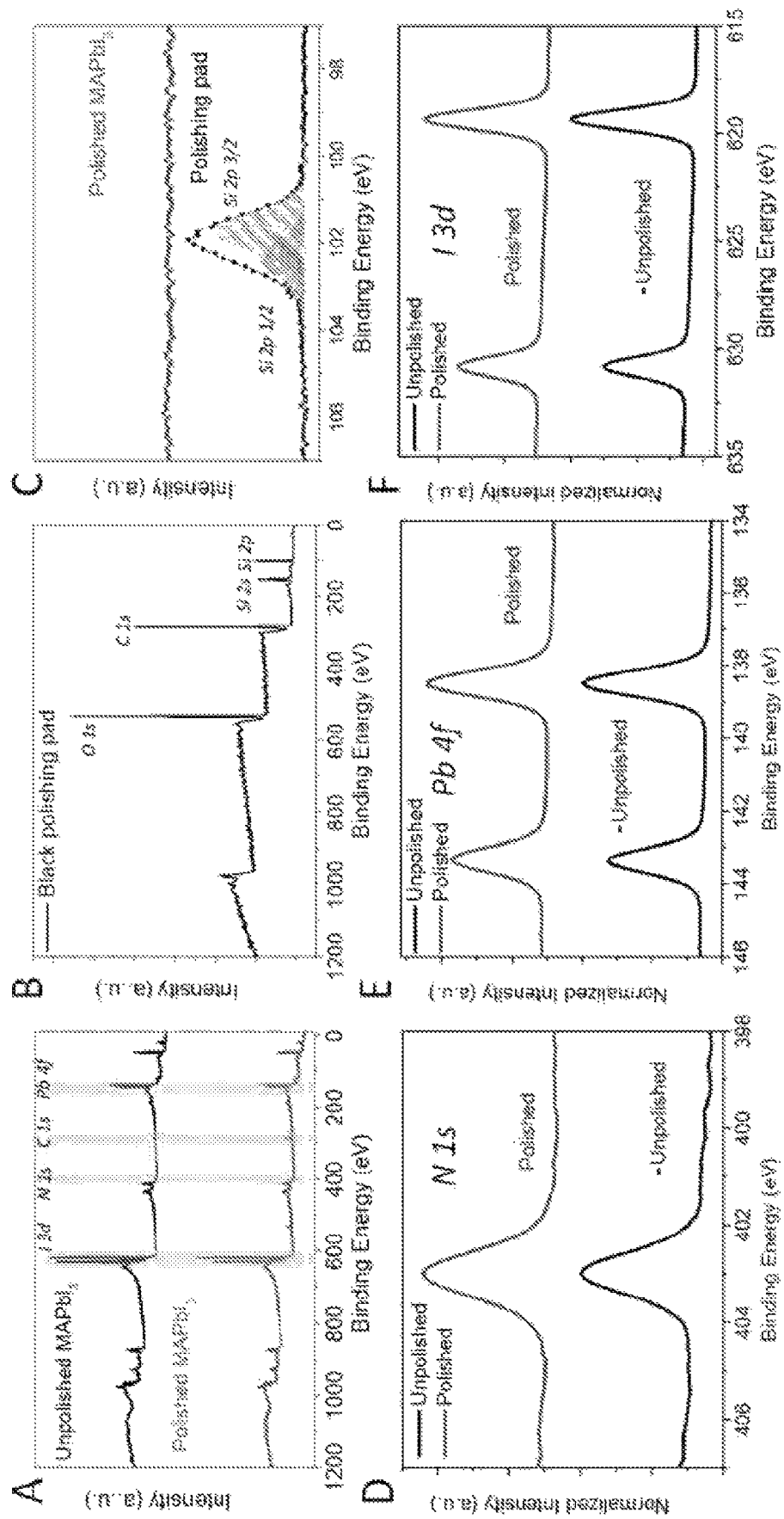
FIG. 27 (A) shows an XPS survey comparison of MAPbI$_3$ film surface without and with polishing. (B) XPS survey of ChemoMet polishing pad surface. (C) No silicon from the ChemoMet polishing pad is detected on the polished MAPbI$_3$ film surface. (D) N 1s; (E) Pb 4f; and (F) I 3d XPS peaks were detected on MAPbI$_3$ films without and with polishing. No peak shift was detected after polishing.
Figure 39:
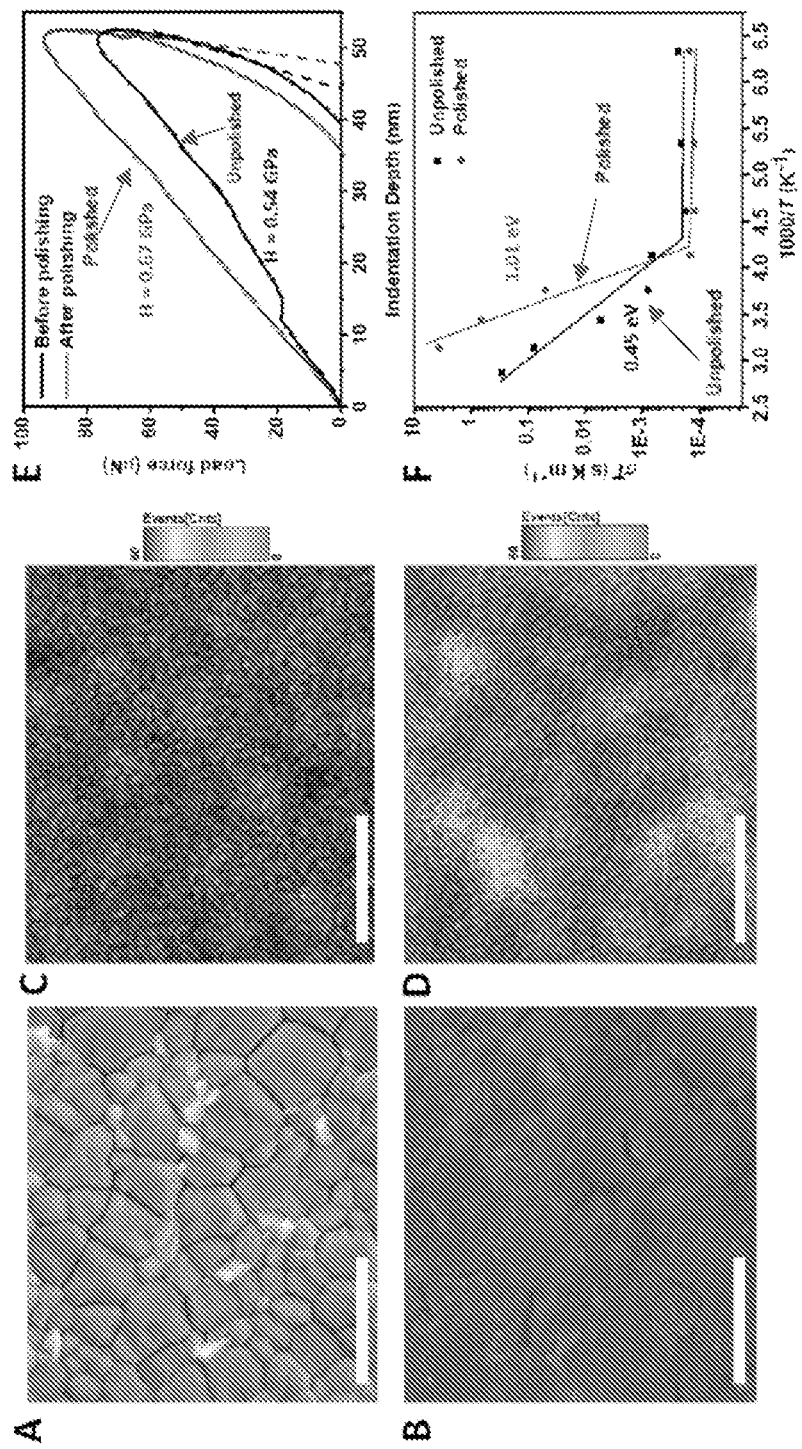
FIG. 39 shows the morphological, optical, mechanical and ion migration properties of perovskite films before and after polishing-off the defective surface. (A-B) Top-view SEM images of a $MAPbI_3$ film (A) before and (B) after polishing. (C-D) Photoluminescence intensity mapping images for a $MAPbI_3$ film (C) before and (D) after polishing treatment. The scale bar in A-D is 1 μm. (E) Nanoindentation measurement results of $MAPbI_3$ film surfaces before and after polishing with a maximum indentation depth of 50 nm. (F) Ion migration activation energy of $MAPbI_3$ films without and with polishing treatment.
Figure 40:
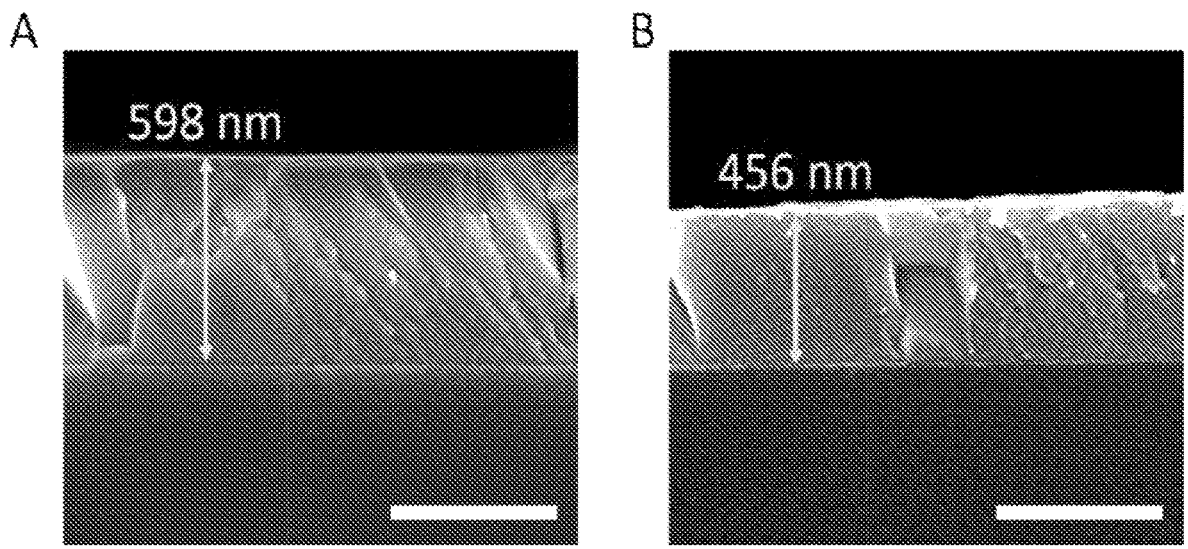
FIG. 40 shows cross-section SEM images of the $MAPbI_3$ film A) before and B) after polishing, which was used for the surface SEM imaging and PL mapping tests shown in FIG. 39. Scale bar is 500 nm.

The effect of polishing on the surface morphology, optoelectronic and mechanical properties of MHP films was next investigated. XPS results showed that polishing did not include other elements (such as Si) from the ChemoMet polishing pad (FIG. 27) or shift the N, P, and I peaks of the perovskite thin film (FIG. 27). As such, the potential effects of materials being left over from the polishing pad can be excluded from the stability analysis. As shown by the top-view scanning electron microscope (SEM) images in FIG. 39, the polished film was more uniform and flatter than the as-cast film. The SEM studies showed that most of the defective area at the surface of the MHP films could be removed by polishing off about 142 nm, as shown by the cross-section SEM images in FIG. 40. The $MAPbI_3$ film before polishing exhibited "V-shaped" grain boundaries. After polishing, the film polishing retained dense grain packing after exposure to the electron beam in SEM. The photoluminescence (PL) intensity of the $MAPbI_3$ film was mapped before and after polishing using a confocal optimal mapping system. As shown in FIG. 39, the PL intensity of the $MAPbI_3$ film increased after polishing within a detection region having an area of 10 μm×10 μm. The PL mapping showed the more uniform surface on the polished perovskite, which enhanced the FF value.

Figure 41:
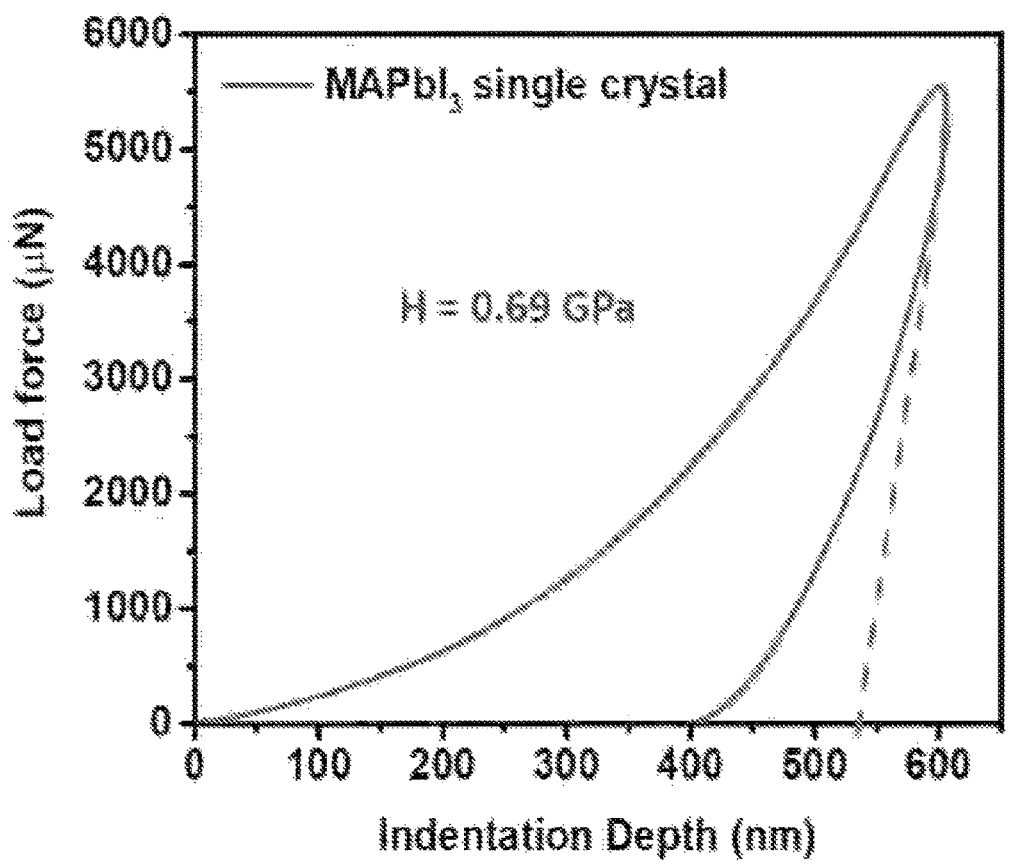
FIG. 41 shows a plot of the mechanical hardness of $MAPbI_3$ single crystal surface (maximum indentation depth of 600 nm) by nanoindentation measurements. The statistical hardness results in 9 positions was 0.69±0.12 GPa.
Figure 42:
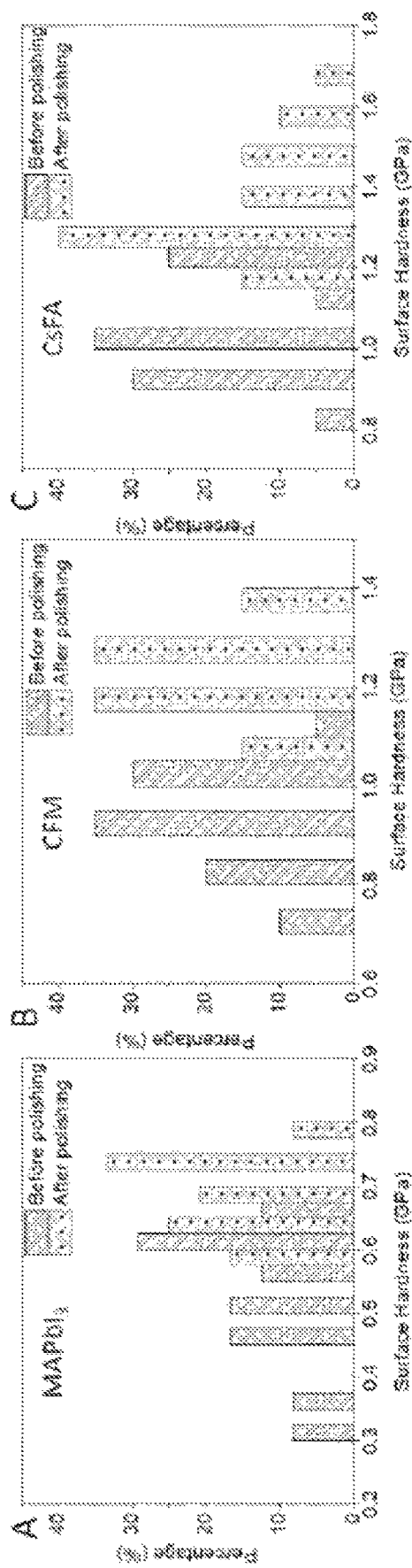
FIG. 42 shows a statistic histogram of MHP films surface hardness by polishing treatment. Comparison of the mechanical hardness difference for the top 50 nm depth of surface for 24 positions on films before and after polishing treatment with different compositions: a) $MAPbI_3$, b) CFM-perovskite and c) CsFA-perovskite.

It was speculated that the defective layer consists of nanocrystals and an amorphous-phase, which should be mechanically weaker than the continuous crystalline region, which was confirmed by mechanical property characterization obtained from Nanoindentation measurements. Here, 6 locations were measured, which were randomly chosen among different samples. As shown in FIG. 39, plot E, the hardness (H) at the top surface of $MAPbI_3$ films increased from 0.54±0.14 GPa to 0.67±0.04 GPa after polishing. The hardness of the polished $MAPbI_3$ films is in fact close to that of a $MAPbI_3$ single crystal (H=0.69±0.12 GPa from measurement at 9 locations with indentation depth of 600 nm on bulk crystals of 1-5 mm thick), as shown in FIG. 41. These results indicate that the mechanical polishing methods described herein can recover the mechanical properties of polycrystalline perovskite films to nearly have the same qualities as that of perovskite single crystals. The same trend of increased hardness via polishing was observed in MHP films having other compositions, and the statistical results are shown in Table 5 and FIG. 42.

TABLE 5

Statistic analysis of MHP film surface hardness by polishing treatment. Comparison of the mechanical hardness difference for the top 50 nm depth of surface for 24 positions on films with different compositions before and after polishing treatment, respectively.

| | Surface Hardness (GPa) | |
|---|---|---|
| Composition | Before polishing | After polishing |
| $MAPbI_3$ | 0.54 ± 0.14 | 0.67 ± 0.04 |
| CFM-perovskite | 0.95 ± 0.1 | 1.18 ± 0.16 |
| CsFA-perovskite | 1.08 ± 0.22 | 1.32 ± 0.2 |

Harder surfaces on the polished perovskite films could potentially reduce ion migration along the surface layer of the perovskite. The more robust and less porous surface after polishing could result in suppressed ion migration in the perovskite film. To investigate whether polishing-off MHP defect surfaces suppresses ion migration of perovskite films, the activation energy (Ea) for ion migration of MHPs before and after polishing was measured. A lateral device structure was used to highlight ion migration at the MHP film surface. The activation energy of the ion migration was extracted from the dependence of the conductivity of the $MAPbI_3$ films on temperature. The temperature dependent conductivity shows a two-stage variation, which can be assigned to electronic and ionic conduction. In FIG. 39, plot F, the as-prepared $MAPbI_3$ films showed an Ea of 0.38±0.1 eV for ion migration, while the polished $MAPbI_3$ films showed a much larger Ea of 0.88±0.15 eV in dark conditions. The higher Ea indicates that polishing efficiently suppresses ion migration of MHP, which results in more stable MHP films. The Ea of the polished film is comparable to that of $MAPbI_3$ single crystals, which is consistent with the single-crystal-like mechanical properties of the films investigated (Xing J. et al., *Phys. Chem. Chen. Phys.* 18, 30484-30490 (2016)). These studies show that polishing defective surfaces off of perovskite films makes the surface of the polycrystalline MHP films nearly as hard as single crystals, enhances the stability of the MHP films, and extends the durability of perovskite photovoltaic devices.

TABLE 6

Device performance summary of $MAPbI_3$ thin film devices containing films with different polishing depths

| Device | Film thickness | $J_{SC}$ (mA cm$^{-2}$) | $V_{OC}$ (V) | FF | PCE (%) |
|---|---|---|---|---|---|
| Unpolished | 723 nm | 22.1 | 1.14 | 0.73 | 18.3 |
| Polished | 537 nm | 21.4 | 1.17 | 0.80 | 20.0 |
| Deeper Polished | 427 nm | 19.3 | 1.15 | 0.76 | 16.9 |

Efforts have been made to ensure accuracy with respect to numbers used (e.g., amounts, temperature, etc.) but some experimental errors and deviations should be accounted for.

One skilled in the art will recognize many methods and materials similar or equivalent to those described herein, which could be used in the practicing the subject matter described herein. The present disclosure is in no way limited to just the methods and materials described.

Unless defined otherwise, technical and scientific terms used herein have the same meaning as commonly understood by one of ordinary skill in the art to which this subject matter belongs.

Throughout this specification and the claims, the words "comprise." "comprises," and "comprising" are used in a non-exclusive sense, except where the context requires otherwise. It is understood that embodiments described herein include "consisting of" and/or "consisting essentially of" embodiments.

Where a range of values is provided, it is understood that each intervening value, to the tenth of the unit of the lower limit, unless the context clearly dictates otherwise, between the upper and lower limit of the range and any other stated or intervening value in that stated range, is encompassed. The upper and lower limits of these small ranges which may independently be included in the smaller rangers is also encompassed, subject to any specifically excluded limit in the stated range. Where the stated range includes one or both of the limits, ranges excluding either or both of those included limits are also included.

Many modifications and other embodiments set forth herein will come to mind to one skilled in the art to which this subject matter pertains having the benefit of the teachings presented in the foregoing descriptions and the associated drawings. Therefore, it is to be understood that the subject matter is not to be limited to the specific embodiments disclosed and that modifications and other embodiments are intended to be included within the scope of the appended claims. Although specific terms are employed herein, they are used in a generic and descriptive sense only and not for purposes of limitation.

What is claimed is:

1. A surface treatment method for removing one or more surface defect layers from a polycrystalline perovskite film, comprising the method steps of:
   a) contacting an adhesive with one or more surface defect layers of the polycrystalline perovskite film, and
   b) removing a portion of said adhesive from said one or more polycrystalline perovskite film surfaces;
   where method steps a) and b) are carried out one or more times to remove said one or more surface defect layers and then said polycrystalline perovskite film is free of said one or more surface defect layers;
   wherein said surface treatment method is a scalable roll-to-roll process;
   wherein said surface treatment method produces a residue of adhesive on said one or more surfaces of the polycrystalline perovskite film, wherein said residue has a thickness of about 1 nm to about 1000 nm;
   wherein said polycrystalline perovskite film has a thickness of about 1 nm to about 10 μm.

2. The surface treatment method of claim 1, wherein:
   said adhesive is selected from the group consisting of resin, rubber, polyterpene, polyisoprene, polyvinyl alcohol (PVA), polyacrylic acid (PAA), cyanoacrylate, polyethylene (PE), polypropylene (PP), polystyrene (PS), nylon, polyurethane (PU), polycarbonate (PC), polyoxymethylene (POM), and a mixture thereof;
   said adhesive is in physical communication with a backing material, wherein said backing material is selected from the group consisting of tape, roller, mold, and a combination thereof; and
   said adhesive is contacted with surfaces of said polycrystalline perovskite film with an applied pressure of about 1 Pa to about 100 MPa.

3. The surface treatment method of claim 1, wherein said method produces a polycrystalline perovskite film with improved stability for use as an active material in a semiconductor device, wherein:
   said semiconductor device is selected from the group consisting of solar cell, light emitting diode, photodiode, photoelectrochemical cell, photoresistor, phototransistor, photomultiplier, photoelectric cell, electrochromic cell, and radiation detector; or
   said semiconductor device is a solar cell and said method improves the power conversion efficiency of said solar cell.

* * * * *

UNITED STATES PATENT AND TRADEMARK OFFICE
CERTIFICATE OF CORRECTION

| | | |
|---|---|---|
| PATENT NO. | : 12,185,620 B2 | Page 1 of 1 |
| APPLICATION NO. | : 18/245387 | |
| DATED | : December 31, 2024 | |
| INVENTOR(S) | : Shangshang Chen et al. | |

It is certified that error appears in the above-identified patent and that said Letters Patent is hereby corrected as shown below:

In the Claims

In Column 53, Line 35, Claim 1, delete "said one" and insert -- one --, therefor.
In Column 53, Line 37, Claim 1, delete "where" and insert -- wherein --, therefor.
In Column 54, Line 1, Claim 1, delete "then said" and insert -- wherein said --, therefor.
In Column 54, Line 6, Claim 1, delete "more surfaces of the" and insert -- more --, therefor.
In Column 54, Line 7, Claim 1, delete "film," and insert -- film surfaces, --, therefor.

Signed and Sealed this
Twenty-fourth Day of June, 2025

Coke Morgan Stewart
*Acting Director of the United States Patent and Trademark Office*